(12) United States Patent
Kimura et al.

(10) Patent No.: US 11,671,086 B2
(45) Date of Patent: Jun. 6, 2023

(54) CIRCUIT SYSTEM

(71) Applicant: Sony Semiconductor Solutions Corporation, Kanagawa (JP)

(72) Inventors: Yuya Kimura, Kanagawa (JP); Hisashi Owa, Kanagawa (JP); Takashi Nakamura, Tokyo (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 58 days.

(21) Appl. No.: 17/603,413

(22) PCT Filed: Apr. 3, 2020

(86) PCT No.: PCT/JP2020/015277
§ 371 (c)(1),
(2) Date: Oct. 13, 2021

(87) PCT Pub. No.: WO2020/241048
PCT Pub. Date: Dec. 3, 2020

(65) Prior Publication Data
US 2022/0216860 A1    Jul. 7, 2022

(30) Foreign Application Priority Data
May 24, 2019 (JP) .............................. JP2019-098134

(51) Int. Cl.
*H03K 5/156* (2006.01)
*H03K 5/13* (2014.01)
(Continued)

(52) U.S. Cl.
CPC ............ *H03K 5/1565* (2013.01); *H03K 5/13* (2013.01); *H03K 19/20* (2013.01); *H03K 2005/00019* (2013.01)

(58) Field of Classification Search
None
See application file for complete search history.

(56) References Cited

U.S. PATENT DOCUMENTS 6,583,657 B1 * 6/2003 Eckhardt .............. H03K 5/1565
327/175
11,424,736 B1 * 8/2022 Bowman ................ H03K 19/20
(Continued)

FOREIGN PATENT DOCUMENTS

| JP | 2006-093393 A | 4/2006 |
|---|---|---|
| JP | 2010-004352 A | 1/2010 |

(Continued)

OTHER PUBLICATIONS

International Search Report (PCT/ISA/210), International Application No. PCT/JP2020/015277, dated Jun. 5, 2020.
(Continued)

*Primary Examiner* — Cassandra F Cox
(74) *Attorney, Agent, or Firm* — Michael Best & Friedrich LLP

(57) ABSTRACT

A circuit system is disclosed. In one example, the circuit system includes a clock tree circuit with multiple lanes to which a clock signal is distributed. A duty correction circuit is provided for each of the multiple lanes, and corrects a duty ratio of the clock signal. A clock gating circuit group has a clock gating circuit for each of the multiple lanes and receives, as input, the clock signal from the duty correction circuit. The clock gating circuit group starts output of the clock signal from each of a plurality of the clock gating circuits in a predetermined period. A variable delay circuit is provided in association with each of a plurality of the duty correction circuits and is capable of changing a delay time of a control signal that controls a timing of starting output of the clock signal from the clock gating circuit.

20 Claims, 22 Drawing Sheets

(51) Int. Cl.
*H03K 19/20* (2006.01)
*H03K 5/00* (2006.01)

(56) References Cited

U.S. PATENT DOCUMENTS

| 2009/0002042 A1* | 1/2009 | Rausch | H03K 5/15013 |
| | | | 327/175 |
| 2015/0002201 A1* | 1/2015 | Kitagawa | H03K 5/1565 |
| | | | 327/175 |

FOREIGN PATENT DOCUMENTS

| JP | 2016-012204 A | 1/2016 |
| JP | 2018-529147 A | 10/2018 |

OTHER PUBLICATIONS

Notification of Transmittal of the International Search Report and the Written Opinion of the International Searching Authority, or the Declaration (PCT/ISA/220), International Application No. PCT/JP2020/015277, dated Jun. 16, 2020.
Written Opinion of the International Search Authority (PCT/ISA/237), International Application No. PCT/JP2020/015277, dated Jun. 16, 2020.

\* cited by examiner

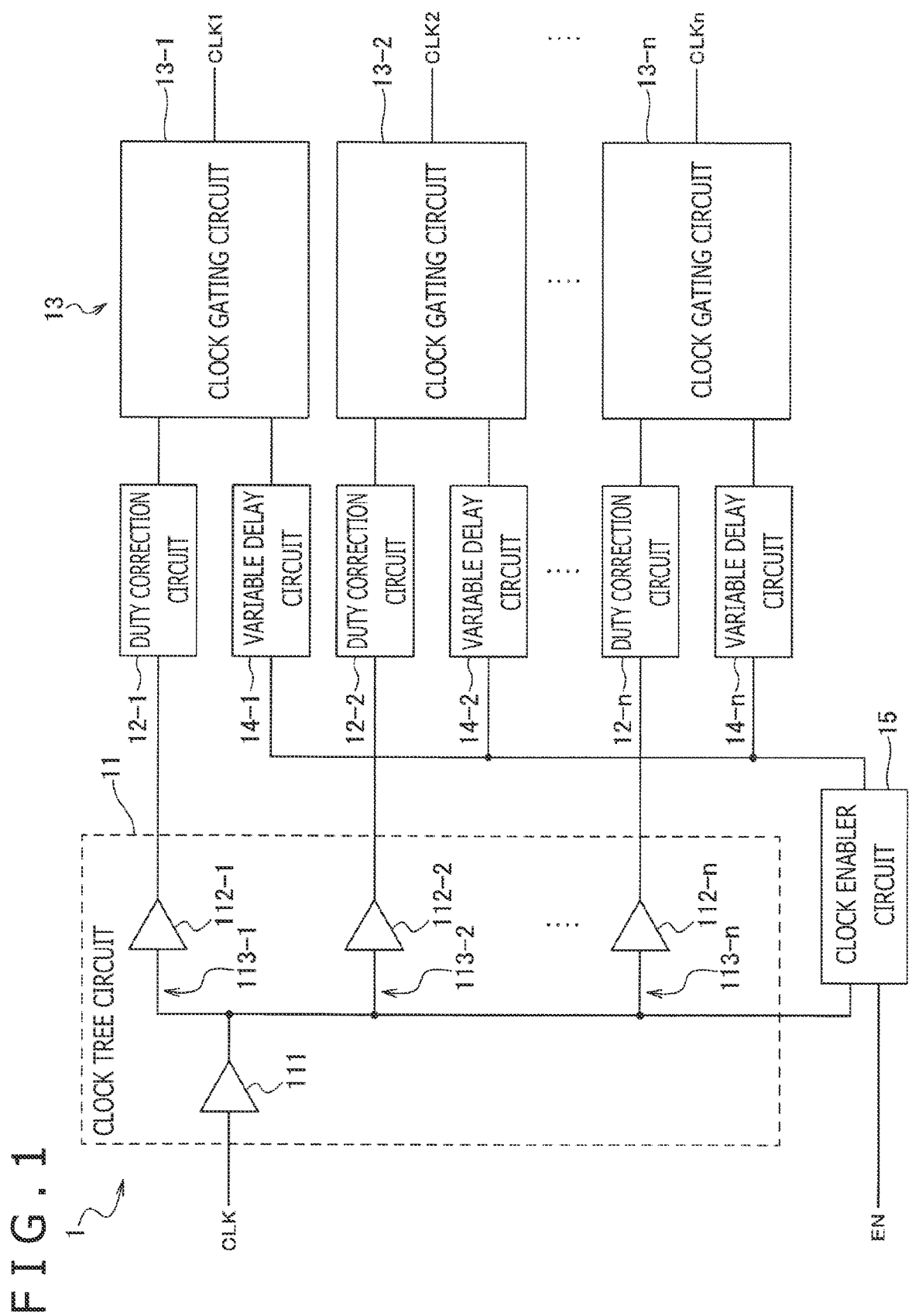
F I G. 1

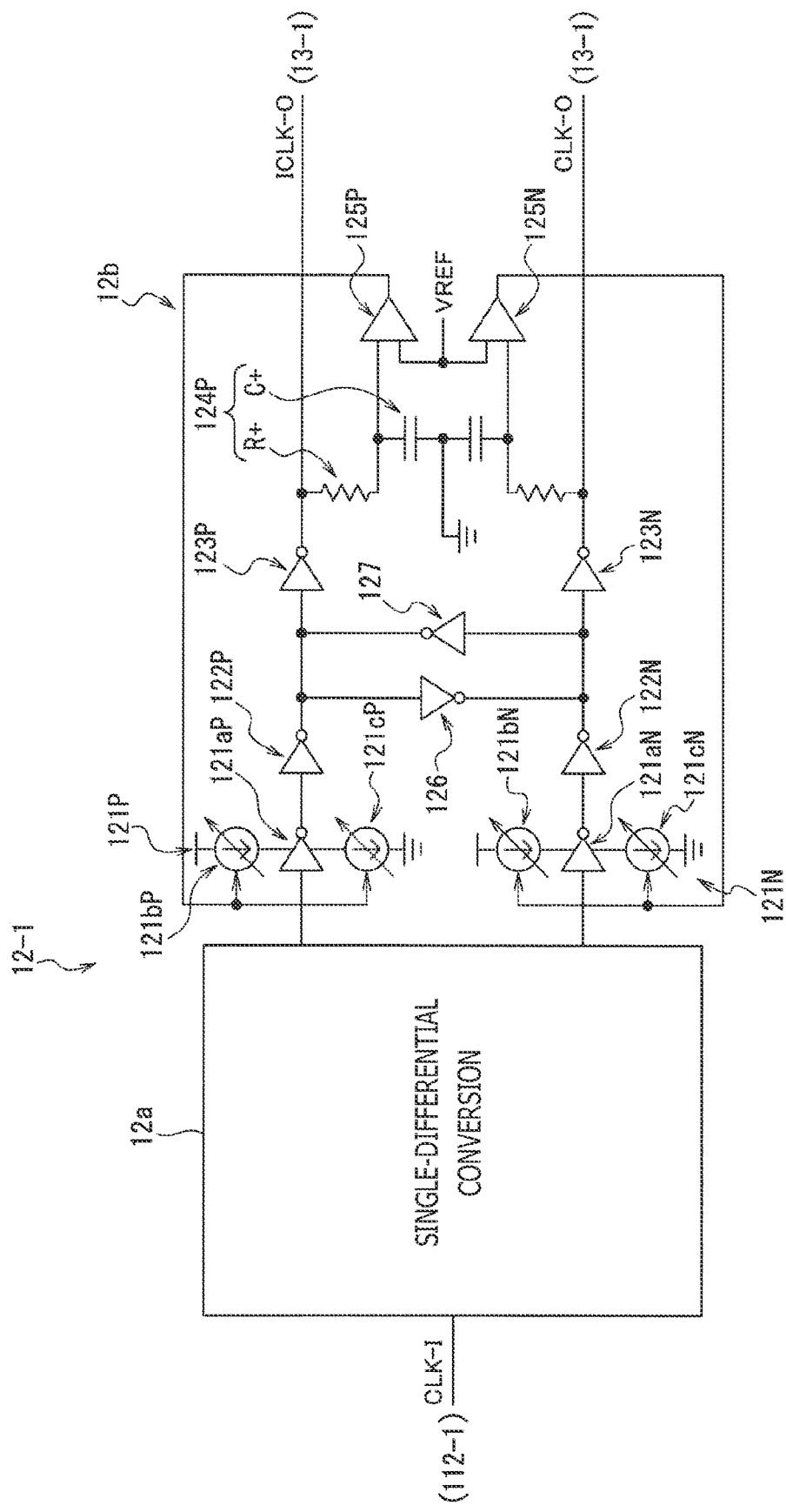
F I G. 2

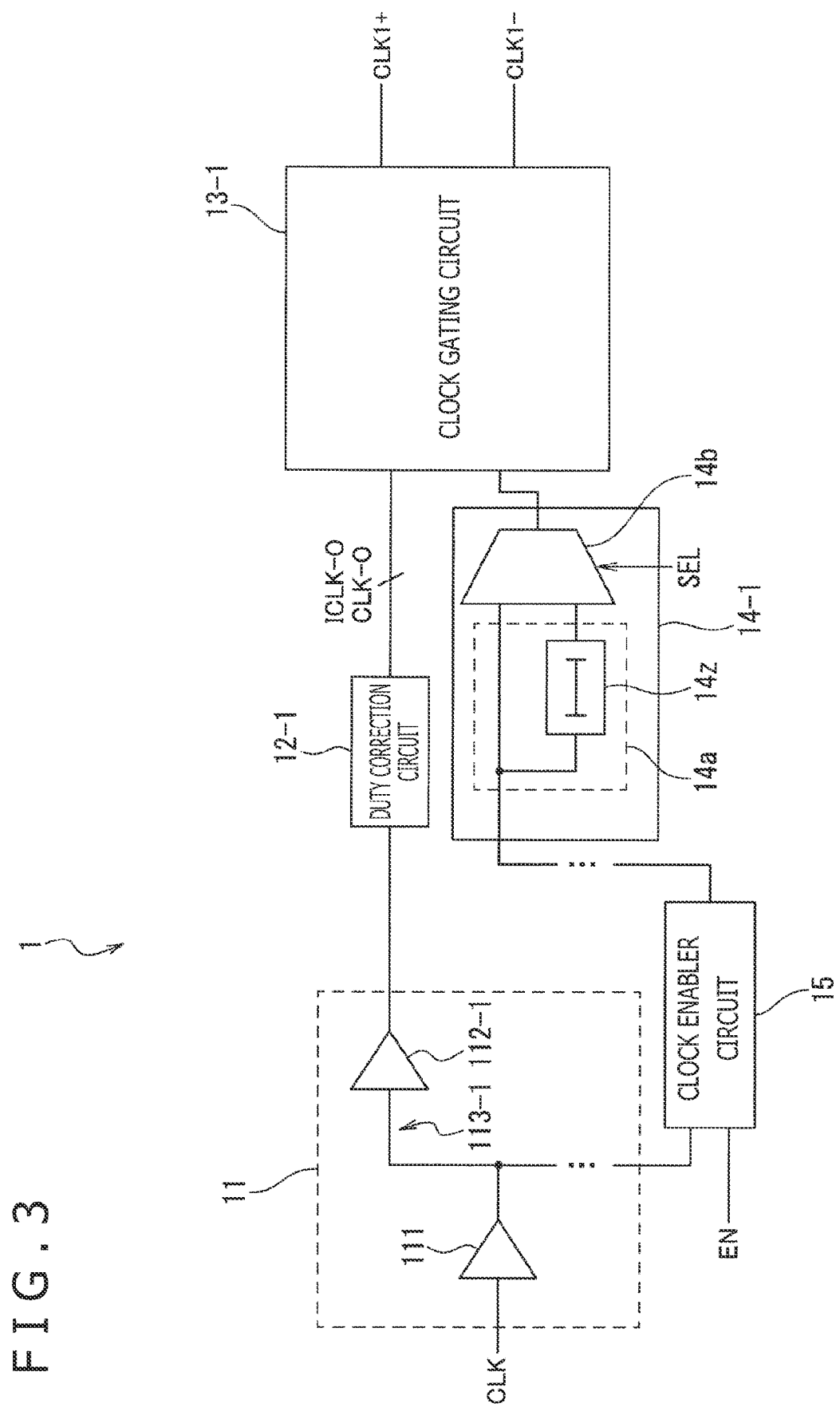
F I G . 3

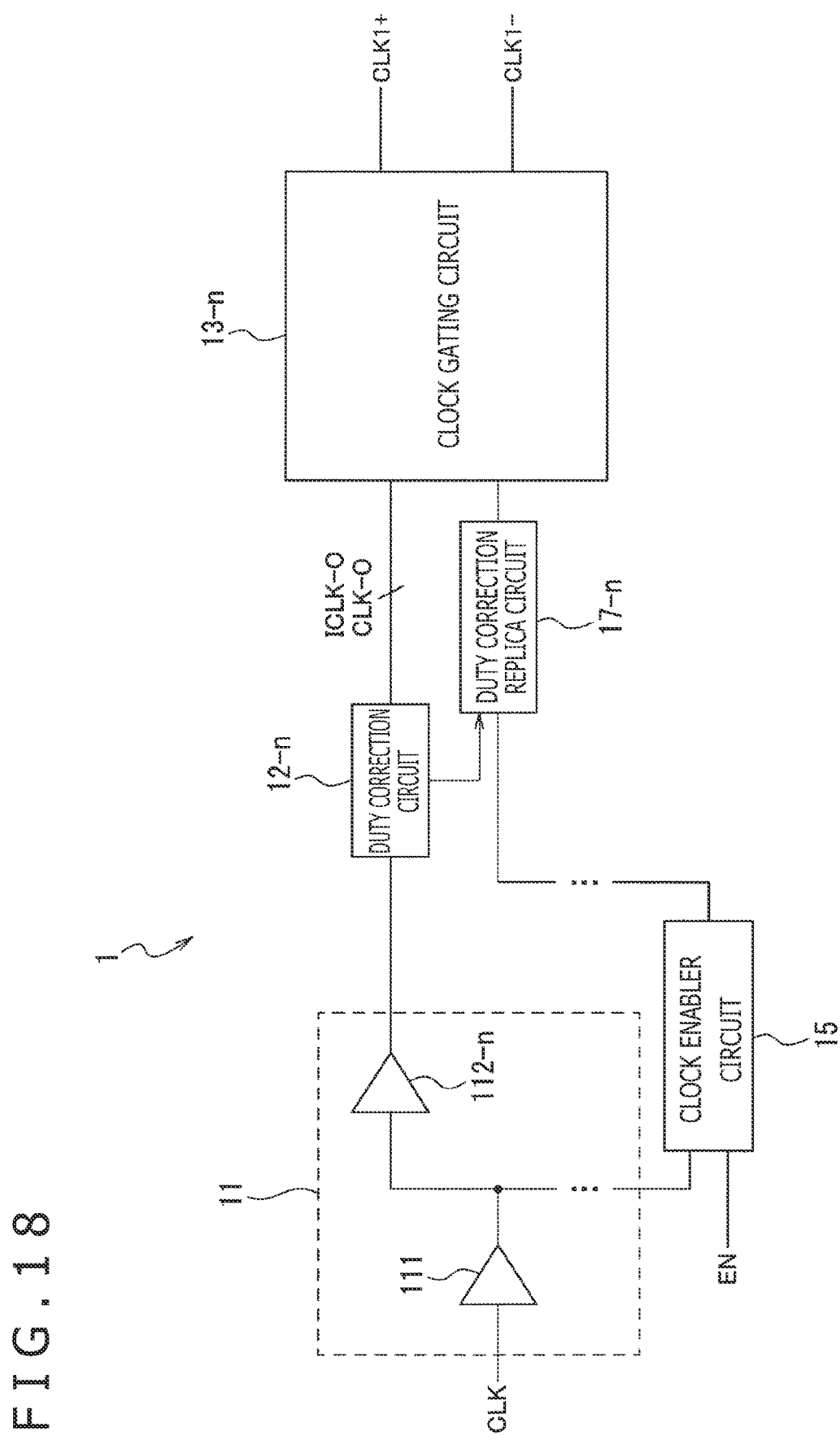
F I G. 18

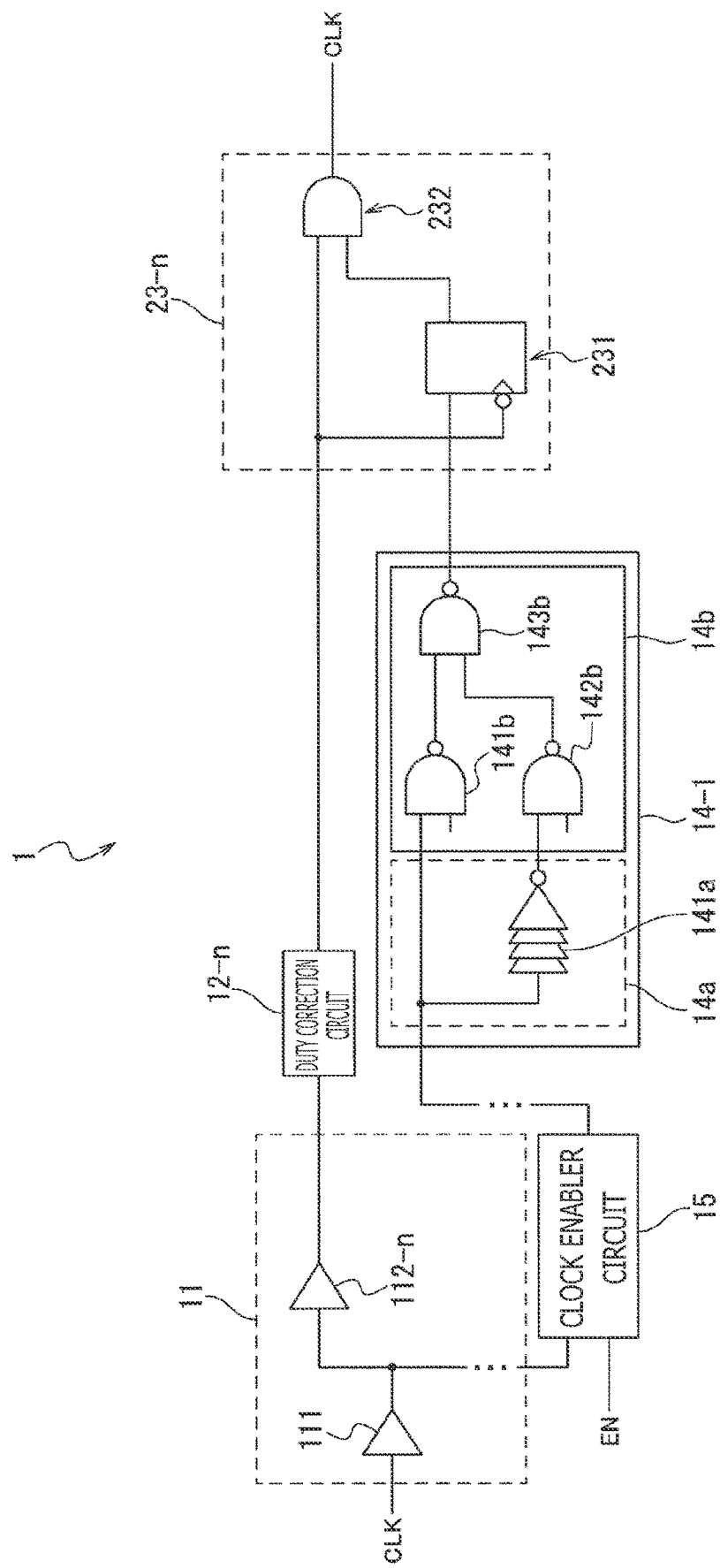
F I G. 22

CIRCUIT SYSTEM

TECHNICAL FIELD

The present disclosure relates to a circuit system.

BACKGROUND ART

PTL 1 discloses a semiconductor integrated circuit capable of adjusting skew between gated circuits at a small number of man-hours and with low power consumption.

CITATION LIST

Patent Literature

[PTL 1]
JP 2006-93393A

SUMMARY

Technical Problem

In recent years, along with the high-speed communication, it is becoming more difficult to realize full-rate architectures based on a circuit method in which clock signals at a rate equal to a data rate are used. Because of this, in the field of communication, half-rate architectures based on a method in which clock signals at a rate which is half a data rate are used have been adopted increasingly. In the half-rate architectures, a duty error of a clock signal causes jitter. If jitter occurs in a clock signal, a problem that a circuit system that operates in synchronization with the clock signal cannot be operated at high speed occurs.

An object of the present disclosure is to provide a circuit system that makes it possible to speed up an interface with a circuit connected downstream.

Solution to Problem

A circuit system according to one aspect of the present disclosure includes a clock tree circuit that has multiple lanes to which a clock signal is distributed; a duty correction circuit that is provided on each of the multiple lanes and corrects a duty ratio of the clock signal; a clock gating circuit group having a clock gating circuit that is provided on each of the multiple lanes and receives, as input, the clock signal from the duty correction circuit, the clock gating circuit group starting output of the clock signal from each of a plurality of the clock gating circuits in a predetermined period; and a variable delay circuit that is provided in association with each of a plurality of the duty correction circuits and is capable of changing a delay time of a control signal that controls a timing of starting output of the clock signal from the clock gating circuit.

BRIEF DESCRIPTION OF DRAWINGS

FIG. 1 is a block diagram depicting a schematic configuration example of a circuit system according to one embodiment of the present disclosure.

FIG. 2 is a circuit block diagram depicting a schematic configuration example of a duty correction circuit included in the circuit system according to an implementation example 1-1 in the one embodiment of the present disclosure.

FIG. 3 is a block diagram depicting a schematic configuration example of a variable delay circuit included in the circuit system according to the implementation example 1-1 in the one embodiment of the present disclosure.

FIG. 18 is a circuit block diagram depicting a schematic configuration example of a variable delay circuit included in the circuit system according to an implementation example 3-1 in the one embodiment of the present disclosure.

FIG. 22 is a circuit block diagram depicting a schematic configuration example of a clock gating circuit included in the circuit system according to an implementation example 4 in the one embodiment of the present disclosure.

DESCRIPTION OF EMBODIMENT

Figure 4:
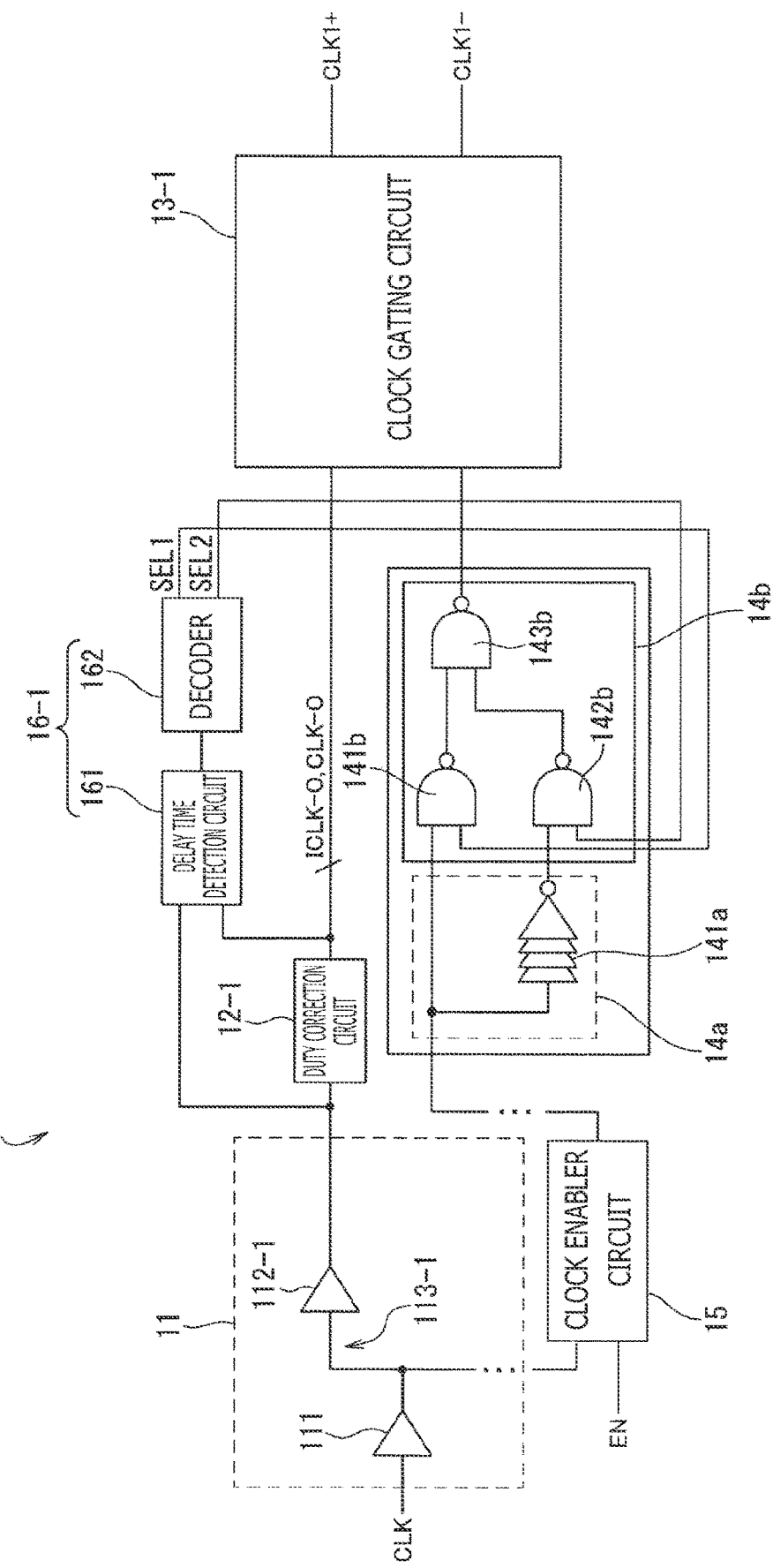
FIG. 4 is a circuit block diagram depicting a schematic configuration example of the variable delay circuit included in the circuit system according to the implementation example 1-1 in the one embodiment of the present disclosure.

Hereinafter, a mode for carrying out the present disclosure will be explained in detail with reference to the figures. The following explains one specific example of the present disclosure, but the present disclosure is not limited to the following aspects.

A circuit system according to one embodiment of the present disclosure is explained by using FIG. 1 to FIG. 28. First, a schematic configuration example of the circuit system according to the present embodiment is explained by using FIG. 1. FIG. 1 is a block diagram depicting a schematic configuration example of a circuit system 1 according to the present embodiment.

As depicted in FIG. 1, the circuit system 1 according to the present embodiment includes a clock tree circuit 11 having multiple lanes 113-1, 113-2, . . . , and 113-n (n is a natural number) to which a clock signal CLK is distributed. In addition, the circuit system 1 includes duty correction circuits 12-1, 12-2, . . . , and 12-n (n is a natural number which is the same number as the number of the lanes 113-1 to 113-n) each of which is provided for a corresponding one of the multiple lanes 113-1 to 113-n and corrects a duty ratio of a clock signal CLK. The duty ratio of the clock signal CLK is a ratio of a period during which the clock signal CLK is a high-level signal, to one cycle of the clock signal CLK. In addition, the circuit system 1 includes a clock gating circuit group 13 that has clock gating circuits 13-1, 13-2, . . . , and 13-n (n is a natural number which is the same number as the number of the lanes 113-1 to 113-n) each of which is provided for a corresponding one of the multiple lanes 113-1 to 113-n and receives a clock signal CLK from a corresponding one of the duty correction circuits 12-1 to 12-n as input. The clock gating circuit group 13 starts output of a clock signal CLK from each of the multiple clock gating circuits 13-1 to 13-n in a predetermined period. In addition, the circuit system 1 includes variable delay circuits 14-1, 14-2, . . . , and 14-n (n is a natural number which is the same number as the number of the duty correction circuits 12-1 to 12-n) that are provided in association with corresponding ones of the multiple duty correction circuits 12-1 to 12-n and can change delay times of enable signals (an example of control signals) EN. The enable signals EN control timings of starting output of clock signals CLK1, CLK2, . . . , and CLKn from the clock gating circuits 13-1 to 13-n. Further, the circuit system 1 includes a clock enabler circuit 15 that latches input enable signals EN with clock signals CLK and then outputs the enable signals EN to the variable delay circuits 14-1 to 14-n. The delay time of the enable signal EN is time for ensuring a timing margin of the clock signal.

With the configuration mentioned above, the circuit system 1 can keep the clock skew between the lanes 113-1 to 113-n within a predetermined period. Here, in the present embodiment, the predetermined period is equal to one cycle of the clock signal CLK. Therefore, the circuit system 1 needs not to adjust the clock skew mismatch between the lanes 113-1 to 113-n. That is, without adjusting the skew mismatch between the clock signals CLK1 to CLKn output from the clock gating circuits 13-1 to 13-n, the circuit system 1 can start output of the clock signals CLK1 to CLKn from the clock gating circuit group 13 at clock timings that are kept within the predetermined period (e.g. a period which is equal to one cycle of the clock signal CLK). Therefore, the circuit system 1 can receive the supply of the clock signal CLK at the clock tree circuit 11 and output the clock signals CLK1 to CLKn from the clock gating circuit group 13 at all the lanes 113-1 to 113-n at clock timings that are kept within the predetermined period, without generating a glitch. Hereinafter, the specific configuration of the circuit system 1 is explained by using implementation examples and the like. Note that the clock tree circuit 11 and the clock enabler circuit 15 have common configurations in different implementation examples of the present embodiment.

As depicted in FIG. 1, the clock tree circuit 11 has a buffer 111 that receives a clock signal CLK as input from the outside, and the lanes 113-1 to 113-n which branch off from an output terminal of the buffer 111. The clock tree circuit 11 has a buffer 112-1 provided on the lane 113-1. The buffer 112-1 is arranged between the buffer 111 and the duty correction circuit 12-1 provided on the lane 113-1. The clock tree circuit 11 has a buffer 112-2 provided on the lane 113-2. The buffer 112-2 is arranged between the buffer 111 and the duty correction circuit 12-2 provided on the lane 113-2. In a similar manner, the clock tree circuit 11 has a buffer 112-n provided on the lane 113-n. The buffer 112-n is arranged between the buffer 111 and the duty correction circuit 12-n provided on the lane 113-n. Respective input terminals of the buffers 112-1, 112-2, . . . , and 112-n are connected to the output terminal of the buffer 111. Respective output terminals of the buffers 112-1, 112-2, . . . , and 112-n are connected to an input terminal of the duty correction circuit 12-n.

As depicted in FIG. 1, the circuit system 1 has the clock enabler circuit 15. The clock enabler circuit 15 includes a flip-flop circuit (e.g. a D flip-flop circuit). A clock input terminal of the clock enabler circuit 15 is connected to the output terminal of the buffer 111 provided in the clock tree circuit 11. A data input terminal of the clock enabler circuit 15 receives enable signals EN as input. An output terminal of the clock enabler circuit 15 is connected to input terminals of the variable delay circuits 14-1 to 14-n.

Because of this, the buffer 111 outputs a clock signal CLK having a polarity which is the same as that of the input clock signal CLK (i.e. having a polarity not inverted to a positive or negative polarity), to the buffers 112-1 to 112-n and the clock enabler circuit 15 simultaneously. Depending on differences between the lengths of wires connecting the buffers 112-1 to 112-n and the buffer 111 and connecting the clock enabler circuit 15 and the buffer 111 or depending on other differences, errors are generated between duty ratios or input timings of clock signals CLK input to the buffers 112-1 to 112-n and the clock enabler circuit 15, in some cases.

The clock enabler circuit 15 latches input enable signals EN with clock signals CLK and outputs the latched enable signals EN to the variable delay circuits 14-1 to 14-n simultaneously. Depending on differences between the lengths of wires connecting the clock enabler circuit 15 and the variable delay circuits 14-1 to 14-n or depending on other differences, errors are generated between the input timings of the enable signals EN input to the respective variable delay circuits 14-1 to 14-n, in some cases.

The duty correction circuit 12-1 and the variable delay circuit 14-1 corresponding to the duty correction circuit 12-1 are connected to the clock gating circuit 13-1. The duty correction circuit 12-2 and the variable delay circuit 14-2 corresponding to the duty correction circuit 12-2 are connected to the clock gating circuit 13-2. In a similar manner, the duty correction circuit 12-n and the variable delay circuit 14-n corresponding to the duty correction circuit 12-n are connected to the clock gating circuit 13-n.

The clock gating circuit 13-1 is configured to control the timing of starting output of a clock signal CLK that is input from the duty correction circuit 12-1 and has a corrected duty ratio, by using an enable signal EN that is input from the variable delay circuit 14-1 and has an adjusted delay time. Further, the clock gating circuit 13-1 is configured to output, as a clock signal CLK1 and to a downstream circuit (not depicted), the clock signal CLK whose output start timing has been controlled.

The clock gating circuit 13-2 is configured to control the timing of starting output of a clock signal CLK that is input from the duty correction circuit 12-2 and has a corrected duty ratio, by using an enable signal EN that is input from the variable delay circuit 14-2 and has an adjusted delay time. Further, the clock gating circuit 13-2 is configured to output, as a clock signal CLK2 and to a downstream circuit (not depicted), the clock signal CLK whose output start timing has been controlled.

In a similar manner, the clock gating circuit 13-n is configured to control the timing of starting output of a clock signal CLK that is input from the duty correction circuit 12-n and has a corrected duty ratio, by using an enable signal EN that is input from the variable delay circuit 14-n and has an adjusted delay time. Further, the clock gating circuit 13-n is configured to output, as a clock signal CLKn and to a downstream circuit (not depicted), the clock signal CLK whose output start timing has been controlled.

Implementation Example 1-1

The circuit system 1 according to an implementation example 1-1 of the present embodiment is explained by using FIG. 2 to FIG. 6 with reference to FIG. 1. FIG. 2 is a circuit block diagram depicting a schematic configuration example of the duty correction circuits 12-1 to 12-n included in the circuit system 1 according to the implementation example 1-1 of the present embodiment. The duty correction circuits 12-1 to 12-n have identical configurations and are configured to perform identical functions. In view of this, the schematic configuration of the duty correction circuits 12-1 to 12-n is explained by using the duty correction circuit 12-1 as an example.

The circuit system 1 according to the present implementation example is configured such that a clock signal CLK is transferred to the clock tree circuit 11 (see FIG. 1) as a single-ended signal, and the clock signal CLK is transferred at the duty correction circuits 12-1 to 12-n and the clock gating circuits 13-1 to 13-n as a differential signal. Because of this, as depicted in FIG. 2, the duty correction circuit 12-1 has a single-differential converting section 12a that converts a clock signal CLK-I output from the buffer 112-1 provided in the clock tree circuit 11, from a single-ended signal to a differential signal. The duty correction circuit 12-1 has a duty adjusting section 12b connected to the single-differential converting section 12a. The duty adjusting section 12b is configured to adjust a duty ratio of each of differential positive and negative clock signals obtained by conversion at the single-differential converting section 12a.

As depicted in FIG. 2, the duty adjusting section 12b included in the duty correction circuit 12-1 has an inverter circuit 121P whose drive capacities are changed on the basis of the duty ratio of the positive clock signal, for example. The inverter circuit 121P has an inverting section 121aP having an input terminal connected to a positive output terminal of the single-differential converting section 12a. In addition, the inverter circuit 121P has a variable current source 121bP that controls the drive capacity of the inverting section 121aP to cause an output signal to rise, and a variable current source 121cP that controls the drive capacity of the inverting section 121aP to cause the output signal to fall.

The duty adjusting section 12b has an inverter 122P having an input terminal connected to an output terminal of the inverting section 121aP, and an inverter circuit 123P having an input terminal connected to an output terminal of the inverter 122P. The duty correction circuit 12-1 outputs a clock signal output from the inverter circuit 123P, to the clock gating circuit 13-1 as a clock signal ICLK-O.

The duty adjusting section 12b included in the duty correction circuit 12-1 has a low-pass filter 124P that receives, as input, a clock signal output by the inverter circuit 123P. The low-pass filter 124P is a passive filter including a resistor R+ and a capacitor C+. One terminal of the resistor R+ is connected to an output terminal of the inverter circuit 123P, and the other terminal of the resistor R+ is connected to one electrode of the capacitor C+. The other electrode of the capacitor C+ is connected to a terminal (e.g. a ground terminal) supplied with a reference potential. The low-pass filter 124P converts the clock signal input from the inverter circuit 123P, to a DC voltage. The low-pass filter 124P converts the input clock signal to a DC voltage at a voltage level based on the duty ratio of the clock signal. The lower the duty ratio of the input clock signal is, the lower the voltage level of the DC voltage obtained by the conversion by the low-pass filter 124P is.

The duty adjusting section 12b has an amplifier 125P connected to an output terminal of the low-pass filter 124P. An output terminal of the amplifier 125P is connected to respective current adjustment terminals of the variable current sources 121bP and 121cP provided in the inverter circuit 121P. The amplifier 125P includes an operational amplifier, for example. An inverted input terminal of the amplifier 125P is connected with the output terminal of the low-pass filter 124P. A non-inverted input terminal of the amplifier 125P receives a reference voltage VREF as input. Therefore, the amplifier 125P functions as a differential amplifier that subtracts the reference voltage VREF from the DC voltage output by the low-pass filter 124P. The duty adjusting section 12*b* feeds back output of the amplifier 125P to the inverter circuit 121P, controls current values of currents which are to flow to the variable current sources 121*b*P and 121*c*P, and adjusts the drive capacities of the inverting section 121*a*P. Therefore, the duty adjusting section 12*b* can adjust the output voltage of the low-pass filter 124P such that the output voltage approaches the reference voltage VREF.

For example, the reference voltage VREF is set to a voltage value of the DC voltage output by the low-pass filter 124P in a case that a clock signal with a duty ratio of 50% is input. In a case that a duty ratio of the clock signal ICLK-O is lower than 50%, the DC voltage input from the low-pass filter 124P becomes lower than the reference voltage VREF, so that the output voltage of the amplifier 125P becomes negative. In such a case, the duty adjusting section 12*b* controls the inverter circuit 121P such that a current value of a current which is to flow to the variable current source 121*c*P decreases to lower the drive capacity of the inverting section 121*a*P. Therefore, the fall time of a clock signal output from the inverter circuit 121P becomes longer, and the rise time of a clock signal output from the inverter 122P becomes longer. As a result, the duty ratio of the clock signal ICLK-O output from the inverter circuit 123P becomes higher than that before the adjustment.

On the other hand, in a case that the duty ratio of the clock signal ICLK-O is higher than 50%, the DC voltage input from the low-pass filter 124P becomes higher than the reference voltage VREF, so that the output voltage of the amplifier 125P becomes positive. In such a case, the duty adjusting section 12*b* controls the inverter circuit 121P such that a current value of a current which is to flow to the variable current source 121*b*P decreases to lower the drive capacity of the inverting section 121*a*P. Therefore, the rise time of a clock signal output from the inverter circuit 121P becomes longer, and the fall time of a clock signal output from the inverter 122P becomes longer. As a result, the duty ratio of the clock signal ICLK-O output from the inverter circuit 123P becomes lower than that before the adjustment.

As depicted in FIG. 2, the duty adjusting section 12*b* included in the duty correction circuit 12-1 has an inverter circuit 121N whose drive capacities are changed on the basis of the duty ratio of the negative clock signal, for example. The inverter circuit 121N has an inverting section 121*a*N having an input terminal connected to a negative output terminal of the single-differential converting section 12*a*. In addition, the inverter circuit 121N has a variable current source 121*b*N that controls the drive capacity of the inverting section 121*a*N to cause an output signal to rise, and a variable current source 121*c*N that controls the drive capacity of the inverting section 121*a*N to cause the output signal to fall.

The duty adjusting section 12*b* has an inverter 122N having an input terminal connected to an output terminal of the inverting section 121*a*N, and an inverter circuit 123N having an input terminal connected to an output terminal of the inverter 122N. The duty correction circuit 12-1 outputs a clock signal output from the inverter circuit 123N, to the clock gating circuit 13-1 as a clock signal CLK-O.

The duty adjusting section 12*b* included in the duty correction circuit 12-1 has a low-pass filter 124N that receives a clock signal output by the inverter circuit 123N, as input. The low-pass filter 124N is a passive filter including a resistor R– and a capacitor C–. One terminal of the resistor R– is connected to an output terminal of the inverter circuit 123N, and the other terminal of the resistor R– is connected to one electrode of the capacitor C–. The other electrode of the capacitor C– is connected to a terminal (e.g. a ground terminal) supplied with a reference potential. The low-pass filter 124N converts the clock signal input from the inverter circuit 123N, to a DC voltage. The low-pass filter 124N converts the input clock signal to a DC voltage at a voltage level based on the duty ratio of the clock signal. The lower the duty ratio of the input clock signal is, the lower the voltage level of the DC voltage obtained by the conversion by the low-pass filter 124N is.

The duty adjusting section 12*b* has an amplifier 125N connected to an output terminal of the low-pass filter 124N. An output terminal of the amplifier 125N is connected to respective current adjustment terminals of the variable current sources 121*b*N and 121*c*N provided in the inverter circuit 121N. The amplifier 125N includes an operational amplifier, for example. A non-inverted input terminal of the amplifier 125N is connected with the output terminal of the low-pass filter 124N. An inverted input terminal of the amplifier 125N receives the reference voltage VREF as input. Therefore, the amplifier 125N functions as a differential amplifier that subtracts the DC voltage output by the low-pass filter 124N, from the reference voltage VREF. The duty adjusting section 12*b* feeds back output of the amplifier 125N to the inverter circuit 121N, controls current values of currents which are to flow to the variable current sources 121*b*N and 121*c*N, and adjusts the drive capacities of the inverting section 121*a*N. Therefore, the duty adjusting section 12*b* can adjust the output voltage of the low-pass filter 124N such that the output voltage approaches the reference voltage VREF.

As mentioned above, the reference voltage VREF is set to, for example, a voltage value of a DC voltage output by the low-pass filter 124P in a case that a clock signal with a duty ratio of 50% is input, and the voltage value is identical to a voltage value of a DC voltage output by the low-pass filter 124N in a case that a clock signal with a duty ratio of 50% is input. In a case that the duty ratio of the clock signal CLK-O is lower than 50% (i.e. the duty ratio of the clock signal ICLK-O is higher than 50%), the DC voltage input from the low-pass filter 124N becomes lower than the reference voltage VREF, so that the output voltage of the amplifier 125N becomes positive. In such a case, the duty adjusting section 12*b* controls the inverter circuit 121N such that a current value of a current which is to flow to the variable current source 121*b*N decreases to lower the drive capacity of the inverting section 121*a*N. Therefore, the rise time of a clock signal output from the inverter circuit 121N becomes longer, and the fall time of a clock signal output from the inverter 122N becomes longer. As a result, the duty ratio of the clock signal CLK-O output from the inverter circuit 123N becomes lower than that before the adjustment.

On the other hand, in a case that the duty ratio of the clock signal CLK-O is higher than 50% (i.e. the duty ratio of the clock signal ICLK-O is lower than 50%), the DC voltage input from the low-pass filter 124N becomes higher than the reference voltage VREF, so that the output voltage of the amplifier 125N becomes negative. In such a case, the duty adjusting section 12*b* controls the inverter circuit 121N such that a current value of a current which is to flow to the variable current source 121*c*N decreases to lower the drive capacity of the inverting section 121*a*N. Therefore, the fall time of a clock signal output from the inverter circuit 121N becomes longer, and the rise time of a clock signal output from the inverter 122N becomes longer. As a result, the duty ratio of the clock signal CLK-O output from the inverter circuit 123N becomes higher than that before the adjustment.

The duty adjusting section 12b has inverters 126 and 127 provided between the inverter 122P and the inverter circuit 123P and between the inverter 122N and the inverter circuit 123N. The inverter 126 has an input terminal connected to the output terminal of the inverter 122P and the input terminal of the inverter circuit 123P, and an output terminal connected to the output terminal of the inverter 122N and the input terminal of the inverter circuit 123N. The inverter 127 has an input terminal connected to the output terminal of the inverter 122N and the input terminal of the inverter circuit 123N, and an output terminal connected to the output terminal of the inverter 122P and the input terminal of the inverter circuit 123P. Because a path on the side where the clock signal CLK-O is output and a path on the side where the clock signal ICLK-O is output are connected by the inverters 126 and 127, the signal waveforms of the clock signal CLK-O and the clock signal ICLK-O are signal waveforms with mutually inverted polarities.

The duty correction circuit 12-1 in the present implementation example has a feedback structure that uses the inverter circuit 121P having the variable current sources 121bP and 121cP, the low-pass filter 124P, and the amplifier 125P; and a feedback structure that uses the inverter circuit 121N having the variable current sources 121bN and 121cN, the low-pass filter 124N, and the amplifier 125N. Therefore, the duty correction circuit 12-1 can execute duty cycle correction (Duty Cycle Corrector: DCC) by using analog signals in its feedback loops. While the duty correction circuit 12-1 has separate feedback loops on the positive side and the negative side that are formed by using the amplifiers 125P and 125N that perform differential amplification, the feedback loops can be configured as one integrated feedback loop.

On each of the lanes 113-1 to 113-n (see FIG. 1), each of the duty correction circuits 12-1 to 12-n uses the low-pass filters 124P and 124N for converting the duty of a clock signal CLK to an analog voltage level when performing highly precise correction at each of the duty correction circuits 12-1 to 12-n. However, time that depends on a time constant defined by the resistors R+ and R− and the capacitors C+ and C− is required for the low-pass filters 124P and 124N to store electric charge in the capacitors C+ and C− and allow voltage values to converge. Because of this, a method that performs gating of a clock signal CLK at the root (input side) of the clock tree circuit 11 cannot achieve both prevention of occurrence of glitches and correction of the duty ratio at the same time. Because the circuit system 1 according to the present implementation example has the variable delay circuits 14-1 to 14-n in association with the duty correction circuits 12-1 to 12-n, gating of a clock signal CLK can be performed after the duty ratio is corrected even if the duty correction circuits 12-1 to 12-n have the low-pass filters 124P and 124N. Therefore, the circuit system 1 according to the present implementation example can start output in all the lanes 113-1 to 113-n within a predetermined period without causing a glitch to occur in a clock signal CLK.

Next, the variable delay circuits 14-1 to 14-n included in the circuit system 1 according to the present implementation example are explained. The variable delay circuits 14-1 to 14-n have identical configurations and are configured to perform identical functions. In view of this, the schematic configuration of the variable delay circuits 14-1 to 14-n is explained by using the variable delay circuit 14-1 as an example. FIG. 3 is a block diagram depicting a schematic configuration example of the variable delay circuit 14-1. In order to facilitate understanding, FIG. 3 also depicts the buffers 111 and 112-2 provided in the clock tree circuit 11, the clock enabler circuit 15, the duty correction circuit 12-1, and the clock gating circuit 13-1 that are connected to the variable delay circuit 14-1.

As depicted in FIG. 3, the variable delay circuit 14-1 has a distributing section 14a that distributes an input enable signal EN, and a selecting section 14b that selects any one of multiple enable signals EN that are distributed by the distributing section 14a and have different delay times.

An input terminal of the distributing section 14a is connected to an output terminal of the clock enabler circuit 15. Therefore, the distributing section 14a receives, as input, an enable signal EN output by the clock enabler circuit 15. The distributing section 14a has a delay section 14z that is provided on at least one of branched paths and receives an enable signal EN as input. The distributing section 14a is configured to distribute an enable signal EN to two paths, for example. The distributing section 14a has the delay section 14z on one of the two paths. Therefore, the distributing section 14a can give a delay time to an enable signal EN having passed through the delay section 14Z relative to an enable signal EN having passed through a path not provided with the delay section 14z.

Two output terminals of the distributing section 14a are connected to two input terminals of the selecting section 14b in a one-to-one relationship. Therefore, enable signals EN output by the distributing section 14a are input to the selecting section 14b. The selecting section 14b is configured to receive, as input, a selection signal SEL for selecting any one of multiple enable signals EN input from the distributing section 14a. One output terminal of the selecting section 14b is connected to an input terminal of the clock gating circuit 13-1. Therefore, the enable signal EN selected by the selecting section 14b is input to the clock gating circuit 13-1.

FIG. 4 is a circuit block diagram depicting a more specific configuration example of the variable delay circuit 14-1 depicted in FIG. 3. As depicted in FIG. 4, the variable delay circuit 14-1 has the distributing section 14a and the selecting section 14b. The distributing section 14a has an inverter circuit (an example of a first logic circuit) 141a that receives, as input, an enable signal EN distributed by the distributing section 14a. The inverter circuit 141a functions as a delay section. The inverter circuit 141a includes multiple inverters (four inverters in the present implementation example) that are connected in series.

The selecting section 14b has NAND gates (an example of second logic circuits) 141b, 142b, and 143b that receive, as input, enable signals EN distributed by the distributing section 14a. One input terminal of the NAND gate 141b is connected to an output terminal of a path that is disposed in the distributing section 14a and is not provided with the inverter circuit 141a. The other input terminal of the NAND gate 141b is connected to a selection signal generation circuit 16-1 (details are mentioned below). One input terminal of the NAND gate 142b is connected to an output terminal of the inverter circuit 141a provided in the distributing section 14a. The other input terminal of the NAND gate 142b is connected to the selection signal generation circuit 16-1 (details are mentioned below). One input terminal of the NAND gate 143b is connected to an output terminal of the NAND gate 141b. The other input terminal of the NAND gate 143b is connected to an output terminal of the NAND gate 142b.

The other input terminal of the NAND gate 141b receives, as input, a selection signal SEL1 output by the selection signal generation circuit 16-1, and the other input terminal of the NAND gate 142b receives, as input, a selection signal SEL2 output by the selection signal generation circuit 16-1. The selection signal SEL1 and the selection signal SEL2 are signals having mutually inverted polarities. That is, in a case that the selection signal SEL1 is a high-level signal, the selection signal SEL2 is a low-level signal, and in a case that the selection signal SEL1 is a low-level signal, the selection signal SEL2 is a high-level signal.

Because of this, in a case that the selection signal SEL1 is a low-level signal and the selection signal SEL2 is a high-level signal, the NAND gate 141b outputs a high-level constant signal, and the NAND gate 142b outputs a signal having a polarity which is an inversion of the polarity of a signal input to the one input terminal. Because of this, the NAND gate 143b outputs the signal input from the NAND gate 142b. Accordingly, in a case that the selection signal SEL1 is a low-level signal and the selection signal SEL2 is a high-level signal, the selecting section 14b outputs, to the clock gating circuit 13-1, an enable signal EN which is input from the NAND gate 142b and is delayed at the inverter circuit 141a.

On the other hand, in a case that the selection signal SEL1 is a high-level signal and the selection signal SEL2 is a low-level signal, the NAND gate 141b outputs a signal having a polarity which is an inversion of the polarity of a signal input to the one input terminal, and the NAND gate 142b outputs a high-level constant signal. Because of this, the NAND gate 143b outputs the signal input from the NAND gate 141b. Accordingly, in a case that the selection signal SEL1 is a high-level signal and the selection signal SEL2 is a low-level signal, the selecting section 14b outputs, to the clock gating circuit 13-1, an enable signal EN which is not input from the NAND gate 142b and not delayed at the inverter circuit 141a.

In such a manner, depending on the signal levels of the selection signals SEL1 and SEL2 input from the selection signal generation circuit 16-1, the variable delay circuit 14-1 can output, to the clock gating circuit 13-1, either an enable signal EN that is given a delay time at the inverter circuit 141a or an enable signal EN that is not given a delay time at the inverter circuit 141a.

As depicted in FIG. 4, the circuit system 1 includes the selection signal generation circuit (an example of a selection signal generating section) 16-1 that generates selection signals SEL1 and SEL2 for selecting any one of multiple enable signals EN, on the basis of at least a clock signal CLK input to the duty correction circuit 12-1. Here, the two enable signals EN that are output from the distributing section 14a and have different delay times correspond to an example of the multiple enable signals EN. While FIG. 4 depicts only the selection signal generation circuit 16-1 that generates selection signals SEL1 and SEL2 to be input to the variable delay circuit 14-1, the circuit system 1 includes selection signal generation circuits each of which generates selection signals to be input to one of the variable delay circuits 14-2 to 14-n. The selection signal generation circuits have configurations identical to that of the selection signal generation circuit 16-1, and are configured to perform functions identical to those of the selection signal generation circuit 16-1.

As depicted in FIG. 4, the selection signal generation circuit 16-1 has a delay time detection circuit 161 that detects a delay time that occurs in the duty correction circuit 12-1. In addition, the selection signal generation circuit 16-1 has a decoder 162 that outputs the selection signals SEL1 and SEL2 having predetermined polarities, on the basis of the delay time detected by the delay time detection circuit 161.

The delay time detection circuit 161 is connected to an input terminal and an output terminal of the duty correction circuit 12-1. Therefore, the delay time detection circuit 161 is configured to detect a delay time of the duty correction circuit 12-1 on the basis of input/output signals of the duty correction circuit 12-1. The delay time detection circuit 161 uses a time-to-digital converter to convert the detected delay time of the duty correction circuit 12-1 to a digital signal. The delay time detection circuit 161 outputs, to the decoder 162, the digital signal obtained by the conversion. The decoder 162 stores correspondences between delay times and the polarities of the selection signals SEL1 and SEL2. The correspondences are acquired on the basis of design values, experimental values that are acquired in advance, or other values, for example. The decoder 162 outputs, to the selecting section 14b, the selection signals SEL1 and SEL2 having predetermined polarities on the basis of the digital signal input from the delay time detection circuit 161. In such a manner, the selection signal generating section 16-1 is configured to generate the selection signals SEL and SEL2 on the basis of a delay time at the duty correction circuit 12-1.

When the error amount of a duty ratio of the clock signal CLK-I input to the duty correction circuit 12-1 changes according to a data rate, an increase of the delay time of the duty correction circuit 12-1 reduces the hold margin of a D flip-flop circuit in some cases. On the other hand, an increase of the delay time of the duty correction circuit 12-1 increases the setup margin of the D flip-flop circuit at a low rate. Because of this, the selection signal generation circuit 16-1 decides the polarities of the selection signals SEL1 and SEL2 such that a path with a larger delay amount in the variable delay circuit 14-1 is selected (i.e. an enable signal EN output from the inverter circuit 141a is selected). Therefore, the hold margin of clock signals CLK1+ and CLK1− at the clock gating circuit 13-1 increases. In such a manner, the circuit system 1 can adjust a delay time of the variable delay circuit 14-1 on the basis of information regarding a delay time of the duty correction circuit 12-1 obtained at the selection signal generation circuit 16-1. In such a manner, the selection signal generation circuit 16-1 is configured to generate different selection signals SEL1 and SEL2 (in the present implementation example, to decide the polarities of the selection signals SEL1 and SEL2) according to the data rate of a clock signal CLK input to the duty correction circuit 12-1.

Figure 5:
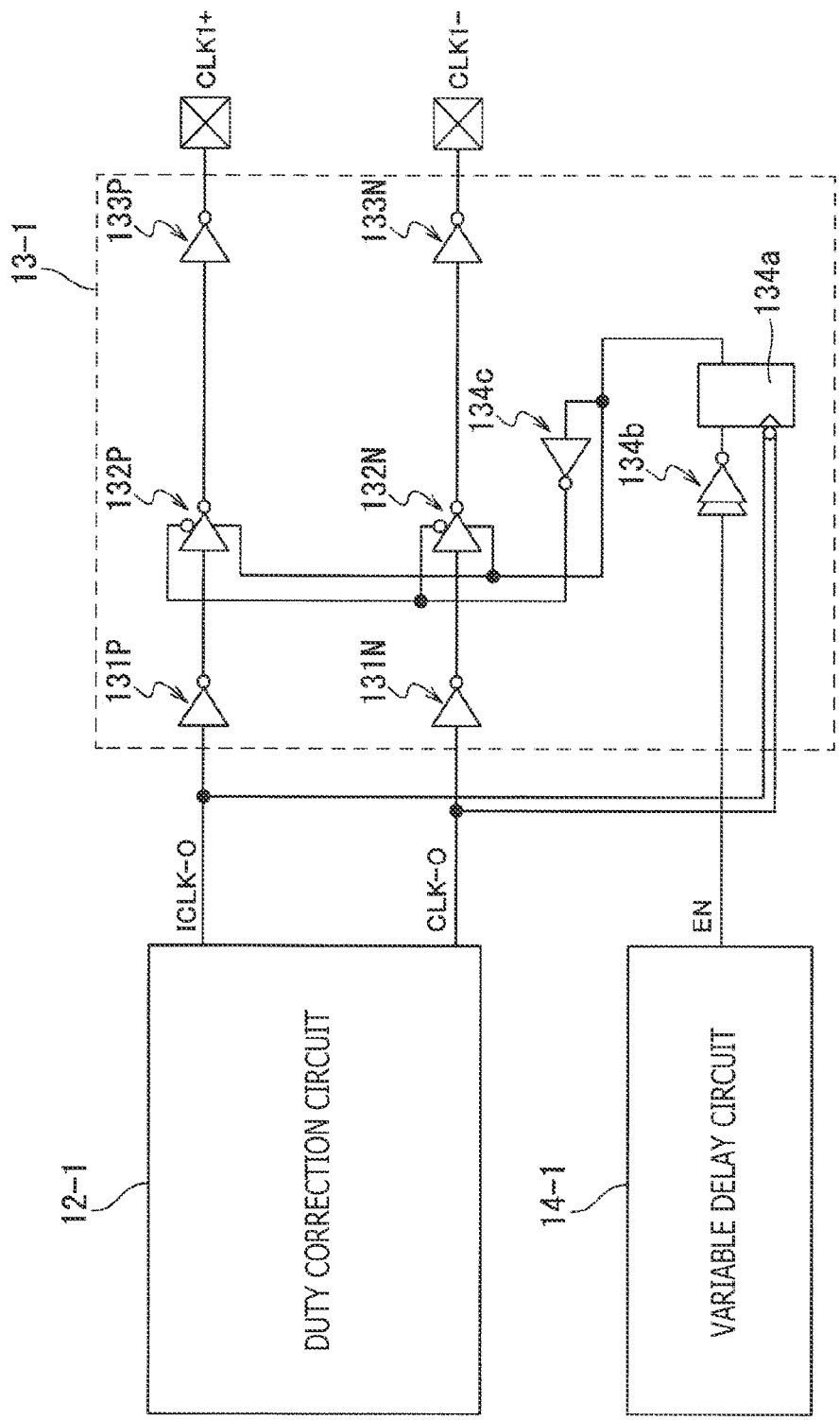
FIG. 5 is a circuit block diagram depicting a schematic configuration example of a clock gating circuit included in the circuit system according to the implementation example 1-1 in the one embodiment of the present disclosure.

Next, the schematic configuration of the clock gating circuits 13-1 to 13-n in the present implementation example is explained by using FIG. 5. The clock gating circuits 13-1 to 13-n have identical configurations and are configured to perform identical functions. In view of this, the schematic configuration of the clock gating circuits 13-1 to 13-n is explained by using the clock gating circuit 13-1 as an example. FIG. 5 is a circuit block diagram depicting a schematic configuration example of the clock gating circuit 13-1. In order to facilitate understanding, FIG. 5 also depicts the duty correction circuit 12-1 and the variable delay circuit 14-1 that are connected to the clock gating circuit 13-1.

As depicted in FIG. 5, the clock gating circuit 13-1 has a flip-flop circuit 134a having a clock input terminal electrically connected to output terminals of the duty correction circuit 12-1, and an input terminal electrically connected to an output terminal of the variable delay circuit 14-1. In addition, the clock gating circuit 13-1 has clocked inverters (an example of fourth logic circuits) 132P and 132N having signal input terminals (an example of first input terminals) electrically connected to the output terminals of the duty correction circuit 12-1, and output control terminals (an example of second input terminals) electrically connected to an output terminal of the flip-flop circuit 134a. While the clocked inverters 132P and 132N correspond to an example of the fourth logic circuits in the present implementation example, the fourth logic circuits may be transfer gates.

The clock gating circuit 13-1 has an inverter 131P that has an input terminal connected with an output terminal of the duty correction circuit 12-1 and receives the clock signal ICLK-O as input. An output terminal of the inverter 131P is connected to the signal input terminal of the clocked inverter 132P. The signal input terminal of the clocked inverter 132P is electrically connected to the output terminal of the duty correction circuit 12-1 via the inverter 131P.

The clock gating circuit 13-1 has an inverter 133P having an input terminal connected to an output terminal of the clocked inverter 132P. An output terminal of the inverter 133P functions as an output terminal of the clock gating circuit 13-1. The inverter 133P outputs the clock signal CLK1+ having a polarity which is an inversion of the polarity of the clock signal ICLK-O input from the duty correction circuit 12-1. The clock signal CLK+ is a positive clock signal of differential clock signals.

The clock gating circuit 13-1 has an inverter 131N that has an input terminal connected with an output terminal of the duty correction circuit 12-1 and receives the clock signal CLK-O as input. An output terminal of the inverter 131N is connected to the signal input terminal of the clocked inverter 132N. The signal input terminal of the clocked inverter 132N is electrically connected to the output terminal of the duty correction circuit 12-1 via the inverter 131N.

The clock gating circuit 13-1 has an inverter 133N having an input terminal connected to an output terminal of the clocked inverter 132N. An output terminal of the inverter 133N functions as an output terminal of the clock gating circuit 13-1. The inverter 133N outputs the clock signal CLK1− having a polarity which is an inversion of the polarity of the clock signal CLK-O input from the duty correction circuit 12-1. The clock signal CLK− is a negative clock signal of the differential clock signals.

The clock gating circuit 13-1 has an inverter circuit 134b that has an input terminal connected with the output terminal of the variable delay circuit 14-1 and receives an enable signal EN as input. The inverter circuit 134b includes multiple inverters (two inverters in the present implementation example) that are connected in series. An output terminal of the inverter circuit 134b is connected to an input terminal of the flip-flop circuit 134a. The input terminal of the flip-flop circuit 134a is electrically connected to the variable delay circuit 14-1 via the inverter circuit 134b.

The clock gating circuit 13-1 has an inverter 134c connected to the output terminal of the flip-flop circuit 134a. An output terminal of the inverter 134c is connected to a negative input terminal of the output control terminals of each of the clocked inverter 132P and the clocked inverter 132N. A positive input terminal of the output control terminals of each of the clocked inverter 132P and the clocked inverter 132N is connected to the output terminal of the flip-flop circuit 134a. One of the output control terminals of the clocked inverter 132P is electrically connected directly to the output terminal of the flip-flop circuit 134a, and the other one of the output control terminals of the clocked inverter 132P is electrically connected to the output terminal of the flip-flop circuit 134a via the inverter 134c. One of the output control terminals of the clocked inverter 132N is electrically connected directly to the output terminal of the flip-flop circuit 134a, and the other one of the output control terminals of the clocked inverter 132N is electrically connected to the output terminal of the flip-flop circuit 134a via the inverter 134c.

The flip-flop circuit 134a includes a D flip-flop circuit, for example. In synchronization with the clock signals CLK-O and ICLK-O output from the duty correction circuit 12-1, the flip-flop circuit 134a outputs an enable signal EN input from the variable delay circuit 14-1. Because of this, the two output control terminals of the clocked inverter 132P receive, as input, enable signals EN having mutually different polarities. Similarly, the two output control terminals of the clocked inverter 132N receive, as input, enable signals EN having mutually different polarities. In a case that an enable signal EN input from the flip-flop circuit 134a is a high-level signal, the clocked inverters 132P and 132N output clock signals having polarities which are inversions of the polarities of clock signals input from the inverters 131P and 131N. On the other hand, in a case that an enable signal EN input from the flip-flop circuit 134a is a low-level signal, the clocked inverters 132P and 132N are at high impedance states. Accordingly, output of clock signals of the clocked inverters 132P and 132N, that is, the clock gating circuit 13-1, is controlled by enable signals EN, and when low-level enable signals EN turn into high-level enable signals EN, output of the clock signals is started. That is, a timing when the low-level enable signals EN turn into high-level enable signals EN is a timing when the clock gating circuit 13-1 starts outputting clock signals.

(Operation in Implementation Example 1-1)

Figure 6:
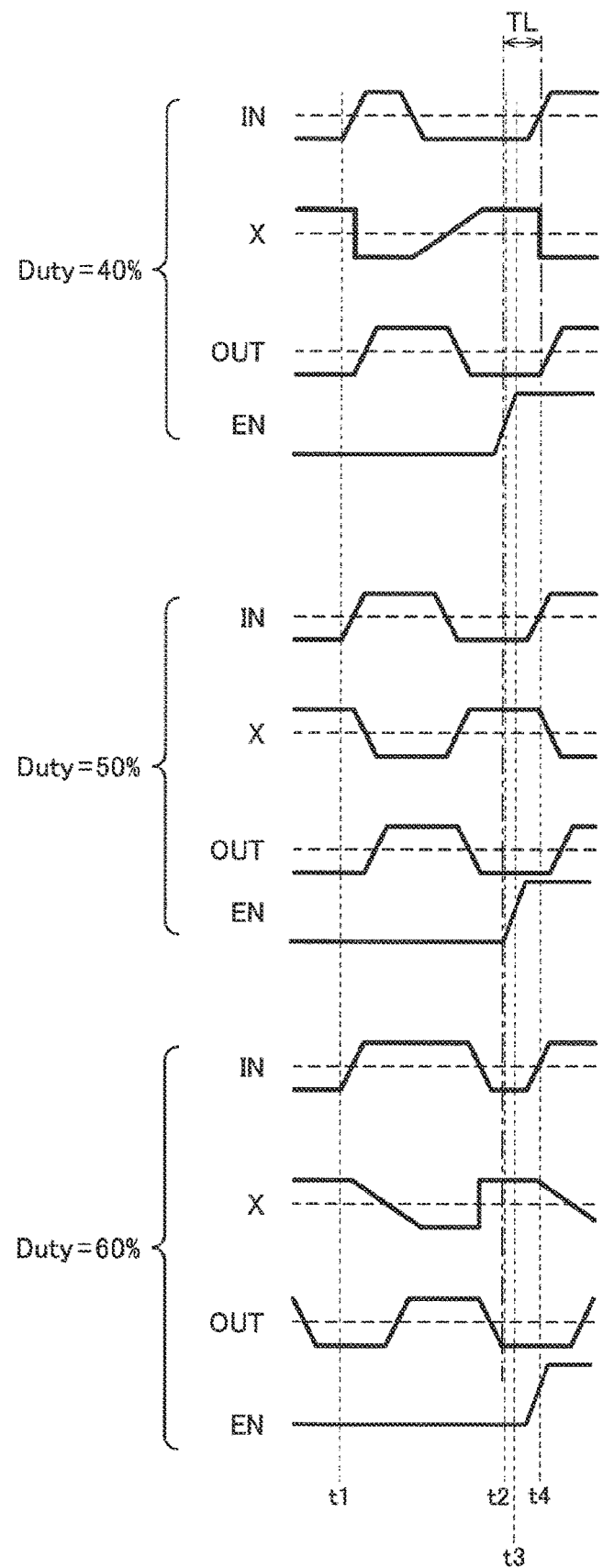
FIG. 6 is a figure depicting an example of signal waveforms for explaining operation of the circuit system according to the implementation example 1-1 in the one embodiment of the present disclosure.

Next, an example of operation of the circuit system 1 according to the present implementation example is explained by using FIG. 6. FIG. 6 is a figure depicting an example of signal waveforms for explaining operation of the circuit system 1 according to the present implementation example. The top section in FIG. 6 depicts an example of the waveforms of positive signals of differential signals in a case that the duty ratio of a clock signal CLK input to the duty correction circuit 12-1 is 40%. The middle section in FIG. 6 depicts an example of signal waveforms in a case that the duty ratio of a clock signal CLK input to the duty correction circuit 12-2 is 50%. The bottom section in FIG. 6 depicts an example of signal waveforms in a case that the duty ratio of a clock signal CLK input to the duty correction circuit 12-n is 60%. "IN" in the top section, middle section, and bottom section in FIG. 6 represents clock signals CLK input to the duty correction circuits 12-1, 12-2, and 12-n. "X" in the top section, middle section, and bottom section in FIG. 6 represents output signals of the inverter circuits 121P provided in the duty correction circuits 12-1, 12-2, and 12-n. "OUT" in the top section, middle section, and bottom section in FIG. 6 represents clock signals CLK1+, CLK2+, and CLKn+ output from the clock gating circuits 13-1, 13-2, and 13-n. "EN" in the top section, middle section, and bottom section in FIG. 6 represents enable signals EN input to the output control terminals of the clocked inverters 132P and 132N provided in the clock gating circuits 13-1, 13-2, and 13-n. Note that the waveforms of negative signals of the differential signals are different from those of the positive signals only in that the polarities thereof are inversions of the polarities of the signal waveforms depicted in FIG. 6, are similar to those of the positive signals in terms of operation principles, and thus are not depicted and explained.

As depicted in the top section in FIG. 6, in a case that the clock signal CLK with a duty ratio of 40% is input, the duty correction circuit 12-1 lowers the drive capacity of the inverter circuit 121P (see FIG. 2) to slow a rise of an output signal (see "X" in the figure) of the inverter circuit 121P (make the signal waveform less steep). Therefore, the clock signal CLK1+ output from the clock gating circuit 13-1 has a signal waveform with a duty ratio of 50%.

As depicted in the middle section in FIG. 6, in a case that the clock signal CLK with a duty ratio of 50% is input, the duty correction circuit 12-2 leaves the drive capacity of the inverter circuit 121P (see FIG. 2) unchanged and also leaves the rise of an output signal (see "X" in the figure) of the inverter circuit 121P unchanged. Therefore, the clock signal CLK2+ output from the clock gating circuit 13-2 has a signal waveform with a duty ratio of 50%.

As depicted in the bottom section in FIG. 6, in a case that the clock signal CLK with a duty ratio of 60% is input, the duty correction circuit 12-n lowers the drive capacity of the inverter circuit 121P (see FIG. 2) to slow a fall of an output signal (see "X" in the figure) of the inverter circuit 121P (make the signal waveform less steep). Therefore, the clock signal CLKn+ output from the clock gating circuit 13-n has a signal waveform with a duty ratio of 50%.

In such a manner, the duty correction circuits 12-1, 12-2, and 12-n can adjust the duty ratios of clock signals CLK. Because of this, no matter whether the duty ratios of clock signals CLK input to the duty correction circuits 12-1, 12-2, and 1-n are 50% or any ratios other than 50%, the duty ratios of the clock signals CLK1+, CLK2+, and CLKn+ output from the clock gating circuits 13-1, 13-2, and 13-n are 50%. However, as depicted in FIG. 6, in a case that clock signals CLK are input to the respective duty correction circuits 12-1, 12-2, and 12-n at time t1, the rise timings of the clock signals CLK1+, CLK2+, and CLKn+ output from the clock gating circuits 13-1, 13-2, and 13-n do not coincide with each other. Specifically, if the clock signal CLK2+ is used as a reference signal, the rise of the clock signal CLK1+ is earlier than the rise of the clock signal CLK2+, and the rise of the clock signal CLKn+ is later than the rise of the clock signal CLK2+.

For example, in conventional circuit systems, in order to prevent occurrence of glitches in clock signals output from multiple clock gating circuits, it is necessary to cause enable signals to rise in a period (a period TL in FIG. 6) during which all of the clock signals output from the multiple clock gating circuits are low-level signals. However, the duty correction circuits change delay times of the paths of the clock signals depending on duty errors. Because of this, it is difficult to adjust timings of the clock signals and the enable signals and to properly operate both the duty correction circuits and the clock gating circuits at the same time. If the timings of the clock signals and the enable signals do not satisfy a specified requirement, there is a possibility that a glitch occurs or a malfunction that a flip-flop circuit (equivalent to the flip-flop circuit 134a depicted in FIG. 5) enters a metastable state and does not respond for a long time occurs in some cases. Even if the flip-flop circuit does not enter a metastable state, the clock signals are output at different timings between multiple lanes, and it is likely that skew mismatches between multiple clock signals are not kept within a predetermined period.

In contrast to this, the circuit system 1 includes the variable delay circuits 14-1 to 14-n. Because of this, the circuit system 1 can adjust the rise timing of an enable signal EN separately for each of the clock gating circuits 13-1 to 13-n on the basis of the duty ratio of a clock signal CLK output from the clock tree circuit 11. Therefore, the circuit system 1 can cause respective enable signals EN to rise in a period during which the clock signals CLK1+, CLK2+, and CLKn+ are low-level signals. As depicted in FIG. 6, for example, the circuit system 1 can cause an enable signal EN to rise in the clock gating circuit 13-1 at time t2, can cause an enable signal EN to rise in the clock gating circuit 13-2 at time t3, and can cause an enable signal EN to rise in the clock gating circuit 13-n at time t4. The period from time t2 to time t3 is a period shorter than one cycle (predetermined period) of the clock signals CLK1+, CLK2+, and CLKn+. Because of this, even if the rise timings of the enable signals EN in the clock gating circuits 13-1 to 13-n vary from time t2 to time t3, it is possible to prevent occurrence of glitches in the clock signals CLK1+, CLK2+, and CLKn. In addition, the circuit system 1 can prevent the flip-flop circuit 134a from entering a metastable state.

Timing restrictions of the flip-flop circuit 134a are eased, and clock gating at the clock gating circuits 13-1 to 13-n becomes possible even if the duty correction circuits 12-1 to 12-n are used. While there is a concern over a power increase of the circuit system 1 if duty correction circuits are inserted on transmission paths of clock signals, a power increase can be suppressed because the activation rate of data paths is low.

Modification Example 1 of Selection Signal Generation Circuit

Figure 7:
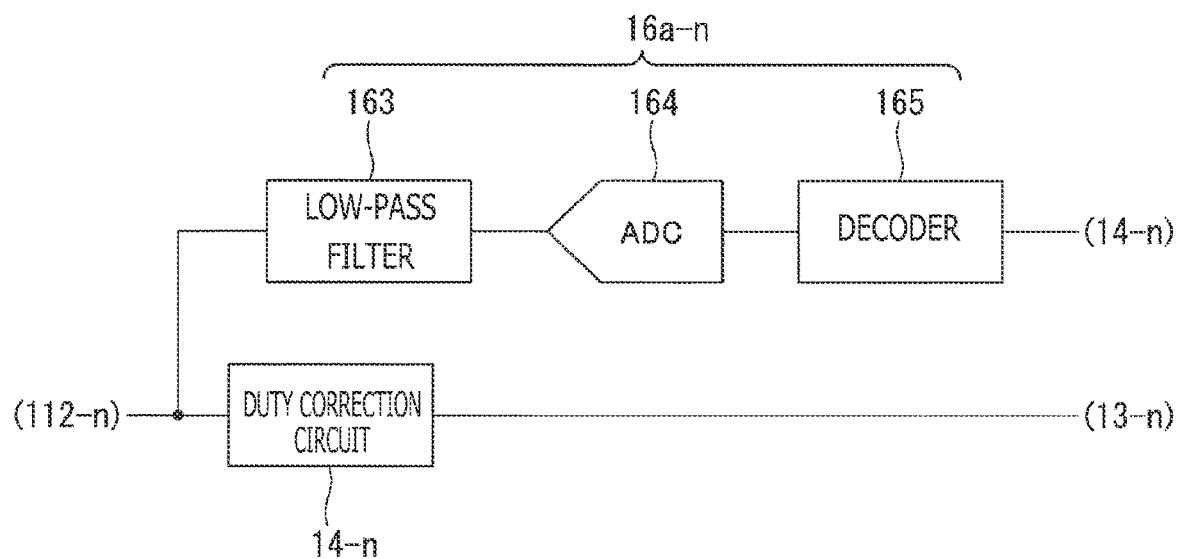
FIG. 7 is a circuit block diagram depicting a modification example 1 of a selection signal generation circuit included in the circuit system according to the implementation example 1-1 of the present disclosure.

A modification example 1 of the selection signal generation circuit included in the circuit system according to the implementation example 1-1 of the present embodiment is explained by using FIG. 7. FIG. 7 is a block diagram depicting a schematic configuration example of the modification example 1 of a selection signal generation circuit 16a-n included in the circuit system 1 according to the present implementation example. In order to facilitate understanding, FIG. 7 depicts the duty correction circuit 12-n as well. While FIG. 7 depicts only the selection signal generation circuit 16a-n that generates selection signals to be input to the variable delay circuit 14-n (see FIG. 1), the circuit system 1 includes selection signal generation circuits each of which generates a selection signal to be input to one of the variable delay circuits 14-1 to 14-(n−1). The selection signal generation circuits have configurations identical to that of the selection signal generation circuit 16a-n and are configured to perform functions identical to those of the selection signal generation circuit 16a-n.

As depicted in FIG. 7, the selection signal generation circuit 16a-n in the present modification example includes the selection signal generation circuit (an example of a selection signal generating section) 16a-n that generates selection signals SEL for selecting any one of multiple enable signals EN, on the basis of at least a clock signal CLK input to the duty correction circuit 12-n. The selection signal generation circuit 16a-n in the present modification example is configured to generate selection signals on the basis of a duty error in the duty correction circuit 12-n.

The selection signal generation circuit 16a-n has a lowpass filter 163 connected to the input terminal of the duty correction circuit 12-n. In addition, the selection signal generation circuit 16a-n has an analog-to-digital converter (hereinafter, abbreviated to "ADC") 164 that converts a DC voltage (analog signal) output from the low-pass filter 163, to a digital signal. In addition, the selection signal generation circuit 16a-n has a decoder 165 that outputs selection signals SEL1 and SEL2 with predetermined polarities on the basis of the digital signal output from the ADC 164.

The delay time of the duty correction circuit 12-n has a property of being correlated with a duty error of a clock signal CLK input to the duty correction circuit 12-n. Because of this, by using this property, the selection signal generation circuit 16a-n detects the duty error of the duty correction circuit 12-n by using the low-pass filter 163 and the ADC 164. Because the low-pass filter 163 receives, as input, the clock signal CLK input to the duty correction circuit 12-n, a voltage value of a DC voltage output from the low-pass filter 163 is a value that reflects the duty ratio of the clock signal CLK. The higher the duty ratio of the clock signal CLK is, the larger the voltage value of the DC voltage output from the low-pass filter 163 is. The ADC 164 converts the DC voltage output from the low-pass filter 163, to digital data. Because of this, the digital data output from the ADC 164 includes information regarding the duty ratio of the clock signal CLK input to the duty correction circuit 12-n.

The decoder 165 stores correspondences between selection signals and digital data including information regarding delay times. In a case that the variable delay circuit 14-n has the configuration depicted in FIG. 4, the decoder 165 stores correspondences between the polarities of the selection signals SEL1 and SEL2 and digital data including information regarding delay times. The correspondences are acquired on the basis of design values, experimental values that are acquired in advance, or other values, for example. The decoder 162 outputs, to the selecting section 14b, the selection signals SEL1 and SEL2 having predetermined polarities on the basis of the digital signal input from the ADC 164. On the basis of information regarding a delay time of a clock signal input to the duty correction circuit, the selection signal generation circuit 16a-n outputs, to the variable delay circuit 14-n, selection signals SEL1 and SEL2 that allow the variable delay circuit 14-n to execute an adjustment similar to an adjustment of a delay time of the variable delay circuit 14-1 by the selection signal generation circuit 16-1.

Modification Example 2 of Selection Signal Generation Circuit

Figure 8:
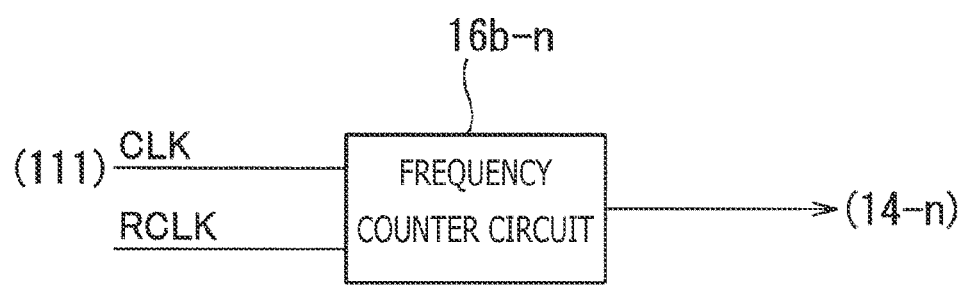
FIG. 8 is a circuit block diagram depicting a modification example 2 of the selection signal generation circuit included in the circuit system according to the implementation example 1-1 of the present disclosure.

A modification example 2 of the selection signal generation circuit included in the circuit system according to the implementation example 1-1 of the present embodiment is explained by using FIG. 8. FIG. 8 is a block diagram depicting a schematic configuration example of the modification example of a selection signal generation circuit 16b-n included in the circuit system 1 according to the present implementation example 2. While FIG. 8 depicts only the selection signal generation circuit 16b-n that generates selection signals to be input to the variable delay circuit 14-n (see FIG. 1), the circuit system 1 includes selection signal generation circuits each of which generates selection signals to be input to one of the variable delay circuits 14-1 to 14-(n−1). The selection signal generation circuits have configurations identical to that of the selection signal generation circuit 16b-n and are configured to perform functions identical to those of the selection signal generation circuit 16b-n.

As depicted in FIG. 8, the selection signal generating section 16-n is configured to generate selection signals on the basis of a clock signal CLK output from the clock tree circuit 11 (see FIG. 1) and a reference clock signal RCLK (an example of a predetermined signal) input from an external circuit (not depicted). More specifically, the selection signal generation circuit 16b-n in the present modification example includes a frequency counter. One input terminal of the selection signal generation circuit 16b-n is connected to the output terminal of the buffer 111 (see FIG. 1) provided in the clock tree circuit 11. Therefore, the one input terminal of the selection signal generation circuit 16b-n receives, as input, the clock signal CLK output by the buffer 111. In addition, the other input terminal of the selection signal generation circuit 16b-n receives, as input, the reference clock signal RCLK from the external circuit. An output terminal of the selection signal generation circuit 16b-n is connected to the variable delay circuit 14-n.

The selection signal generation circuit 16b-n compares the frequencies of the input clock signal CLK and reference clock signal RCLK and detects the frequency of the clock signal CLK at the current time point. The selection signal generation circuit 16b-n generates a selection signal that gives an enable signal EN a delay time suited for the current frequency of the clock signal CLK (the detected clock signal), and outputs the generated selection signal to the variable delay circuit 14-n.

The configuration of the selection signal generation circuit is not limited to the configurations in the modification examples 1 and 2 and may be configured to acquire a predetermined control signal (an example of a predetermined signal) from an upstream circuit (a register circuit, a phase synchronous circuit (Phase Locked Loop: PLL), etc.), use the acquired control signal to detect the frequency of the clock signal CLK at the current time point, and generate a selection signal. The predetermined signal (the reference clock signal RCLK in FIG. 8) input to the selection signal generation circuit 16-n in the present modification example may be, as mentioned above, input from the external circuit or may be generated by reading out information stored in advance on an unillustrated non-volatile memory (an example of an external circuit) or the like. The non-volatile memory may store predetermined information in advance at the time of a test of the circuit system, on the basis of design values, experimental values that are acquired in advance, or other values, for example.

Modification Example 1 of Duty Correction Circuit

Figure 9:
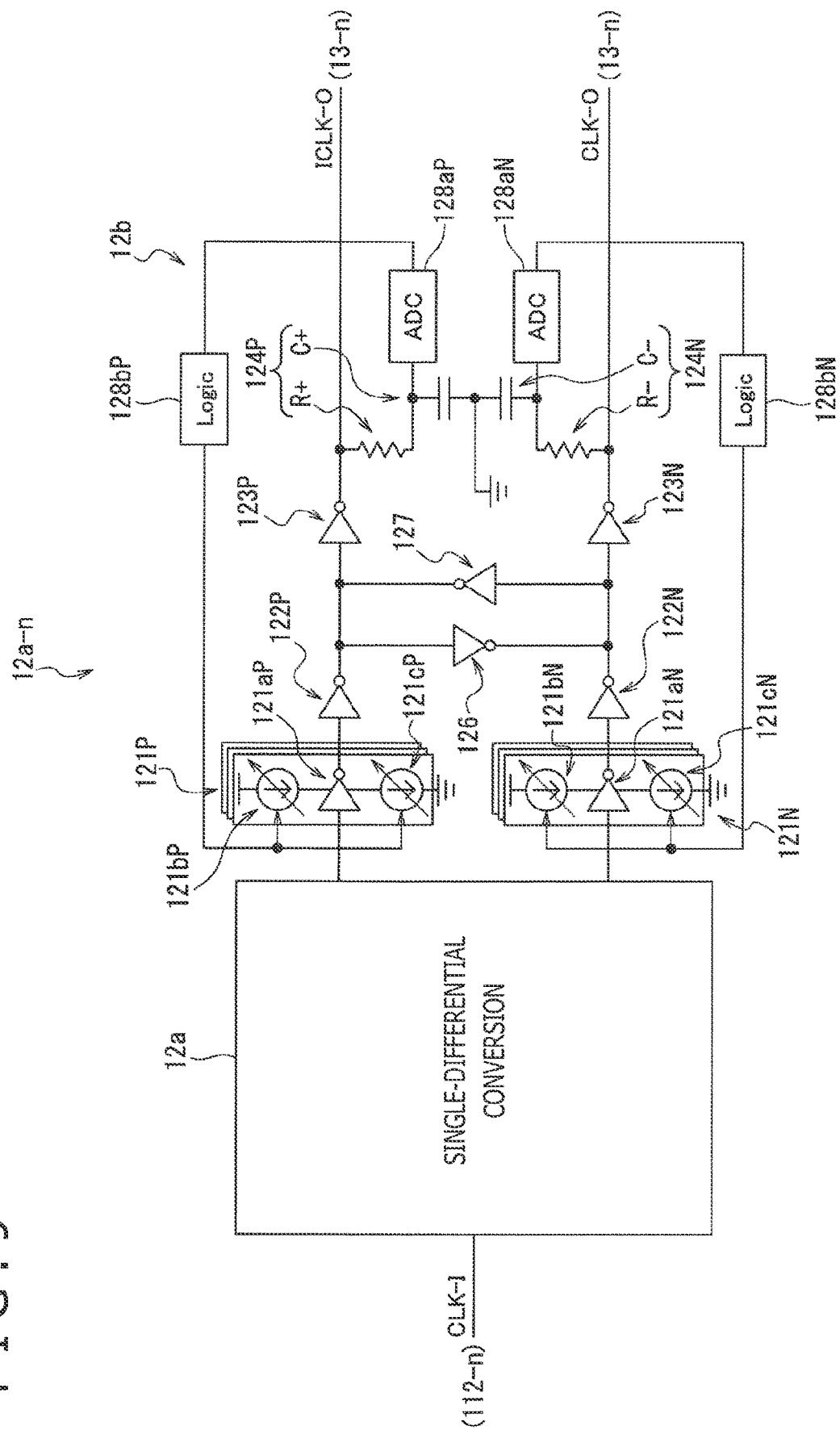
FIG. 9 is a circuit block diagram depicting a modification example 1 of the duty correction circuit included in the circuit system according to the implementation example 1-1 of the present disclosure.

A modification example 1 of the duty correction circuit included in the circuit system according to the implementation example 1-1 of the present embodiment is explained by using FIG. 9. FIG. 9 is a block diagram depicting a schematic configuration example of the modification example 1 of the duty correction circuit included in the circuit system 1 according to the present implementation example. While FIG. 9 depicts only a duty correction circuit 12a-n connected to the clock gating circuit 13-n (see FIG. 1), the circuit system 1 includes duty correction circuits each of which is connected to one of the clock gating circuits 13-1 to 13-(n−1). The duty correction circuits have configurations identical to that of the duty correction circuit 12a-n and are configured to perform functions identical to those of the duty correction circuit 12a-n. Constituent elements that provide effects and functions similar to those of the duty correction circuits 12-1 to 12-n in the present implementation example described above are given identical reference signs, and an explanation thereof is omitted.

As depicted in FIG. 9, the configuration of the duty correction circuit 12a-n in the present modification example is different from the configuration of the duty correction circuit 12-1 in that the duty correction circuit 12a-n has an ADC 128aP connected to the low-pass filter 124P and a logic circuit 128bP connected to the ADC 128aP. In addition, the configuration of the duty correction circuit 12a-n is different from the configuration of the duty correction circuit 12-1 in that the duty correction circuit 12a-n has an ADC 128aN connected to the low-pass filter 124N and a logic circuit 128bN connected to the ADC 128aN.

The ADC 128aP is configured to convert a DC voltage (analog signal) that is input from the low-pass filter 124P and includes information regarding the duty ratio of a clock signal CLK, to a digital signal. The ADC 128aP is configured to output digital data including the information regarding the duty ratio of the clock signal CLK, to the logic circuit 128bP.

The logic circuit 128bP has, for example, a decoder for reading out the digital data input from the ADC 128aP, a filter for integrating the digital data, a delta sigma modulator (DSM) for spurious prevention, and the like. The variable current sources 121bP and 121cP provided in the inverter circuit 121P are configured to be controlled on the basis of the digital data input from the logic circuit 128bP.

The ADC 128aN is configured to convert a DC voltage (analog signal) that is input from the low-pass filter 124N and includes information regarding the duty ratio of a clock signal CLK, to a digital signal. The ADC 128aN is configured to output digital data including the information regarding the duty ratio of the clock signal CLK, to the logic circuit 128bN.

The logic circuit 128bN has, for example, a decoder for reading out the digital data input from the ADC 128aN, a filter for integrating the digital data, a delta sigma modulator for spurious prevention, and the like. The variable current sources 121bN and 121cN provided in the inverter circuit 121N are configured to be controlled on the basis of the digital data input from the logic circuit 128bN.

The duty correction circuit 12a-n in the present modification example can adjust currents which are to flow to the variable current sources 121bP and 121cP and the variable current sources 121bN and 121cN, by using digital signals. In addition, in a case that the dynamic ranges of the ADCs 128aP and 128bN are insufficient relative to the DC voltages output from the low-pass filters 124P and 124N, amplifiers may be provided between the ADCs 128aP and 128bN and the low-pass filters 124P and 124N. In addition, the ADCs 128aP and 128bN may not be provided separately on the positive side and the negative side of differential signals and may be provided as one integrated ADC.

Modification Example 2 of Duty Correction Circuit

Figure 10:
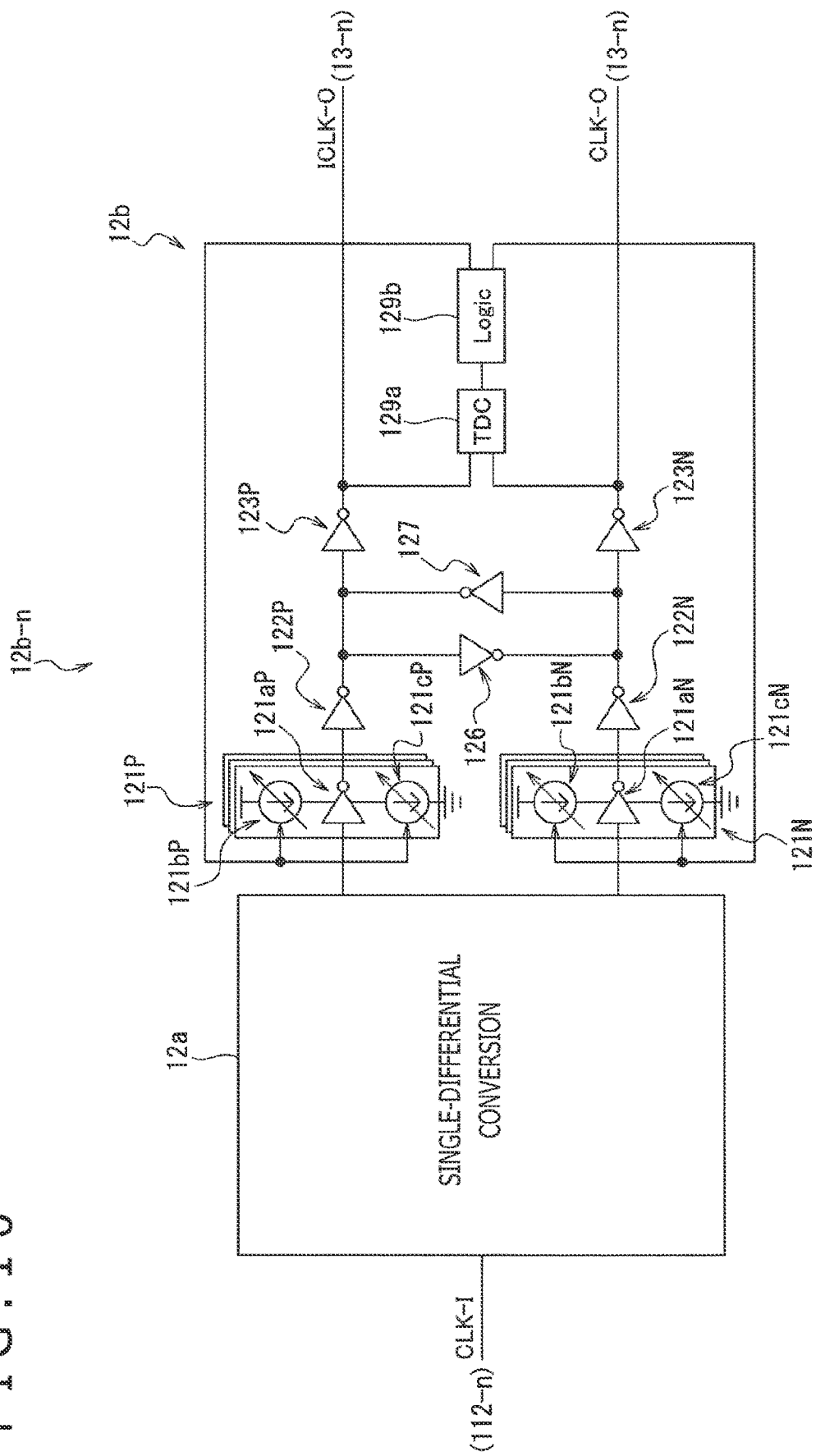
FIG. 10 is a circuit block diagram depicting a modification example 2 of the duty correction circuit included in the circuit system according to the implementation example 1-1 of the present disclosure.

A modification example 2 of the duty correction circuit included in the circuit system according to the implementation example 1-1 of the present embodiment is explained by using FIG. 10. FIG. 10 is a block diagram depicting a schematic configuration example of the modification example 2 of the duty correction circuit included in the circuit system 1 according to the present implementation example. While FIG. 10 depicts only a duty correction circuit 12b-n connected to the clock gating circuit 13-n (see FIG. 1), the circuit system 1 includes duty correction circuits each of which is connected to one of the clock gating circuits 13-1 to 13-(n−1). The duty correction circuits have configurations identical to that of the duty correction circuit 12b-n and are configured to perform functions identical to those of the duty correction circuit 12b-n. Constituent elements that provide effects and functions similar to those of the duty correction circuits 12-1 to 12-n in the present implementation example described above are given identical reference signs, and an explanation thereof is omitted.

As depicted in FIG. 10, the configuration of the duty correction circuit 12b-n in the present modification example is different from the configuration of the duty correction circuit 12-1 in that the duty correction circuit 12b-n has a time-to-digital conversion circuit (Time-to-Digital Converter: TDC) 129a having an input terminal connected with the output terminals of the inverter circuits 123P and 123N, and a logic circuit 129b having an output terminal connected to an output terminal of the time-to-digital conversion circuit (hereinafter, abbreviated to "TDC") 129a.

The ADC 128aP is configured to convert a DC voltage (analog signal) that is input from the low-pass filter 124P and includes information regarding the duty ratio of a clock signal CLK, to a digital signal. The ADC 128aP is configured to output digital data including the information regarding the duty ratio of the clock signal CLK, to the logic circuit 128bP. The duty correction circuit 12b-n in the present modification example can also adjust currents which are to flow to the variable current sources 121bP and 121cP and the variable current sources 121bN and 121cN, by using digital signals.

The TDC 129a is configured to detect high-level zones of the respective differential clock signals (i.e. the clock signal CLK-O and the clock signal ICLK-O) and convert the detected zones to digital data. The TDC 129a outputs the changed digital data to the logic circuit 129b. The logic circuit 129b has a decoder for reading out the digital data input from the TDC 129a, a filter for integrating the digital data, a delta sigma modulator for spurious prevention, and the like. The logic circuit 129b is configured to calculate a temporal difference between the clock signal CLK-O and the clock signal ICLK-O, performs signal processing thereon, and then feeds back the temporal difference to the inverter circuits 121P and 121N.

Implementation Example 1-2

Figure 11:
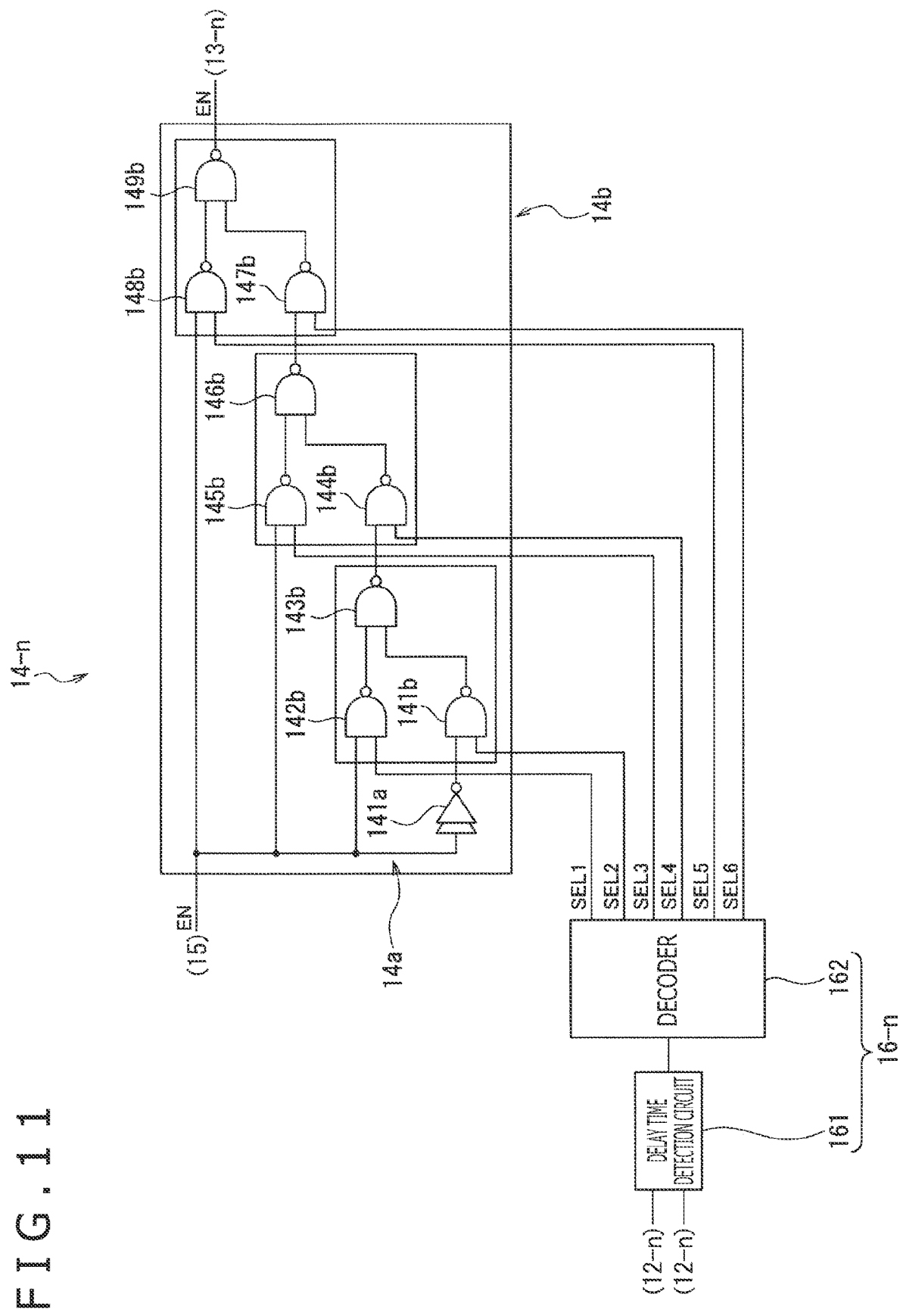
FIG. 11 is a circuit block diagram depicting a schematic configuration example of a variable delay circuit included in the circuit system according to an implementation example 1-2 in the one embodiment of the present disclosure.

The circuit system 1 according to an implementation example 1-2 of the present embodiment is explained by using FIG. 11 with reference to FIG. 1 and FIG. 5. FIG. 11 is a circuit block diagram depicting a schematic configuration example of the variable delay circuit 14-n included in the circuit system 1 according to the implementation example 1-2 of the present embodiment. The variable delay circuits 14-1 to 14-n in the present embodiment have identical configurations and are configured to perform identical functions. In view of this, the schematic configuration of the variable delay circuits 14-1 to 14-n is explained by using the variable delay circuit 14-n as an example. In order to facilitate understanding, FIG. 11 also depicts the selection signal generation circuit 16-n connected to the variable delay circuit 14-n. Note that constituent elements in the circuit system 1 according to the implementation example 1-1 described above can be applied as constituent elements in the present implementation example except the variable delay circuits.

As depicted in FIG. 11, the variable delay circuit 14-n included in the circuit system 1 according to the present implementation example has the distributing section 14a and the selecting section 14b. The distributing section 14a has the inverter circuit (an example of a first logic circuit) 141a that receives, as input, an enable signal EN distributed by the distributing section 14a. The inverter circuit 141a functions as a delay section. The inverter circuit 141a includes multiple inverters (two inverters in the present implementation example) that are connected in series. The distributing section 14a is configured to distribute an enable signal EN to four paths. The four paths include a first path on which the inverter circuit 141a is provided, a second path arranged next to the first path, a third path arranged next to the second path, and a fourth path arranged next to the third path.

The selecting section 14b has NAND gates (an example of second logic circuits) 141b, 142b, and 143b that receive, as input, enable signals EN distributed by the distributing section 14a. One input terminal of the NAND gate 141b is connected to the second path of the distributing section 14a. The other input terminal of the NAND gate 141b is connected to the selection signal generation circuit 16-n. One input terminal of the NAND gate 142b is connected to the second path of the distributing section 14a. In addition, the one input terminal of the NAND gate 142b is connected to an output terminal of the inverter circuit 141a provided in the distributing section 14a. The other input terminal of the NAND gate 142b is connected to the selection signal generation circuit 16-n. One input terminal of the NAND gate 143b is connected to an output terminal of the NAND gate 142b. The other input terminal of the NAND gate 143b is connected to an output terminal of the NAND gate 141b.

The selecting section 14b has NAND gates (an example of second logic circuits) 144b, 145b, and 146b that receive, as input, enable signals EN distributed by the distributing section 14a. One input terminal of the NAND gate 144b is connected to an output terminal of the NAND gate 143b. The other input terminal of the NAND gate 144b is connected to the selection signal generation circuit 16-n. One input terminal of the NAND gate 145b is connected to the third path of the distributing section 14a. The other input terminal of the NAND gate 145b is connected to the selection signal generation circuit 16-n. One input terminal of the NAND gate 146b is connected to an output terminal of the NAND gate 145b. The other input terminal of the NAND gate 146b is connected to an output terminal of the NAND gate 144b.

The selecting section 14b has NAND gates (an example of second logic circuits) 147b, 148b, and 149b that receive, as input, enable signals EN distributed by the distributing section 14a. One input terminal of the NAND gate 147b is connected to an output terminal of the NAND gate 146b. The other input terminal of the NAND gate 147b is connected to the selection signal generation circuit 16-n. One input terminal of the NAND gate 148b is connected to the fourth path of the distributing section 14a. The other input terminal of the NAND gate 148b is connected to the selection signal generation circuit 16-n. One input terminal of the NAND gate 149b is connected to an output terminal of the NAND gate 148b. The other input terminal of the NAND gate 149b is connected to an output terminal of the NAND gate 147b. An output terminal of the NAND gate 149b is connected to the clock gating circuit 13-n (more specifically, the input terminal of the inverter circuit 134b (see FIG. 5)).

In the present implementation example, the selecting section 14b also functions as a delay section. Because of this, an enable signal EN passes through eight elements in total in the first path, that is, passes through the inverter circuit 141a and the NAND gates 141b, 143b, 144b, 146b, 147b, and 149b, so that a delay corresponding to the eight elements occurs. An enable signal EN passes through six elements in total in the second path, that is, passes through the NAND gates 142b, 143b, 144b, 146b, 147b, and 149b, so that a delay corresponding to the six elements occurs. An enable signal EN passes through four elements in total in the third path, that is, passes through the NAND gates 145b, 146b, 147b, and 149b, so that a delay corresponding to the four elements occurs. An enable signal EN passes through two elements in total in the fourth path, that is, passes through the NAND gates 148b and 149b, so that a delay corresponding to the two elements occurs.

The selection signal generation circuit 16-n is configured to output, to the variable delay circuit 14-n, selection signals SEL1 to SEL6 with predetermined combinations of polarities on the basis of a delay time at the duty correction circuit 12-n detected by the delay time detection circuit 161.

For example, it is supposed that a delay time detected by the delay time detection circuit 161 is the longest delay time in multiple delay times (four delay times in the present implementation example) set for the decoder 162. In such a case, the decoder 162 outputs, to the selecting section 14b, the selection signals SEL1, SEL3, and SEL5 as low-level signals, and the selection signals SEL2, SEL4, and SEL6 as high-level signals. Because of this, the NAND gates 142b, 145b, and 148b output high-level constant signals, and each of the NAND gates 141b, 143b, 144b, 146b, 147b, and 149b outputs a signal based on a signal input to the one input terminal. Therefore, the variable delay circuit 14-n outputs, to the clock gating circuit 13-n, an enable signal EN which is given a delay time corresponding to the eight elements in the first path.

For example, it is supposed that a delay time detected by the delay time detection circuit 161 is the second longest delay time in the multiple delay times (the four delay times in the present implementation example) set for the decoder 162. In such a case, the decoder 162 outputs, to the selecting section 14b, the selection signals SEL2, SEL3, and SEL5 as low-level signals, and the selection signals SEL1, SEL4, and SEL6 as high-level signals. Because of this, the NAND gates 141b, 145b, and 148b output high-level constant signals, and each of the NAND gates 142b, 143b, 144b, 146b, 147b, and 149b outputs a signal based on a signal input to the one input terminal. Therefore, the variable delay circuit 14-n outputs, to the clock gating circuit 13-n, an enable signal EN which is given a delay time corresponding to the six elements in the second path.

For example, it is supposed that a delay time detected by the delay time detection circuit 161 is the third longest delay time in the multiple delay times (the four delay times in the present implementation example) set for the decoder 162. In such a case, the decoder 162 outputs, to the selecting section 14b, the selection signals SEL1, SEL2, and SEL5 as low-level signals, and the selection signals SEL3, SEL4, and SEL6 as high-level signals. Because of this, the NAND gates 141b, 142b, and 148b output high-level constant signals, and each of the NAND gates 143b, 144b, 145b, 146b, 147b, and 149b outputs a signal based on a signal input to the one input terminal. Therefore, the variable delay circuit 14-n outputs, to the clock gating circuit 13-n, an enable signal EN which is given a delay time corresponding to the four elements in the third path.

For example, it is supposed that a delay time detected by the delay time detection circuit 161 is the shortest delay time in the multiple delay times (the four delay times in the present implementation example) set for the decoder 162. In such a case, the decoder 162 outputs, to the selecting section 14b, the selection signals SEL1, SEL2, and SEL3 as low-level signals, and the selection signals SEL4, SEL5, and SEL6 as high-level signals. Because of this, the NAND gates 141*b*, 142*b*, and 145*b* output high-level constant signals, and each of the NAND gates 143*b*, 144*b*, 146*b*, 147*b*, 148*b*, and 149*b* outputs a signal based on a signal input to the one input terminal. Therefore, the variable delay circuit 14-*n* outputs, to the clock gating circuit 13-*n*, an enable signal EN which is given a delay time corresponding to the two elements in the fourth path.

In such a manner, depending on the signal levels of the selection signals SEL1 to SEL6 input from the selection signal generation circuit 16-*n*, the variable delay circuit 14-*n* in the present implementation example can output, to the clock gating circuit 13-*n*, an enable signal EN that is given a delay time at any of the inverter circuit 141*a* and the NAND gates 141*b* to 149*b*. In addition, the variable delay circuit 14-*n* in the present implementation example is capable of switching to many levels (four levels in the present example). If the variable delay circuit 14-*n* is given a resolution and a calibration function is implemented, adjustment can be made to cope with amounts of delay changes in process variations of the circuit system 1. Therefore, the timing margin of a clock signal CLK increases, and the circuit system 1 can achieve high-speed processing.

Implementation Example 1-3

Figure 12:
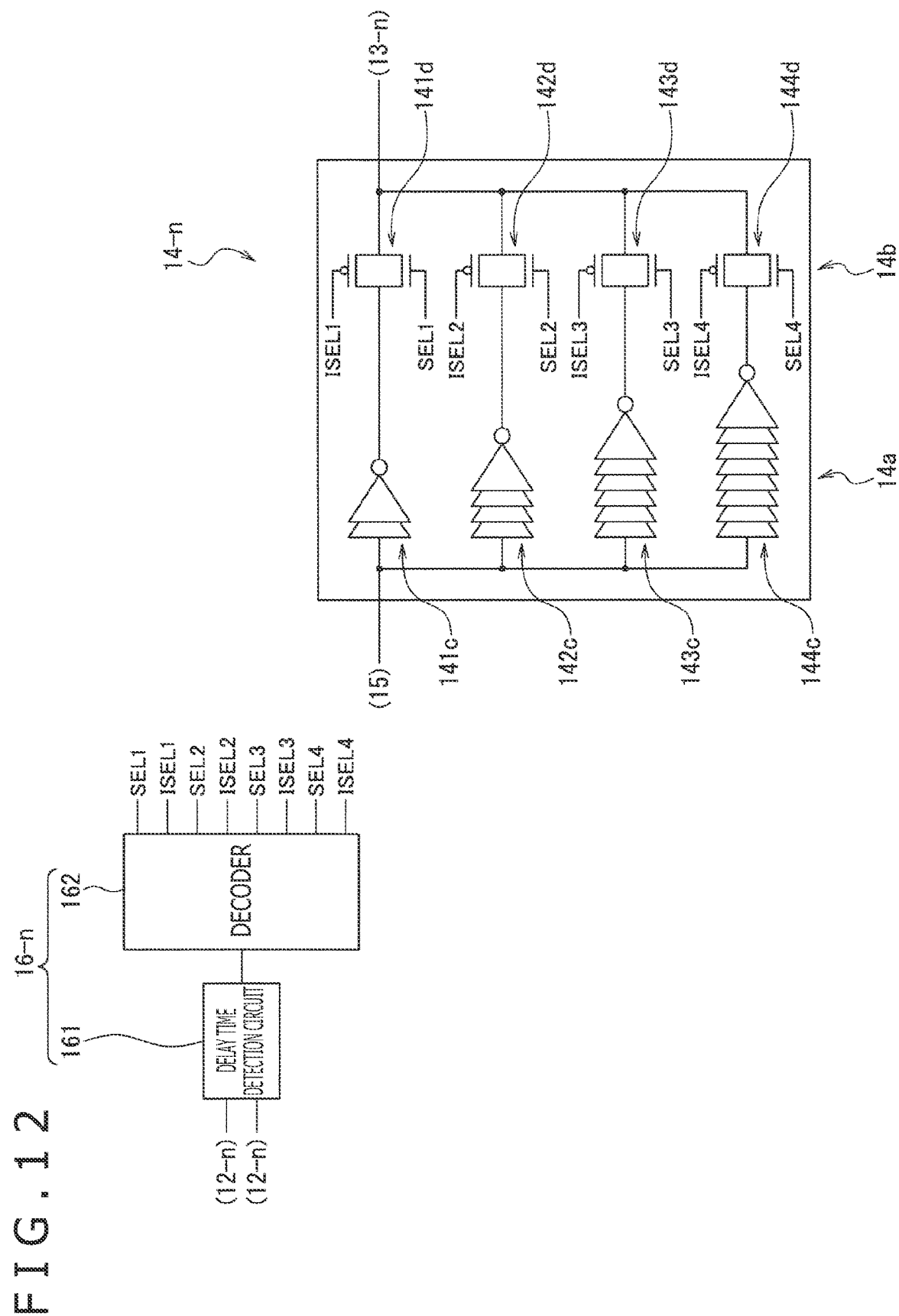
FIG. 12 is a circuit block diagram depicting a schematic configuration example of a variable delay circuit included in the circuit system according to an implementation example 1-3 in the one embodiment of the present disclosure.

The circuit system 1 according to an implementation example 1-3 of the present embodiment is explained by using FIG. 12 with reference to FIG. 1 and FIG. 5. FIG. 12 is a circuit block diagram depicting a schematic configuration example of the variable delay circuit 14-*n* included in the circuit system 1 according to the implementation example 1-3 of the present embodiment. The variable delay circuits 14-1 to 14-*n* in the present embodiment have identical configurations and are configured to perform identical functions. In view of this, the schematic configuration of the variable delay circuits 14-1 to 14-*n* is explained by using the variable delay circuit 14-*n* as an example. In order to facilitate understanding, FIG. 13 also depicts the selection signal generation circuit 16-*n* connected to the variable delay circuit 14-*n*. Note that constituent elements in the circuit system 1 according to the respective implementation examples described above can be applied as constituent elements in the present implementation example except the variable delay circuits.

As depicted in FIG. 12, the variable delay circuit 14-*n* included in the circuit system 1 according to the present implementation example has a distributing section 14*c* and a selecting section 14*d*. The distributing section 14*c* has inverter circuits (an example of first logic circuits) 141*c*, 142*c*, 143*c*, and 144*c* that receive, as input, enable signals EN distributed by the distributing section 14*c*. The inverter circuits 141*c*, 142*c*, 143*c*, and 144*c* function as delay sections. The inverter circuits 141*c*, 142*c*, 143*c*, and 144*c* include multiple inverters that are connected in series. The inverter circuit 141*c* includes two inverters that are connected in series. The inverter circuit 142*c* includes four inverters that are connected in series. The inverter circuit 143*c* includes six inverters that are connected in series. The inverter circuit 144*c* includes eight inverters that are connected in series. Input terminals of the inverter circuits 141*c*, 142*c*, 143*c*, and 144*c* are connected to the output terminal of the clock enabler circuit 15.

The selecting section 14*d* has transfer gates (an example of second logic circuits) 141*d*, 142*d*, 143*d*, and 144*d* that receive, as input, enable signals EN distributed by the distributing section 14*c*. An input terminal of the transfer gate 141*d* is connected to an output terminal of the inverter circuit 141*c*. An input terminal of the transfer gate 142*d* is connected to an output terminal of the inverter circuit 142*c*. An input terminal of the transfer gate 143*d* is connected to an output terminal of the inverter circuit 143*c*. An input terminal of the transfer gate 144*d* is connected to an output terminal of the inverter circuit 144*c*. Output terminals of the transfer gates 141*d*, 142*d*, 143*d*, and 144*d* are connected with each other and are connected to the clock gating circuit 13-*n* (more specifically, the input terminal of the inverter circuit 134*b* (see FIG. 5)).

Output control terminals of the transfer gates 141*d*, 142*d*, 143*d*, and 144*d* are connected to the decoder 162 provided in the selection signal generation circuit 16-*n*. The output control terminal of the transfer gate 141*d* receives, as input, selection signals SEL1 and ISEL1 output by the decoder 162. The output control terminal of the transfer gate 142*d* receives, as input, selection signals SEL2 and ISEL2 output by the decoder 162. The output control terminal of the transfer gate 143*d* receives, as input, selection signals SEL3 and ISEL3 output by the decoder 162. The output control terminal of the transfer gate 144*d* receives, as input, selection signals SEL4 and ISEL4 output by the decoder 162.

The selection signal generation circuit 16-*n* is configured to output, to the variable delay circuit 14-*n*, the selection signals SEL1 to ISEL4 with predetermined combinations of polarities on the basis of a delay time at the duty correction circuit 12-*n* detected by the delay time detection circuit 161.

For example, it is supposed that a delay time detected by the delay time detection circuit 161 is the shortest delay time in multiple delay times (four delay times in the present implementation example) set for the decoder 162. In such a case, the decoder 162 outputs, to the transfer gate 141*d*, the selection signal SEL1 as a high-level signal and the selection signal ISEL1 as a low-level signal. In addition, in such a case, the decoder 162 outputs, to the transfer gates 142*d*, 143*d*, and 144*d*, the selection signals SEL2, SEL3, and SEL4 as low-level signals, and the selection signals ISEL2, ISEL3, and ISEL4 as high-level signals. Therefore, the transfer gate 141*d* enters a conduction state, and the transfer gates 142*d*, 143*d*, and 144*d* enter high impedance states. Because of this, the variable delay circuit 14-*n* outputs, to the clock gating circuit 13-*n*, an enable signal EN which is output from the inverter circuit 141*c* and is given a delay time corresponding to the two elements.

For example, it is supposed that a delay time detected by the delay time detection circuit 161 is the second shortest delay time in the multiple delay times (the four delay times in the present implementation example) set for the decoder 162. In such a case, the decoder 162 outputs, to the transfer gate 142*d*, the selection signal SEL2 as a high-level signal and the selection signal ISEL2 as a low-level signal. In addition, in such a case, the decoder 162 outputs, to the transfer gates 141*d*, 143*d*, and 144*d*, the selection signals SEL1, SEL3, and SEL4 as low-level signals, and the selection signals ISEL1, ISEL3, and ISEL4 as high-level signals. Therefore, the transfer gate 142*d* enters a conduction state, and the transfer gates 141*d*, 143*d*, and 144*d* enter high impedance states. Because of this, the variable delay circuit 14-*n* outputs, to the clock gating circuit 13-*n*, an enable signal EN which is output from the inverter circuit 142*c* and is given a delay time corresponding to the four elements.

For example, it is supposed that a delay time detected by the delay time detection circuit 161 is the longest delay time in the multiple delay times (the four delay times in the present implementation example) set for the decoder 162. In such a case, the decoder 162 outputs, to the transfer gate 144d, the selection signal SEL4 as a high-level signal and the selection signal ISEL4 as a low-level signal. In addition, in such a case, the decoder 162 outputs, to the transfer gates 141d, 142d, and 143d, the selection signals SEL1, SEL2, and SEL3 as low-level signals, and the selection signals ISEL1, ISEL2, and ISEL3 as high-level signals. Therefore, the transfer gate 144d enters a conduction state, and the transfer gates 141d, 142d, and 143d enter high impedance states. Because of this, the variable delay circuit 14-n outputs, to the clock gating circuit 13-n, an enable signal EN which is output from the inverter circuit 144c and is given a delay time corresponding to the eight elements.

In such a manner, depending on the signal levels of the selection signals SEL1 to ISEL4 input from the selection signal generation circuit 16-n, the variable delay circuit 14-n in the present implementation example can output, to the clock gating circuit 13-n, an enable signal EN that is given a delay time at any of the inverter circuits 141c to 144c. In addition, the variable delay circuit 14-n in the present implementation example is capable of switching to many levels (four levels in the present example). If the variable delay circuit 14-n is given a resolution and a calibration function is implemented, adjustment can be made to cope with amounts of delay changes in process variations of the circuit system 1. Therefore, the timing margin of a clock signal CLK increases, and the circuit system 1 can achieve high-speed processing.

Modification Example 1 of Variable Delay Circuit

Figure 13:
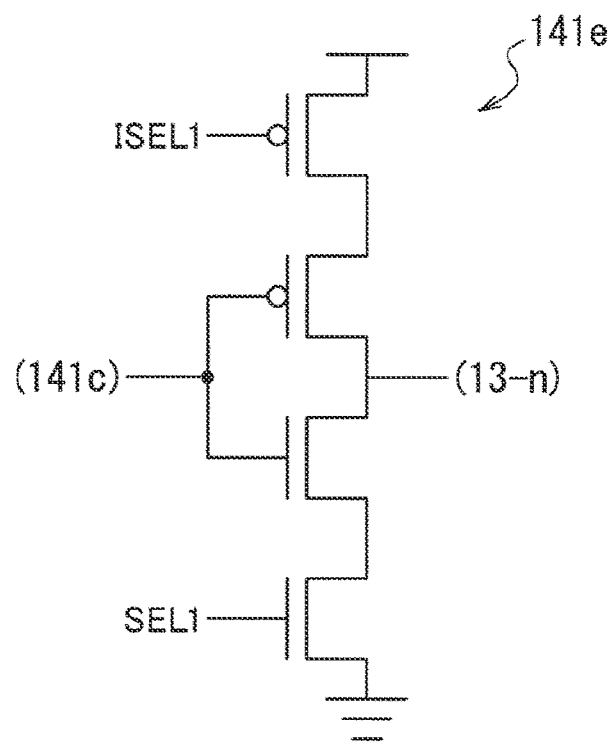
FIG. 13 is a circuit diagram depicting a modification example 1 of the schematic configuration of the variable delay circuit included in the circuit system according to the implementation example 1-3 in the one embodiment of the present disclosure.

A modification example 1 of the variable delay circuit included in the circuit system according to the implementation example 1-2 of the present embodiment is explained by using FIG. 13 with reference to FIG. 1, FIG. 5, and FIG. 12. FIG. 13 is a block diagram depicting main sections of the schematic configuration of the modification example 1 of the variable delay circuit 14-n included in the circuit system 1 according to the present implementation example. While FIG. 13 depicts only the variable delay circuit 14-n connected to the clock gating circuit 13-n (see FIG. 1), the circuit system 1 includes variable delay circuits each of which is connected to one of the clock gating circuits 13-1 to 13-(n−1). The variable delay circuits have configurations identical to that of the variable delay circuit 14-n in the present modification example and are configured to perform functions identical to those of the variable delay circuit 14-n.

Instead of an inverter at the last stage of the inverter circuit 141c provided in the distributing section 14a and the transfer gate 141d provided in the selecting section 14d, the variable delay circuit 14-n in the present modification example includes a clocked inverter (an example of a second logic circuit) 141e as depicted in FIG. 13. An input terminal of the clocked inverter 141e is connected to the output terminal of the inverter circuit 141c (see FIG. 12). An output control terminal of the clocked inverter 141e is connected to the decoder 162 of the selection signal generation circuit 16-n (see FIG. 12) and is configured to receive the selection signals SEL1 and ISEL1 as input.

Although not depicted in the figure, in the present modification example, the inverters at the last stages of the inverter circuits 142c, 143c, and 144c provided in the distributing section 14a and the transfer gates 142d, 143d, and 144d provided in the selecting section 14d similarly include clocked inverters (an example of second logic circuits).

Output terminals of the clocked inverter 141e and other clocked inverters are connected with each other and are connected to the clock gating circuit 13-n (more specifically, the input terminal of the inverter circuit 134b (see FIG. 5)).

Modification Example 2 of Variable Delay Circuit

Figure 14:
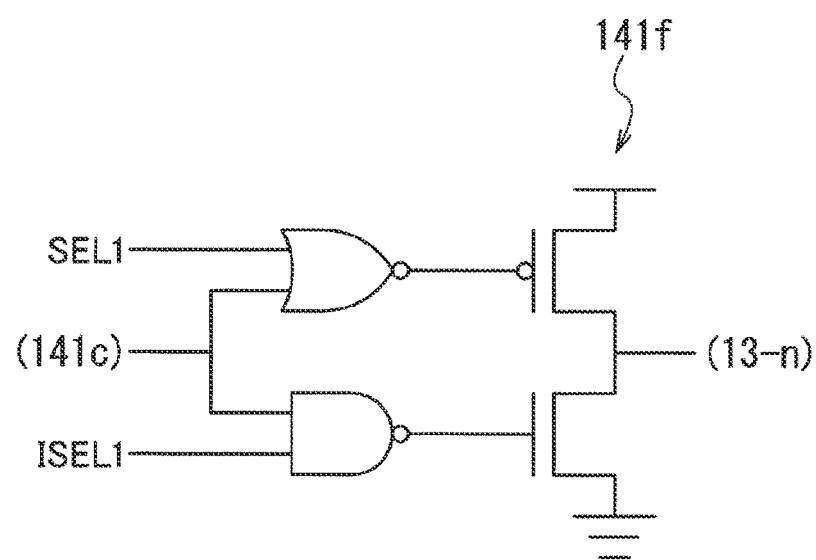
FIG. 14 is a circuit diagram depicting a modification example 2 of the schematic configuration of the variable delay circuit included in the circuit system according to the implementation example 1-3 in the one embodiment of the present disclosure.

A modification example 2 of the variable delay circuit included in the circuit system according to the implementation example 1-2 of the present embodiment is explained by using FIG. 14 with reference to FIG. 1, FIG. 5, and FIG. 12. FIG. 14 is a block diagram depicting main sections of the schematic configuration of the modification example 2 of the variable delay circuit 14-n included in the circuit system 1 according to the present implementation example. While FIG. 14 depicts only the variable delay circuit 14-n connected to the clock gating circuit 13-n (see FIG. 1), the circuit system 1 includes variable delay circuits each of which is connected to one of the clock gating circuits 13-1 to 13-(n−1). The variable delay circuits have configurations identical to that of the variable delay circuit 14-n in the present modification example and are configured to perform functions identical to those of the variable delay circuit 14-n.

Instead of the inverter at the last stage of the inverter circuit 141c provided in the distributing section 14a and the transfer gate 141d provided in the selecting section 14d, the variable delay circuit 14-n in the present modification example includes a tri-state buffer (an example of a second logic circuit) 141f as depicted in FIG. 14. Input terminals (one input terminal of each of an OR gate and a NAND gate) of the tri-state buffer 141f are connected to the output terminal of the inverter circuit 141c (see FIG. 12). Output control terminals (the other input terminal of each of the OR gate and the NAND gate) of the tri-state buffer 141f are connected to the decoder 162 of the selection signal generation circuit 16-n (see FIG. 12) and are configured to receive the selection signals SEL1 and ISEL1 as input.

Although not depicted in the figure, in the present modification example, the inverters at the last stages of the inverter circuits 142c, 143c, and 144c provided in the distributing section 14a and the transfer gates 142d, 143d, and 144d provided in the selecting section 14d similarly include tri-state buffers (an example of second logic circuits).

Output terminals of the tri-state buffer 141f and other tri-state buffers are connected with each other and are connected to the clock gating circuit 13-n (more specifically, the input terminal of the inverter circuit 134b (see FIG. 5)).

Implementation Example 2-1

Figure 15:
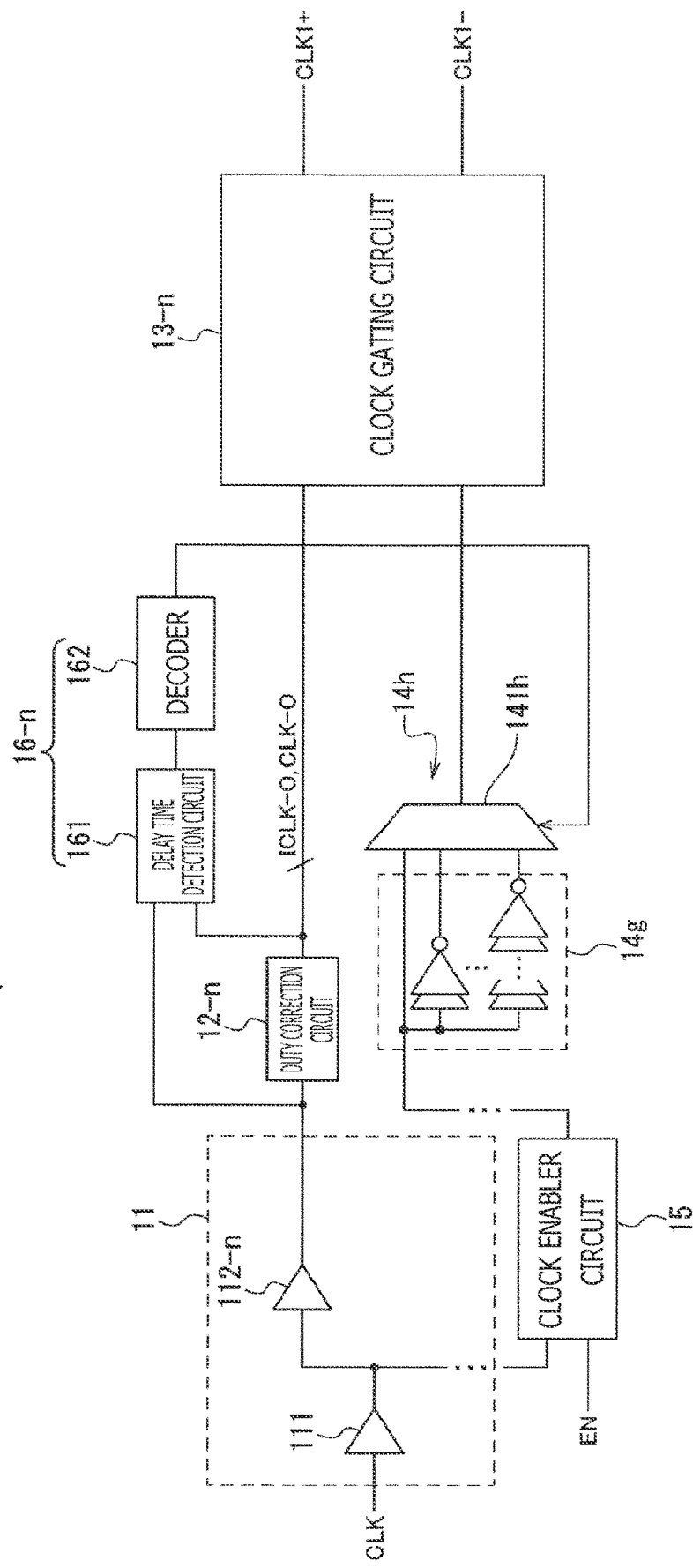
FIG. 15 is a circuit block diagram depicting a schematic configuration example of a variable delay circuit included in the circuit system according to an implementation example 2-1 in the one embodiment of the present disclosure.
Figure 16:
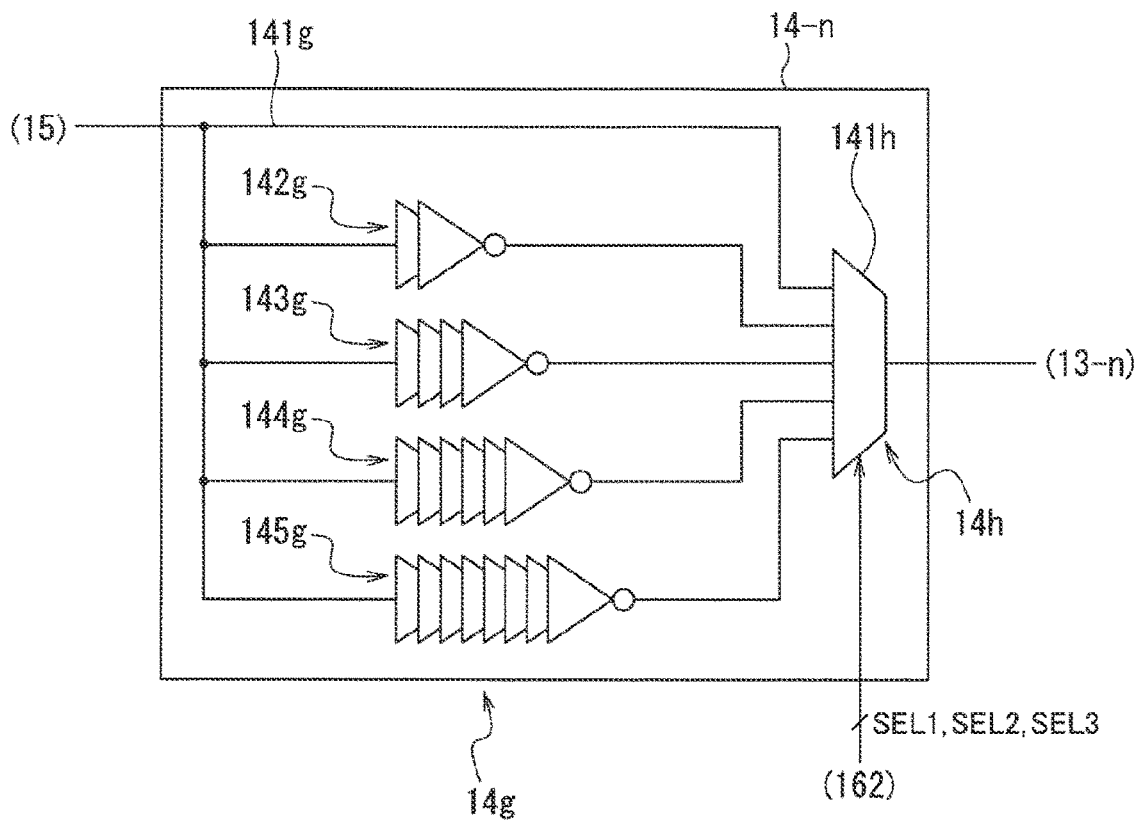
FIG. 16 is a circuit block diagram depicting a specific configuration example of the variable delay circuit included in the circuit system according to the implementation example 2-1 in the one embodiment of the present disclosure.

The circuit system 1 according to an implementation example 2-1 of the present embodiment is explained by using FIG. 15 and FIG. 16 with reference to FIG. 1 and FIG. 5. FIG. 15 is a circuit block diagram depicting a schematic configuration example of the variable delay circuit 14-n included in the circuit system 1 according to the implementation example 2-1 of the present embodiment. The variable delay circuits 14-1 to 14-n in the present embodiment have identical configurations and are configured to perform identical functions. In view of this, the schematic configuration of the variable delay circuits 14-1 to 14-n is explained by using the variable delay circuit 14-n as an example. In order to facilitate understanding, FIG. 15 also depicts the clock gating circuit 13-n, the clock enabler circuit 15, and the selection signal generation circuit 16-n that are connected to the variable delay circuit 14-n, and the clock tree circuit 11. Note that constituent elements in the circuit system 1 according to the respective implementation examples described above can be applied as constituent elements in the present implementation example except the variable delay circuits.

As depicted in FIG. 15, the variable delay circuit 14-n included in the circuit system 1 according to the present implementation example has a distributing section 14g and a selecting section 14h. The distributing section 14g has inverter circuits (an example of first logic circuits) that receive, as input, enable signals EN distributed by the distributing section 14g. The distributing section 14g has a configuration similar to that of the distributing section 14c in the implementation example 1-3 described above. The inverter circuits provided in the distributing section 14g function as delay sections. The inverter circuits include multiple inverters that are connected in series. In addition, each of the inverter circuits includes a different number of inverters depending on which branched path the inverter is arranged. Therefore, the distributing section 14g can make delay times given to enable signals EN different between the branched paths.

The selecting section 14h has a multiplexer circuit 141h that receives multiple enable signals (an example of control signals) EN as input. An input terminal of the multiplexer circuit 141h is connected to an output terminal of the distributing section 14g. An output terminal of the multiplexer circuit 141h is connected to the clock gating circuit 13-n (more specifically, the input terminal of the inverter circuit 134b (see FIG. 5)). A selection signal input terminal of the multiplexer circuit 141h is connected to the decoder 162 provided in the selection signal generation circuit 16-n.

The selection signal generation circuit 16-n is configured to output, to the multiplexer circuit 141h, selection signals SEL1 to SELn with predetermined combinations of polarities on the basis of a delay time at the duty correction circuit 12-n detected by the delay time detection circuit 161.

Next, a specific configuration example of the variable delay circuit 14-n in the present implementation example is explained by using FIG. 16. FIG. 16 is a circuit block diagram depicting a specific configuration example of the variable delay circuit 14-n included in the circuit system 1 according to the present implementation example.

As depicted in FIG. 16, the distributing section 14g provided in the variable delay circuit 14-n in the present implementation example has inverter circuits (an example of first logic circuits) 142g, 143g, 144g, and 145g that receive, as input, enable signals EN distributed by the distributing section 14g. The inverter circuits 142g, 143g, 144g, and 145g function as delay sections. Each of the inverter circuits 142g, 143g, 144g, and 145g includes multiple inverters that are connected in series. The inverter circuit 142g includes two inverters that are connected in series. The inverter circuit 143g includes four inverters that are connected in series. The inverter circuit 144g includes six inverters that are connected in series. The inverter circuit 145g includes eight inverters that are connected in series. Input terminals of the inverter circuits 142g, 143g, 144g, and 145g are connected to the output terminal of the clock enabler circuit 15 (see FIG. 15).

The input terminals of the inverter circuits 142g, 143g, 144g, and 145g are connected with each other. In addition, the input terminal of each of the inverter circuits 142g, 143g, 144g, and 145g is connected to a signal line 141g placed between the output terminal of the clock enabler circuit 15 and one of five input terminals (details are mentioned below) provided in the multiplexer circuit 141h.

The distributing section 15g is configured to distribute enable signals EN to five paths. The five paths include a first path on which the signal line 141g is provided, a second path on which the inverter circuit 142g is provided, a third path on which the inverter circuit 143g is provided, a fourth path on which the inverter circuit 144g is provided, and a fifth path on which the inverter circuit 145g is provided.

The selecting section 14h has the multiplexer circuit 141h. The multiplexer circuit 141h has the five input terminals. The five input terminals of the multiplexer circuit 141h are connected with the first path, the second path, the third path, the fourth path, and the fifth path of the distributing section 14g in a one-to-one relationship. A first terminal in the five input terminals of the multiplexer circuit 141h is connected with the signal line 141g. A second terminal in the five input terminals of the multiplexer circuit 141h is connected with an output terminal of the inverter circuit 142g. A third terminal in the five input terminals of the multiplexer circuit 141h is connected with an output terminal of the inverter circuit 143g. A fourth terminal in the five input terminals of the multiplexer circuit 141h is connected with an output terminal of the inverter circuit 144g. A fifth terminal in the five input terminals of the multiplexer circuit 141h is connected with an output terminal of the inverter circuit 145g.

The output terminal of the multiplexer circuit 141h is connected to the clock gating circuit 13-n (more specifically, the input terminal of the inverter circuit 134b (see FIG. 5)). The multiplexer circuit 141h has three selection signal input terminals. The three selection signal input terminals are connected to the decoder 162 provided in the selection signal generation circuit 16-n.

The selection signal generation circuit 16-n is configured to output, to the multiplexer circuit 141h, selection signals SEL1, SEL2, and SEL3 with predetermined combinations of signal levels on the basis of a delay time at the duty correction circuit 12-n detected by the delay time detection circuit 161.

For example, it is supposed that a delay time detected by the delay time detection circuit 161 is the shortest delay time in multiple delay times (five delay times in the present implementation example) set for the decoder 162. In such a case, the decoder 162 outputs the selection signals SEL1, SEL2, and SEL3 as low-level signals to the multiplexer circuit 141h. Upon reception of the signals as input, the multiplexer circuit 141h selects the first path, for example. Therefore, the variable delay circuit 14-n outputs, to the clock gating circuit 13-n, an enable signal EN which is not given a delay time by an inverter.

For example, it is supposed that a delay time detected by the delay time detection circuit 161 is the second shortest delay time in the multiple delay times (the five delay times in the present implementation example) set for the decoder 162. In such a case, the decoder 162 outputs, to the multiplexer circuit 141h, the selection signal SEL1 as a high-level signal and the selection signals SEL2 and SEL3 as low-level signals. Upon reception of the signals as input, the multiplexer circuit 141h selects the second path, for example. Therefore, the variable delay circuit 14-n outputs, to the clock gating circuit 13-n, an enable signal EN which is output from the inverter circuit 142g and is given a delay time corresponding to the two elements.

For example, it is supposed that a delay time detected by the delay time detection circuit 161 is the third shortest delay time in the multiple delay times (the five delay times in the present implementation example) set for the decoder 162. In such a case, the decoder 162 outputs, to the multiplexer circuit 141h, the selection signal SEL2 as a high-level signal and the selection signals SEL1 and SEL3 as low-level signals. Upon reception of the signals as input, the multiplexer circuit 141h selects the third path, for example. Therefore, the variable delay circuit 14-n outputs, to the clock gating circuit 13-n, an enable signal EN which is output from the inverter circuit 143g and is given a delay time corresponding to the four elements.

For example, it is supposed that a delay time detected by the delay time detection circuit 161 is the fourth shortest delay time in the multiple delay times (the five delay times in the present implementation example) set for the decoder 162. In such a case, the decoder 162 outputs, to the multiplexer circuit 141h, the selection signal SEL3 as a low-level signal and the selection signals SEL1 and SEL2 as high-level signals. Upon reception of the signals as input, the multiplexer circuit 141h selects the fourth path, for example. Therefore, the variable delay circuit 14-n outputs, to the clock gating circuit 13-n, an enable signal EN which is output from the inverter circuit 144g and is given a delay time corresponding to the six elements.

For example, it is supposed that a delay time detected by the delay time detection circuit 161 is the longest delay time in the multiple delay times (the five delay times in the present implementation example) set for the decoder 162. In such a case, the decoder 162 outputs, to the multiplexer circuit 141h, the selection signal SEL3 as a high-level signal and the selection signals SEL1 and SEL2 as low-level signals. Upon reception of the signals as input, the multiplexer circuit 141h selects the fifth path, for example. Therefore, the variable delay circuit 14-n outputs, to the clock gating circuit 13-n, an enable signal EN which is output from the inverter circuit 145g and is given a delay time corresponding to the eight elements.

In such a manner, depending on combinations of the signal levels of the selection signals SEL1, SEL2, and SEL3 input from the selection signal generation circuit 16-n, the variable delay circuit 14-n in the present implementation example can output, to the clock gating circuit 13-n, an enable signal EN which is not given a delay time or is given a delay time at any of the inverter circuits 142g to 145g. In addition, the variable delay circuit 14-n in the present implementation example is capable of switching to many levels (five levels in the present example). If the variable delay circuit 14-n is given a resolution and a calibration function is implemented, adjustment can be made to cope with amounts of delay changes in process variations of the circuit system 1. Therefore, the timing margin of a clock signal CLK increases, and the circuit system 1 can achieve high-speed processing.

Implementation Example 2-2

Figure 17:
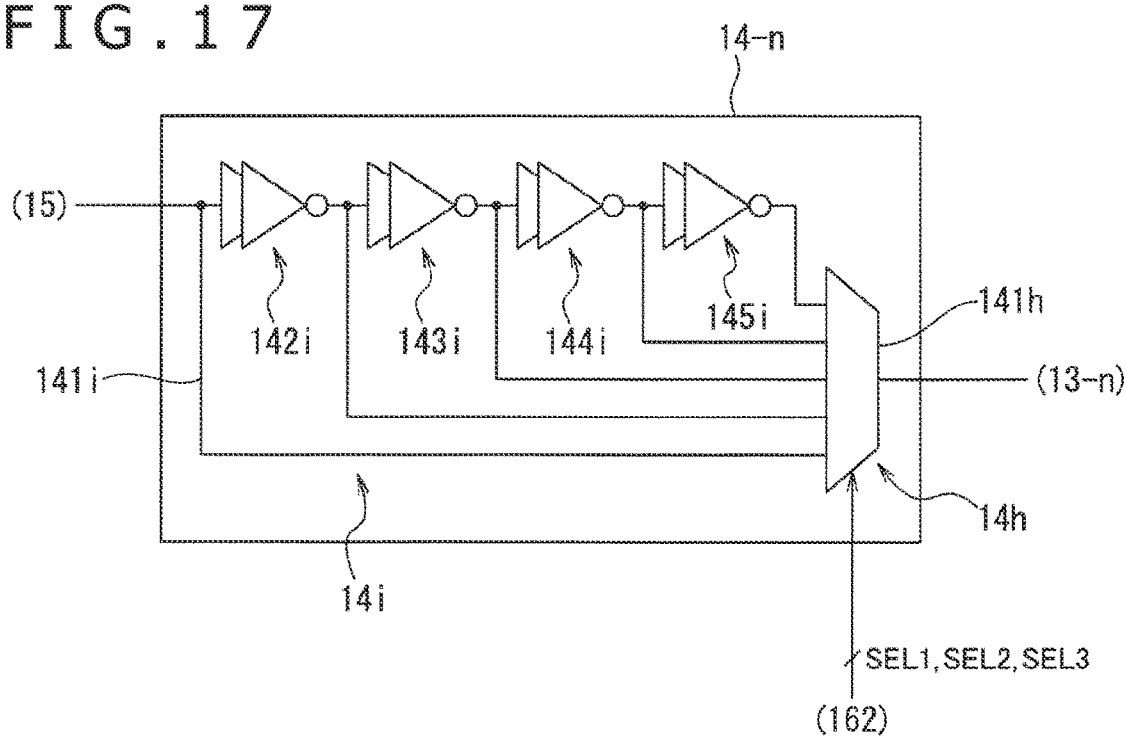
FIG. 17 is a circuit block diagram depicting a schematic configuration example of a variable delay circuit included in the circuit system according to an implementation example 2-2 in the one embodiment of the present disclosure.

The circuit system 1 according to an implementation example 2-2 of the present embodiment is explained by using FIG. 17 with reference to FIG. 1 and FIG. 5. FIG. 17 is a circuit block diagram depicting a schematic configuration example of the variable delay circuit 14-n included in the circuit system 1 according to the implementation example 2-2 of the present embodiment. The variable delay circuits 14-1 to 14-n in the present embodiment have identical configurations and are configured to perform identical functions. In view of this, the schematic configuration of the variable delay circuits 14-1 to 14-n is explained by using the variable delay circuit 14-n as an example. Note that constituent elements in the circuit system 1 according to the respective implementation examples described above can be applied as constituent elements in the present implementation example except the variable delay circuits.

As depicted in FIG. 17, the variable delay circuit 14-n included in the circuit system 1 according to the present implementation example has a distributing section 14i and the selecting section 14h. The distributing section 14i has inverter circuits (an example of first logic circuits) 142i, 143i, 144i, and 145i that receive, as input, enable signals EN distributed by the distributing section 14i. Each of the inverter circuits 142i, 143i, 144i, and 145i includes two inverters that are connected in series, for example. The inverter circuits provided in the distributing section 14i function as delay sections.

The inverter circuit 142i, the inverter circuit 143i, the inverter circuit 144i, and the inverter circuit 145i are connected in series. An input terminal of the inverter circuit 142i is connected to a signal line 141i placed between the output terminal of the clock enabler circuit 15 and a first terminal in five input terminals (details are mentioned below) provided in the multiplexer circuit 141h. An output terminal of the inverter circuit 142i is connected to an input terminal of the inverter circuit 143i. An output terminal of the inverter circuit 143i is connected to an input terminal of the inverter circuit 144i. An output terminal of the inverter circuit 144i is connected to an input terminal of the inverter circuit 145i. An output terminal of the inverter circuit 145i is connected to a fifth terminal in the five input terminals provided in the multiplexer circuit 141h.

The selecting section 14h has the multiplexer circuit 141h that receives multiple enable signals (an example of control signals) EN as input. The multiplexer circuit 141h has the five input terminals. The first terminal in the five input terminals of the multiplexer circuit 141h is connected to the signal line 141i provided in the distributing section 14i. A second terminal in the five input terminals of the multiplexer circuit 141h is connected between the inverter circuit 142i and the inverter circuit 143i (e.g. a connection section between the inverter circuit 142i and the inverter circuit 143i). A third terminal in the five input terminals of the multiplexer circuit 141h is connected between the inverter circuit 143i and the inverter circuit 144i (e.g. a connection section between the inverter circuit 143i and the inverter circuit 144i). A fourth terminal in the five input terminals of the multiplexer circuit 141h is connected between the inverter circuit 144i and the inverter circuit 145i (e.g. a connection section between the inverter circuit 144i and the inverter circuit 145i). A fifth terminal in the five input terminals of the multiplexer circuit 141h is connected to an output terminal of the inverter circuit 145i.

In the circuit system 1 according to the present implementation example, a first path includes a path from the output terminal of the clock enabler circuit 15 to the first terminal of the multiplexer circuit 141h via the signal line 141i. In the circuit system 1 according to the present implementation example, a second path includes a path from the output terminal of the clock enabler circuit 15 to the second terminal of the multiplexer circuit 141h via the inverter circuit 142i. In the circuit system 1 according to the present implementation example, a third path includes a path from the output terminal of the clock enabler circuit 15 to the third terminal of the multiplexer circuit 141h via the inverter circuit 142i and the inverter circuit 143i. In the circuit system 1 according to the present implementation example, a fourth path includes a path from the output terminal of the clock enabler circuit 15 to the fourth terminal of the multiplexer circuit 141h via the inverter circuit 142i, the inverter circuit 143i, and the inverter circuit 144i. In the circuit system 1 according to the present implementation example, a fifth path includes a path from the output terminal of the clock enabler circuit 15 to the fifth terminal of the multiplexer circuit 141$h$ via the inverter circuit 142$i$, the inverter circuit 143$i$, the inverter circuit 144$i$, and the inverter circuit 145$i$.

The distributing section 15$i$ is configured to distribute an enable signal EN to five paths. The five paths include the first path on which the signal line 141$i$ is provided, the second path on which the inverter circuit 142$i$ is provided, the third path on which the inverter circuits 142$i$ and 143$i$ are provided, the fourth path on which the inverter circuits 142$i$, 143$i$, and 144$g$ are provided, and the fifth path on which the inverter circuits 142$i$, 143$i$, 144$g$, and 145$g$ are provided. In addition, the numbers of inverter circuits provided on the first path to the fifth path formed in the variable delay circuit 14-$n$ are different from each other. Therefore, the variable delay circuit 14-$n$ can give enable signals EN delay times that are different among the first path to the fifth path.

The output terminal of the multiplexer circuit 141$h$ is connected to the clock gating circuit 13-$n$ (more specifically, the input terminal of the inverter circuit 134$b$ (see FIG. 5)). The multiplexer circuit 141$h$ has three selection signal input terminals. The three selection signal input terminals are connected to the decoder 162 provided in the selection signal generation circuit 16-$n$.

The selection signal generation circuit 16-$n$ is configured to output, to the multiplexer circuit 141$h$, selection signals SEL1, SEL2, and SEL3 with predetermined combinations of signal levels on the basis of a delay time at the duty correction circuit 12-$n$ detected by the delay time detection circuit 161.

For example, it is supposed that a delay time detected by the delay time detection circuit 161 is the shortest delay time in multiple delay times (five delay times in the present implementation example) set for the decoder 162. In such a case, the decoder 162 outputs the selection signals SEL1, SEL2, and SEL3 as low-level signals to the multiplexer circuit 141$h$. Upon reception of the signals as input, the multiplexer circuit 141$h$ selects the first path, for example. Therefore, the variable delay circuit 14-$n$ outputs, to the clock gating circuit 13-$n$, an enable signal EN which is not given a delay time by an inverter.

For example, it is supposed that a delay time detected by the delay time detection circuit 161 is the second shortest delay time in the multiple delay times (the five delay times in the present implementation example) set for the decoder 162. In such a case, the decoder 162 outputs, to the multiplexer circuit 141$h$, the selection signal SEL1 as a high-level signal and the selection signals SEL2 and SEL3 as low-level signals. Upon reception of the signals as input, the multiplexer circuit 141$h$ selects the second path, for example. Therefore, the variable delay circuit 14-$n$ outputs, to the clock gating circuit 13-$n$, an enable signal EN which is output from the inverter circuit 142$i$ and is given a delay time corresponding to the two elements.

For example, it is supposed that a delay time detected by the delay time detection circuit 161 is the third shortest delay time in the multiple delay times (the five delay times in the present implementation example) set for the decoder 162. In such a case, the decoder 162 outputs, to the multiplexer circuit 141$h$, the selection signal SEL2 as a high-level signal and the selection signals SEL1 and SEL3 as low-level signals. Upon reception of the signals as input, the multiplexer circuit 141$h$ selects the third path, for example. Therefore, the variable delay circuit 14-$n$ outputs, to the clock gating circuit 13-$n$, an enable signal EN which is output from the inverter circuit 143$i$ via the inverter circuit 142$i$ and is given a delay time corresponding to the four elements.

For example, it is supposed that a delay time detected by the delay time detection circuit 161 is the fourth shortest delay time in the multiple delay times (the five delay times in the present implementation example) set for the decoder 162. In such a case, the decoder 162 outputs, to the multiplexer circuit 141$h$, the selection signal SEL3 as a low-level signal and the selection signals SEL1 and SEL2 as high-level signals. Upon reception of the signals as input, the multiplexer circuit 141$h$ selects the fourth path, for example. Therefore, the variable delay circuit 14-$n$ outputs, to the clock gating circuit 13-$n$, an enable signal EN which is output from the inverter circuit 144$i$ via the inverter circuits 142$i$ and 143$i$ and is given a delay time corresponding to the six elements.

For example, it is supposed that a delay time detected by the delay time detection circuit 161 is the longest delay time in the multiple delay times (the five delay times in the present implementation example) set for the decoder 162. In such a case, the decoder 162 outputs, to the multiplexer circuit 141$h$, the selection signal SEL3 as a high-level signal and the selection signals SEL1 and SEL2 as low-level signals. Upon reception of the signals as input, the multiplexer circuit 141$h$ selects the fifth path, for example. Therefore, the variable delay circuit 14-$n$ outputs, to the clock gating circuit 13-$n$, an enable signal EN which is output from the inverter circuit 145$i$ via the inverter circuits 142$i$, 143$i$, and 144$i$ and is given a delay time corresponding to the eight elements.

In such a manner, depending on combinations of the signal levels of the selection signals SEL1, SEL2, and SEL3 input from the selection signal generation circuit 16-$n$, the variable delay circuit 14-$n$ in the present implementation example can output, to the clock gating circuit 13-$n$, an enable signal EN which is not given a delay time or is given a delay time at any of the inverter circuits 142$i$ to 145$i$. In addition, the variable delay circuit 14-$n$ in the present implementation example is capable of switching to many levels (five levels in the present example). If the variable delay circuit 14-$n$ is given a resolution and a calibration function is implemented, adjustment can be made to cope with amounts of delay changes in process variations of the circuit system 1. Therefore, the timing margin of a clock signal CLK increases, and the circuit system 1 can achieve high-speed processing.

Implementation Example 3-1

The circuit system 1 according to an implementation example 3-1 of the present embodiment is explained by using FIG. 18 with reference to FIG. 1, FIG. 2, and FIG. 5. FIG. 18 is a circuit block diagram depicting a schematic configuration example of a variable delay circuit included in the circuit system 1 according to the implementation example 3-1 of the present embodiment. In the present implementation example, variable delay circuits 17-1 to 17-$n$ provided on respective lanes in the clock tree circuit 11 have identical configurations and are configured to perform identical functions. In view of this, the schematic configuration of the variable delay circuits 17-1 to 17-$n$ is explained by using the variable delay circuit 17-$n$ as an example. In order to facilitate understanding, FIG. 18 also depicts the clock gating circuit 13-$n$ and the clock enabler circuit 15 that are connected to the variable delay circuit 17-$n$, and the clock tree circuit 11. Note that constituent elements in the circuit system 1 according to the respective implementation examples described above can be applied as constituent elements in the present implementation example except the variable delay circuits.

As depicted in FIG. 18, the variable delay circuit 17-n in the present implementation example includes a duty correction replica circuit. An input terminal of the duty correction replica circuit (i.e. an input terminal of the variable delay circuit 17-n) is connected to the output terminal of the clock enabler circuit 15. An output terminal of the duty correction replica circuit (i.e. an output terminal of the variable delay circuit 17-n) and an output terminal of an inverter 183 are connected to the clock gating circuit 13-n (more specifically, the input terminal of the inverter circuit 134b (see FIG. 5)).

The duty correction replica circuit has a delay time that is generated depending on a duty error at the duty correction circuit 12-n, and a replica circuit that reproduces the delay time. The duty correction replica circuit has, as the replica circuit that reproduces the delay time at the duty correction circuit 12-n, an inverter circuit having the same configuration as those of the inverter circuits 121P and 121N (see FIG. 2) provided in the duty correction circuit 12-n.

Accordingly, an input terminal of an inverting section provided in the inverter circuit functions as the input terminal of the duty correction replica circuit (i.e. the input terminal of the variable delay circuit 17-n), and an output terminal of the inverting section functions as the output terminal of the duty correction replica circuit (i.e. the output terminal of the variable delay circuit 17-n).

The inverter circuit provided in the duty correction replica circuit receives an enable signal EN as input. As mentioned above, the inverter circuits 121P and 121N can slow the waveform of a signal input externally (can make the signal waveform less steep). Because of this, the inverter circuit provided in the duty correction replica circuit can change a delay time by slowing the signal waveform of an enable signal EN input from the clock enabler circuit 15 (by making the signal waveform less steep).

The variable delay circuit 17-n is configured to receive, as input, control signals that control current amounts of the variable current sources 121bP and 121cP provided in the inverter circuit 121P and the variable current sources 121bN and 121cN provided in the inverter circuit 121N. Because of this, the variable delay circuit 17-n can cause a current whose current amount is the same as those for the variable current sources 121bP and 121cP and the variable current sources 121bN and 121cN, to flow through a variable current source provided in the duty correction replica circuit. Therefore, the variable delay circuit 17-n can reproduce, in the inverter circuit provided in the duty correction replica circuit, the driving states of the inverter circuits 121P and 121N provided in the duty correction circuit 12-n. As a result, the variable delay circuit 17-n can give an enable signal EN a delay time which is the same as a delay time that is generated in the duty correction circuit 12-n.

In such a manner, the variable delay circuit 17-n having the configuration of the duty correction replica circuit has a duty correction replica circuit (an example of a delay path) that can output input enable signals (an example of control signals) EN at different delay times. The duty correction replica circuit has an inverter circuit (an example of the same configuration as a part of the duty correction circuit) with the same configuration as those of the inverter circuits 121P and 121N provided in the duty correction circuit 12-n. Because a delay at the duty correction circuit 12-n can be reproduced in a case that the variable delay circuit 17-n uses a duty correction replica circuit, a selection signal generation circuit and an adjustment by a selection signal generated by the selection signal generation circuit are not required.

Implementation Example 3-2

Figure 19:
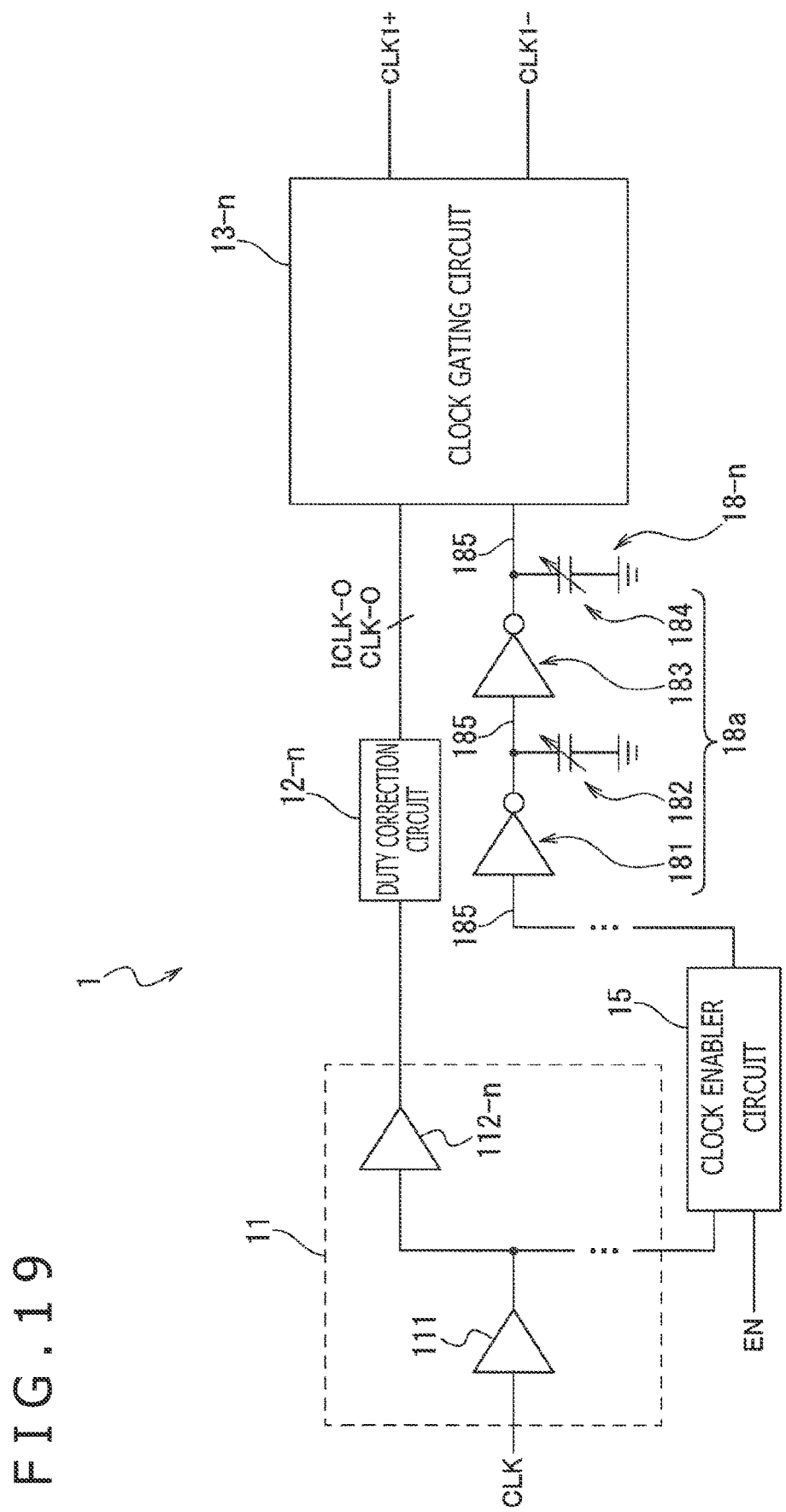
FIG. 19 is a circuit block diagram depicting a schematic configuration example of a variable delay circuit included in the circuit system according to an implementation example 3-2 in the one embodiment of the present disclosure.

The circuit system 1 according to an implementation example 3-2 of the present embodiment is explained by using FIG. 19 with reference to FIG. 1, FIG. 2, FIG. 4, and FIG. 5. FIG. 19 is a circuit block diagram depicting a schematic configuration example of a variable delay circuit 18-n included in the circuit system 1 according to the implementation example 3-2 of the present embodiment. In the present implementation example, variable delay circuits 18-1 to 18-n provided on respective lanes in the clock tree circuit 11 have identical configurations and are configured to perform identical functions. In view of this, the schematic configuration of the variable delay circuits 18-1 to 18-n is explained by using the variable delay circuit 18-n as an example. In order to facilitate understanding, FIG. 19 also depicts the clock gating circuit 13-n and the clock enabler circuit 15 that are connected to the variable delay circuit 18-n, and the clock tree circuit 11. Note that constituent elements in the circuit system 1 according to the respective implementation examples described above can be applied as constituent elements in the present implementation example except the variable delay circuits.

As depicted in FIG. 19, the variable delay circuit 18-n in the present implementation example has a delay path 18a that can output input enable signals (an example of control signals) EN at different delay times. The delay path 18a has variable capacitors (an example of variable capacitance elements) 182 and 184 that are provided between, for example, a ground terminal (an example of a reference-potential supplying section) and a signal line 185 over which enable signals EN are transmitted. In addition, the delay path 18a has an inverter 181 having an input terminal connected to the output terminal of the clock enabler circuit 15 and an output terminal connected to the variable capacitor 182. Further, the delay path 18a has the inverter 183 having an input terminal connected to the output terminal of the inverter 181 and the variable capacitor 182 and an output terminal connected to the variable capacitor 184. An output terminal of the inverter 183 is connected to the clock gating circuit 13-n (more specifically, the input terminal of the inverter circuit 134b (see FIG. 5)).

By switching the capacitances of the variable capacitors 182 and 184, the load capacity generated to the delay path 18a (i.e. the load capacity generated to the signal line 185) can be changed. Therefore, depending on the magnitude of the load capacity generated to the delay path 18a, the delay time of an enable signal EN transmitted to the signal line 185 changes. The larger the load capacity of the delay path 18a is, the longer the delay time of the enable signal EN is. Because of this, the variable delay circuit 18-n in the present implementation example can reproduce a delay time at the duty correction circuit 12-n by changing the capacitances of the variable capacitors 182 and 184 on the basis of a delay time at the duty correction circuit 12-n. The capacitances of the variable capacitors 182 and 184 can be changed by using a selection signal generated by any of the selection signal generation circuits in the respective implementation examples described above, for example.

Implementation Example 3-3

Figure 20:
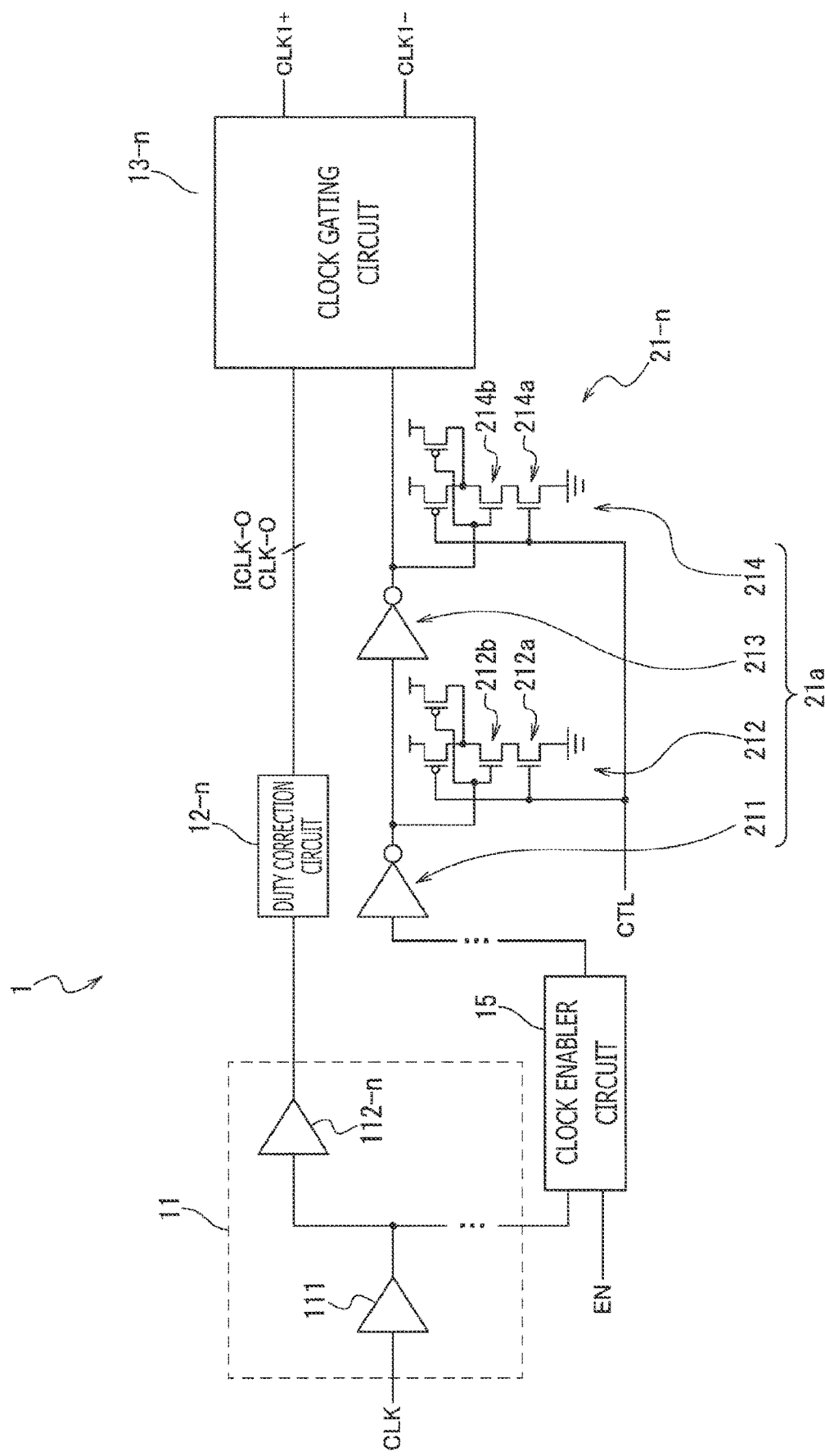
FIG. 20 is a circuit block diagram depicting a schematic configuration example of a variable delay circuit included in the circuit system according to an implementation example 3-3 in the one embodiment of the present disclosure.

The circuit system 1 according to an implementation example 3-3 of the present embodiment is explained by using FIG. 20 with reference to FIG. 5. FIG. 20 is a circuit block diagram depicting a schematic configuration example of a variable delay circuit 21-n included in the circuit system 1 according to the implementation example 3-3 of the present embodiment. In the present implementation example, variable delay circuits 21-1 to 21-n provided on respective lanes in the clock tree circuit 11 have identical configurations and are configured to perform identical functions. In view of this, the schematic configuration of the variable delay circuits 21-1 to 21-n is explained by using the variable delay circuit 21-n as an example. In order to facilitate understanding, FIG. 20 also depicts the clock gating circuit 13-n and the clock enabler circuit 15 that are connected to the variable delay circuit 21-n, and the clock tree circuit 11. Note that constituent elements in the circuit system 1 according to the respective implementation examples described above can be applied as constituent elements in the present implementation example except the variable delay circuits.

As depicted in FIG. 20, the variable delay circuit 21-n in the present implementation example has a delay path 21a that can output input enable signals (an example of control signals) EN at different delay times. The delay path 21a has an inverter 211 connected to the output terminal of the clock enabler circuit 15, and a NAND gate 212 having one input terminal connected with an output terminal of the inverter 211. In addition, the delay path 21a has an inverter 213 having an input terminal connected with an output terminal of the NAND gate 212, and a NAND gate 214 having one input terminal connected with an output terminal of the inverter 213. Because of this, the delay path 21a has the NAND gates 212 and 214 (an example of third logic circuits) that receive enable signals EN as input. The output terminal of the inverter 213 is connected to the clock gating circuit 13-n (more specifically, the input terminal of the inverter circuit 134b (see FIG. 5)).

The one input terminal of the NAND gate 212 is connected to the output terminal of the clock enabler circuit 15 and is configured to receive an enable signal EN as input. The other input terminal of the NAND gate 212 is configured to receive a control signal CTL as input. In addition, the one input terminal of the NAND gate 214 is connected to the output terminal of the clock enabler circuit 15 and is configured to receive an enable signal EN as input. The other input terminal of the NAND gate 214 is configured to receive a control signal CTL as input.

In a case that the control signal CTL is a high-level signal, an N-type transistor 212a included in the NAND gate 212 and an N-type transistor 214a included in the NAND gate 214 are at ON states. Meanwhile, because of this, the N-type transistor 212a and an N-type transistor 212b included in the NAND gate 212 form a channel. Therefore, a gate-channel capacitance of the N-type transistor 212b is generated. Further, because the N-type transistors 212a and 212b operate, a mirror capacitance is generated. Similarly, the N-type transistor 214a and an N-type transistor 214b included in the NAND gate 214 form a channel. Therefore, a gate-channel capacitance of the N-type transistor 214b is generated. Further, because the N-type transistors 214a and 214b operate, a mirror capacitance is generated. In such a manner, when the control signal CTL is a high-level signal, the capacitance of the delay path 21a changes.

On the other hand, in a case that the control signal CTL is a low-level signal, the N-type transistor 212a included in the NAND gate 212 and the N-type transistor 214a included in the NAND gate 214 are at OFF states. Because of this, the N-type transistor 212a and the N-type transistor 212b included in the NAND gate 212 do not form a channel. Therefore, a gate-channel capacitance of the N-type transistor 212b is not generated. Further, because the N-type transistors 212a and 212b do not operate, a mirror capacitance is not generated. Similarly, the N-type transistor 214a and the N-type transistor 214b included in the NAND gate 214 do not form a channel. Therefore, a gate-channel capacitance of the N-type transistor 214b is not generated. Further, because the N-type transistors 214a and 214b do not operate, a mirror capacitance is not generated. In such a manner, when the control signal CTL is a low-level signal, the capacitance of the delay path 21a does not change.

Because different transistors are at ON states depending on the signal level of a control signal CTL, the mirror capacitance and the gate-channel capacitance on the delay path 21a change. Because the capacitance of the delay path 21a thus changes, the delay time of an enable signal EN transmitted to the delay path 21a changes. The larger the capacitance of the delay path 21a is, the longer the delay time of the enable signal EN is.

Because of this, the variable delay circuit 21-n in the present implementation example can reproduce a delay time at the duty correction circuit 12-n by controlling the NAND gate 211 on the basis of a delay time at the duty correction circuit 12-n. In addition, the variable delay circuit 21-n in the present implementation example is configured to receive, as input at the NAND gate 212 and the NAND gate 214, a common control signal CTL. However, by being configured to receive different control signals CTL as input at the NAND gate 212 and the NAND gate 214, the variable delay circuit 21-n can control delay times of enable signals EN stepwise. In addition, by increasing sets of NAND gates and inverters provided on the delay path 21a and by being configured to receive, as input, a control signal CTL which is different for each set, it is possible to reproduce delay times at the duty correction circuit 12-n at many levels highly precisely. As control signals CLT that control the NAND gates 212 and 214, selection signals generated by any of the selection signal generation circuits in the respective implementation examples described above can be used, for example.

Implementation Example 3-4

Figure 21:
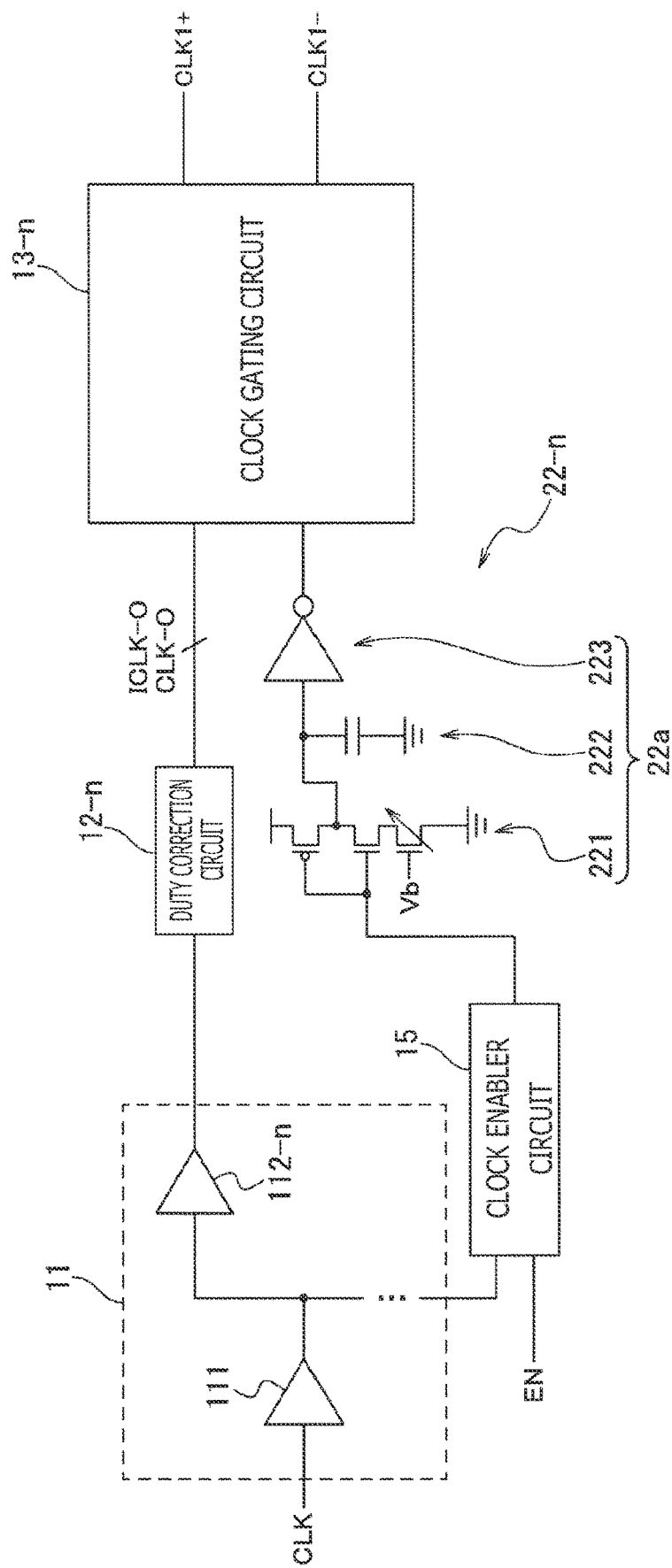
FIG. 21 is a circuit block diagram depicting a schematic configuration example of a variable delay circuit included in the circuit system according to an implementation example 3-4 in the one embodiment of the present disclosure.

The circuit system 1 according to an implementation example 3-4 of the present embodiment is explained by using FIG. 21 with reference to FIG. 5. FIG. 21 is a circuit block diagram depicting a schematic configuration example of a variable delay circuit 22-n included in the circuit system 1 according to the implementation example 3-4 of the present embodiment. In the present implementation example, variable delay circuits 22-1 to 22-n provided on respective lanes in the clock tree circuit 11 have identical configurations and are configured to perform identical functions. In view of this, the schematic configuration of the variable delay circuits 22-1 to 22-n is explained by using the variable delay circuit 22-n as an example. In order to facilitate understanding, FIG. 21 also depicts the clock gating circuit 13-n and the clock enabler circuit 15 that are connected to the variable delay circuit 22-n, and the clock tree circuit 11. Note that constituent elements in the circuit system 1 according to the respective implementation examples described above can be applied as constituent elements in the present implementation example except the variable delay circuits.

As depicted in FIG. 21, the variable delay circuit 22-n in the present implementation example has a delay path 22a that can output input enable signals (an example of control signals) EN at different delay times. The delay path 22a has a capacitor 222 and a current mirror circuit (an example of a variable current source) 221 connected to the capacitor 222. More specifically, the delay path 22a has the current mirror circuit 221 connected to the clock enabler circuit 15, the capacitor 222 connected to the current mirror circuit 221, and an inverter 223 connected to the capacitor. An output terminal of the inverter 223 is connected to the clock gating circuit 13-n (more specifically, the input terminal of the inverter circuit 134b (see FIG. 5)).

The variable delay circuit 22-n can generate a delay of an enable signal EN input from the clock enabler circuit 15, by causing the current mirror circuit 221 to discharge electric charge from the capacitor 222 charged to a high level. The variable delay circuit 22-n can adjust the amount of a current which is to flow through the current mirror circuit 221, by changing a gate voltage (i.e. a bias voltage Vb) input to the gate of an N-type transistor arranged on the ground side. Therefore, the variable delay circuit 22-n can change the degree of discharge of electric charge charged in the capacitor 222, to adjust the delay time of the enable signal EN. The amount of a current which is to flow through the current mirror circuit 221 (i.e. a voltage value of the bias voltage Vb) can be decided on the basis of a selection signal generated by any of the selection signal generation circuits in the respective implementation examples described above, for example.

The variable delay circuit 22-n in the present implementation example is configured to generate a delay of an enable signal EN according to the amount of a current which is to flow through the current mirror circuit 221. However, the variable delay circuit 22-n may have a variable capacitor instead of the capacitor 222, and may be configured to adjust the capacitance of the variable capacitor to generate a delay of an enable signal EN. Further, the variable delay circuit 22-n may adjust the amount of a current which is to flow through the current mirror circuit 221, and the capacitance of the variable capacitor to generate a delay of an enable signal EN.

Because the amount of a current which is to flow through the current mirror circuit 221 can be adjusted in an analog manner, the variable delay circuit 22-n can perform functions similar to those of the duty correction replica circuit of the variable delay circuit 17-n in the implementation example 3-1 described above. In addition, the variable delay circuit 22-n can correct a delay difference due to process variations.

Implementation Example 4

The circuit system 1 according to an implementation example 4 of the present embodiment is explained by using FIG. 22 with reference to FIG. 5. FIG. 22 is a circuit block diagram depicting a schematic configuration example of a clock gating circuit 23-n included in the circuit system 1 according to the implementation example 4 of the present embodiment. In the present implementation example, clock gating circuits 23-1 to 23-n provided on respective lanes in the clock tree circuit 11 have identical configurations and are configured to perform identical functions. In view of this, the schematic configuration of the clock gating circuits 23-1 to 23-n is explained by using the clock gating circuit 23-n as an example. In order to facilitate understanding, FIG. 22 also depicts the duty correction circuit 12-n, the variable delay circuit 14-n, and the clock enabler circuit 15 that are connected to the clock gating circuit 23-n, and the clock tree circuit 11. Note that constituent elements in the circuit system 1 according to the respective implementation examples described above can be applied as constituent elements in the present implementation example except the variable delay circuits.

As depicted in FIG. 22, the clock gating circuit 23-n has a flip-flop circuit 231 having a clock input terminal electrically connected to an output terminal of the duty correction circuit 12-n and an input terminal electrically connected to an output terminal of the variable delay circuit 14-n. The flip-flop circuit 231 includes a D flip-flop circuit, for example. In addition, the clock gating circuit 23-n has an AND gate (an example of a fourth logic circuit) 232 having a first input terminal electrically connected to the output terminal of the duty correction circuit 12-n and a second input terminal electrically connected to an output terminal of the flip-flop circuit 231. While the clock gating circuit 23-n in the present implementation example has the AND gate 232, it may have an OR gate, an ExOR gate, a NAND gate, a NOR gate, or an ExNOR instead of the AND gate 232 on the premise that this does not cause a contradiction with the overall logic of the circuit system 1. That is, the AND gate, the OR gate, the ExOR gate, the NAND gate, the NOR gate, or the ExNOR corresponds to an example of the fourth logic circuit.

As depicted in FIG. 22, the clock gating circuit 23-n outputs not a differential clock signal but a single ended clock signal CLKn. That is, the circuit system 1 according to the present implementation example is a system that transfers single-ended clock signals. Because of this, although not depicted in the figure, the duty correction circuit 12-n in the present implementation example does not have a single-differential converting section 120 and a configuration for outputting a clock signal ICLK-O.

An output terminal of the AND gate 232 functions as an output terminal of the clock gating circuit 23-n. The clock gating circuit 23-n is configured to control the timing of starting output of a clock signal CLKn by means of an enable signal EN output from the flip-flop circuit 231.

Advantages of Present Embodiment

Figure 23:
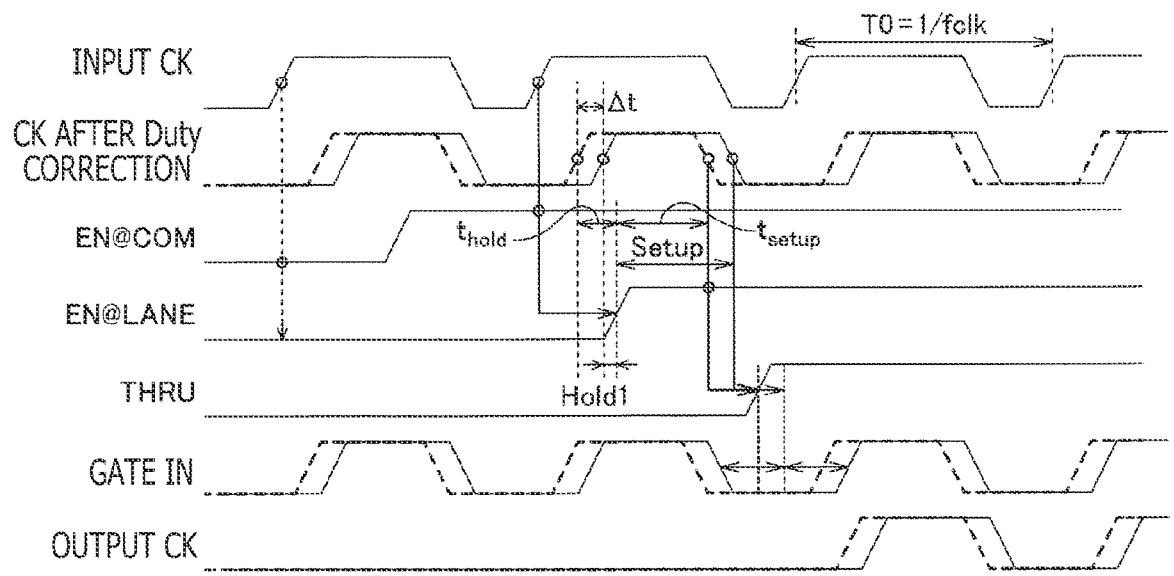
FIG. 23 is a figure (No. 1) for explaining advantages of the circuit system according to the one embodiment of the present disclosure.
Figure 24:
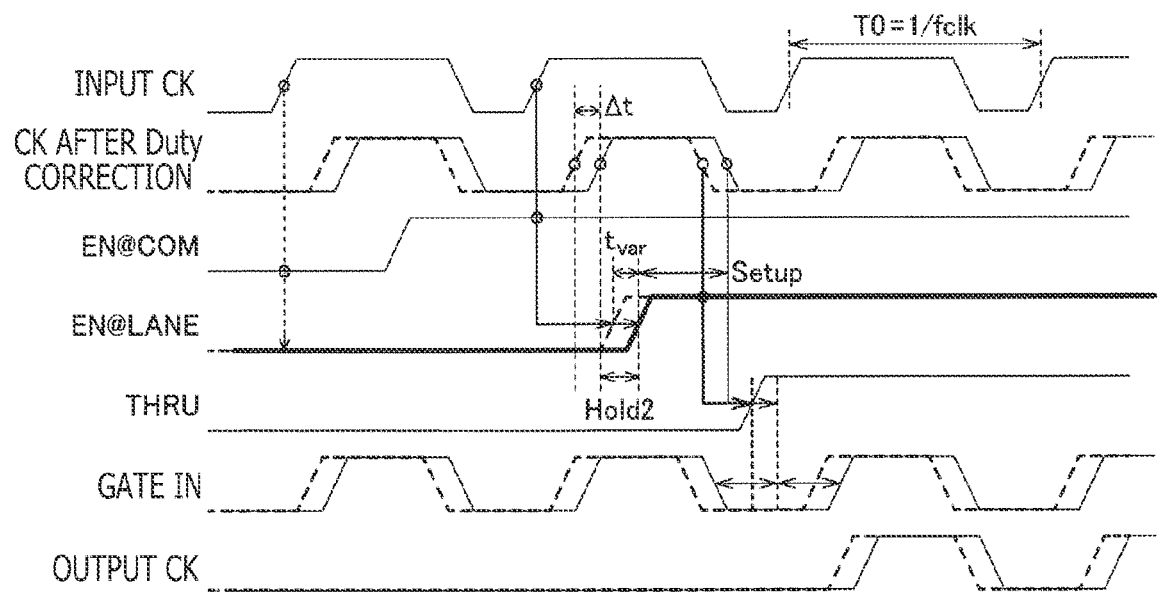
FIG. 24 is a figure (No. 2) for explaining advantages of the circuit system according to the one embodiment of the present disclosure.

Advantages of the circuit system according to the present embodiment are explained by using FIG. 23 to FIG. 28. First, effectiveness of the variable delay circuits is explained by using FIG. 23 and FIG. 24. FIG. 23 and FIG. 24 depict timing charts of clock signals and enable signals for explaining effectiveness of the variable delay circuits. In FIG. 23 and FIG. 24 and FIG. 25 to FIG. 28 mentioned below, "Input CK" represents clock signals input to the clock tree circuit 11, and "CK after Duty correction" represents clock signals output from the duty correction circuits. In FIG. 23 to FIG. 28, "EN@COM" represents enable signals input to the clock enabler circuit, and "EN@LANE" represents enable signals output from the clock enabler circuit. "THRU" depicted in FIG. 23 to FIG. 28 represents enable signals output from the flip-flop circuits provided in the clock gating circuits. "Gate IN" depicted in FIG. 23 to FIG. 28 represents clock signals input to the clocked inverters (or NAND gates) provided in the clock gating circuits. "Output CK" depicted in FIG. 23 to FIG. 28 represents clock signals output from the clock gating circuits.

As depicted in FIG. 23, the hold margin of a clock signal in a case that the duty ratio of the clock signal is 50% is defined as "thold." In a case that the duty ratio of the clock signal is higher than 50%, a delay at a duty correction circuit increases by Δt, for example. Because of this, as depicted in FIG. 23, the hold margin of the clock signal is "Hold1" and can be represented by the following Formula (1).

$$\text{Hold1} = t\text{hold} - \Delta t \quad (1)$$

Accordingly, the hold margin Hold1 of the clock signal decreases by a delay Δt at the duty correction circuit, as represented by the Formula (1), when the duty ratio of the clock signal becomes higher than 50%.

Here, if the hold margin in a case that an enable signal is delayed by time "tvar" by using a variable delay circuit is defined as "Hold2," it can be represented by the following Formula (2).

$$\text{Hold2} = t\text{hold} - \Delta t + t\text{var} \quad (2)$$

As depicted in FIG. 24, by delaying the enable signal by the time tvar by using the variable delay circuit, the hold margin Hold of the clock signal is recovered by the time tvar (see Formula (2)). In particular, by making the time tvar equal to the delay Δt at the duty correction circuit, the hold margin Hold2 is recovered to be equivalent to the hold margin thold in a state that the duty ratio of the clock signal is 50%.

Although a figure is omitted, in a case that the duty ratio of a clock signal is lower than 50, a delay at the duty correction circuit decreases. In such a case, the variable delay circuit reduces the time tvar by which the enable signal is delayed. Therefore, the setup margin of the enable signal is recovered. While the duty ratio of a clock signal is mentioned by using FIG. 23 and FIG. 24, similar principles also apply to process variations, and by reproducing, in an enable signal, a delay equivalent to a delay of the clock signal, timing restrictions of the clock signal are eased. Thus, it becomes possible to speed up the circuit system 1.

Next, data-rate-based delay switching is explained by using FIG. 25 to FIG. 28.

Figure 25:
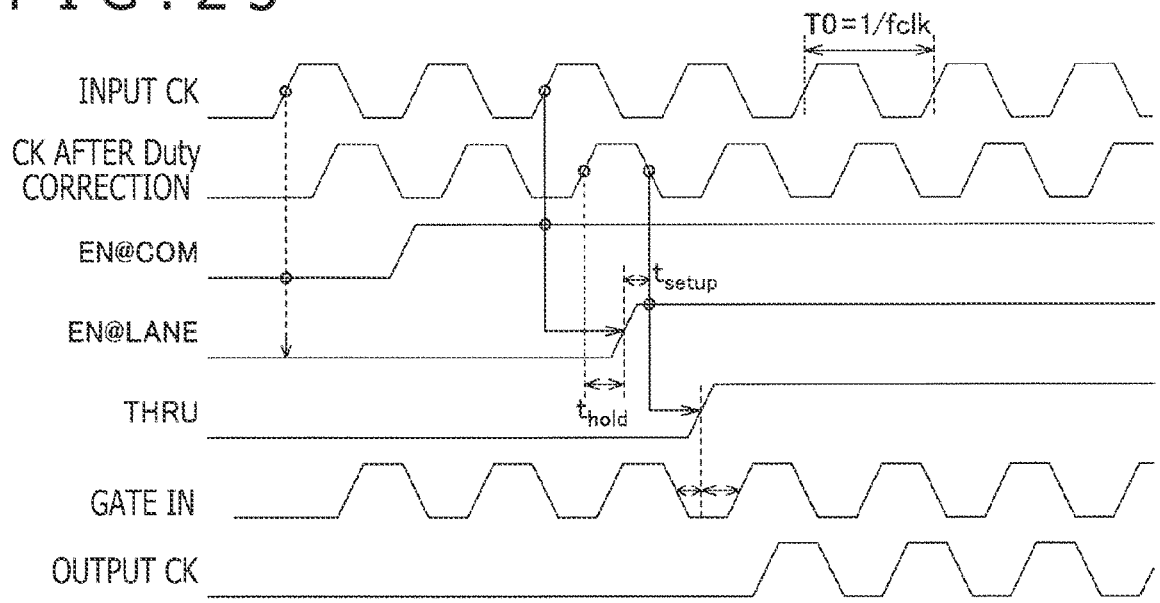
FIG. 25 is a figure (No. 3) for explaining advantages of the circuit system according to the one embodiment of the present disclosure.
Figure 26:
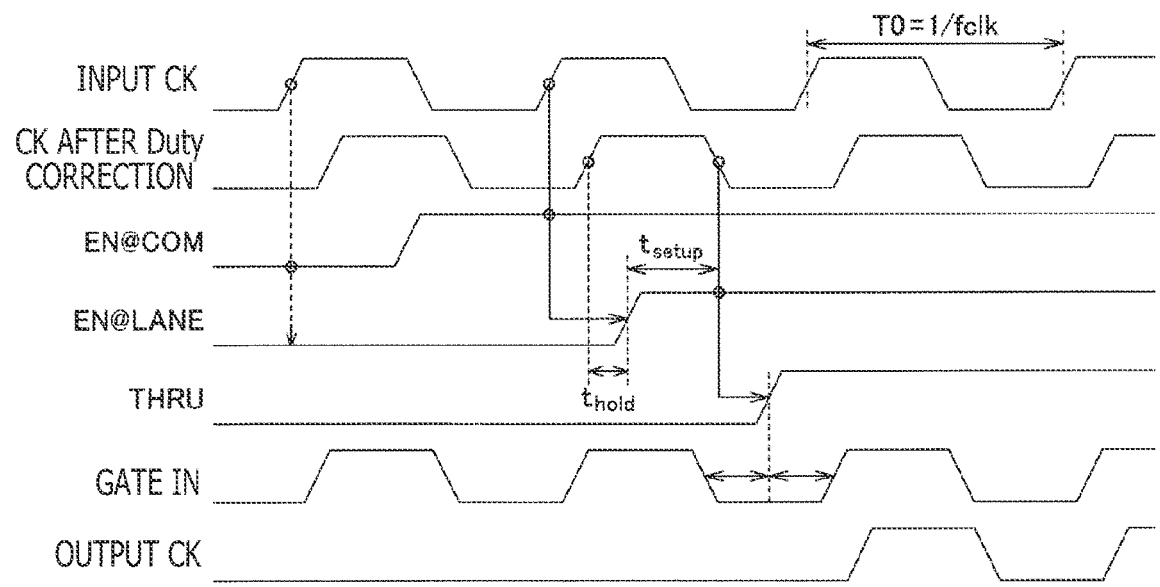
FIG. 26 is a figure (No. 4) for explaining advantages of the circuit system according to the one embodiment of the present disclosure.

As depicted in FIG. 25, in a case that a clock signal is a high frequency signal, the setup margin tsetup in an enable signal is small. On the other hand, as depicted in FIG. 26, in a case that a clock signal is a low-frequency signal, the setup margin tsetup in an enable signal is large.

If it is defined that the cycle of a clock signal is T0, that a delay at a duty correction circuit is $T_{d,ck}$, and that a delay from the time when a low-level clock signal input to a flip-flop circuit provided in a clock gating circuit turns into a high-level clock signal to the time when the DFF outputs the high-level signal is $T_{d,en}$, the setup margin $t_{setup,high}$ in a case that the clock signal is a high-frequency signal can be represented by the following Formula (3). Note that the duty ratio of the clock signal is 50%.

$$t_{setup,high} = (T0/2) + t_{d,ck} - t_{d,en} \quad (3)$$

In a case that the frequency of the clock signal becomes half, the cycle of the clock signal doubles. Even if the frequency of the clock signal becomes half, a delay at the duty correction circuit does not change. Because of this, the setup margin $t_{setup,low}$ in a case that the clock signal is a low-frequency signal can be represented by the following Formula (4). Note that the Formula (4) represents the setup margin $t_{setup,low}$ in a case that the frequency has become half relative to that of the clock signal in the Formula (3), and the duty ratio of the clock signal is 50%.

$$t_{setup,high} = (T0/2) \times 2 + t_{d,ck} - t_{d,en} = t_{setup,high} + (T0/2) \quad (4)$$

As represented by the Formula (4), if the frequency of the clock signal becomes half, the setup margin increases by an increase of the cycle of the clock signal. The hold margin depends only on the delay of the clock signal, but does not depend on the frequency of the clock signal. It should be noted, however, that the absolute value of a duty error tends to increase at the time when the clock signal is at a low speed. Because of this, there is a possibility that the hold margin becomes a problem when the clock signal is a low-frequency signal, even if it does not become a problem in a case that the clock signal is a high-frequency signal.

Figure 27:
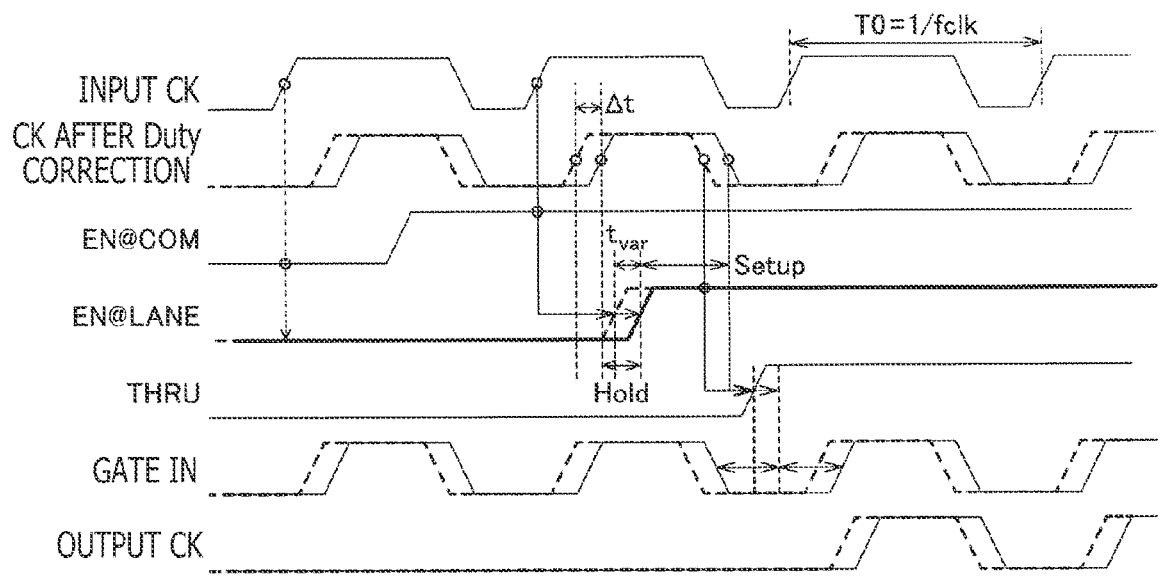
FIG. 27 is a figure (No. 5) for explaining advantages of the circuit system according to the one embodiment of the present disclosure.
Figure 28:
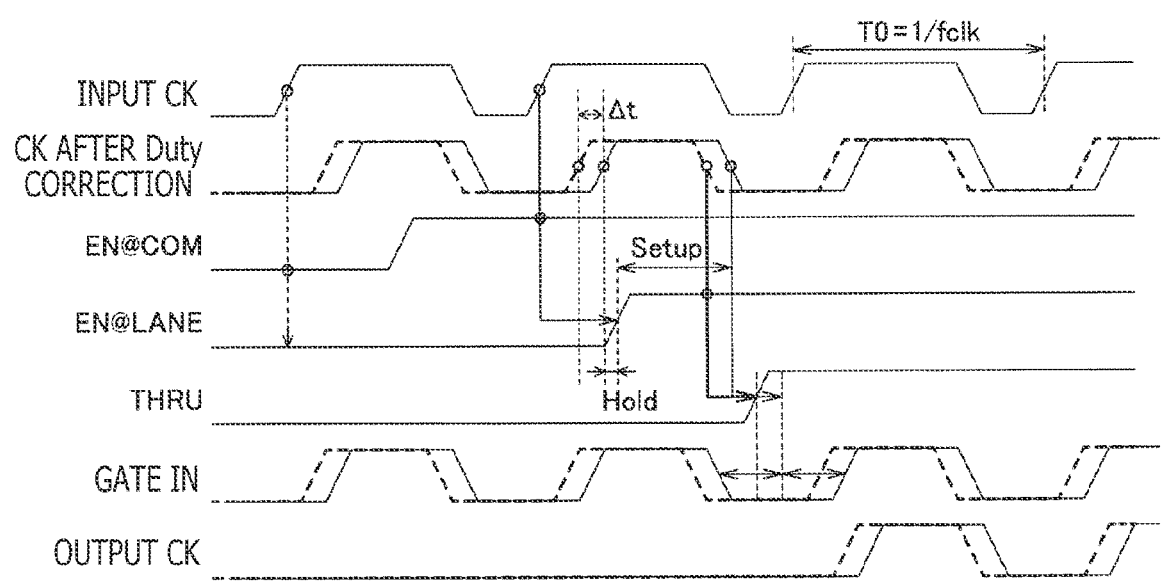
FIG. 28 is a figure (No. 6) for explaining advantages of the circuit system according to the one embodiment of the present disclosure.

As depicted in FIG. 27, it is supposed that, in a case that a clock signal is a low-frequency (low-speed mode) signal with a duty ratio higher than 50%, the hold margin Hold in an enable signal is small, and a sufficient setup margin Setup is ensured. In a case that a clock signal is a low-frequency (low-speed mode) signal, as depicted in FIG. 28, it becomes possible to sufficiently ensure both the hold margin Hold and the setup margin Setup in the enable signal by uniformly increasing a delay of the enable signal. The method of uniformly increasing a delay of the enable signal is easier in terms of control than calibration.

As explained above, the circuit system according to the present embodiment can start outputting a clock signal in each lane of the clock tree circuit in a predetermined period (e.g. one cycle of a clock signal). Therefore, the circuit system according to the present embodiment makes it possible to speed up an interface with a circuit connected downstream. The circuit system according to the present embodiment can solve a problem related to proper simultaneous operation of both duty correction circuits and clock gating circuits, the problem being an obstacle when a half-rate architecture necessary for speeding up an interface with an external circuit is adopted, and can make it possible to speed up the interface.

In such a manner, the circuit system according to the present embodiment can be applied to applications that use a clock tree circuit, such as an image sensor and a display port.

While the present disclosure has been explained thus far by mentioning the premise technologies, the embodiment, and the modification examples thereof, the present disclosure is not limited to the embodiment described above and the like, and a variety of modifications can be made thereto. Note that advantages described in the present specification are presented merely for illustrative purposes. Advantages of the present disclosure are not limited to the advantages described in the present specification. The present disclosure may provide advantages other than the advantages described in the present specification.

In addition, for example, the present disclosure can adopt the following configurations.

(1)

A circuit system including:

a clock tree circuit that has multiple lanes to which a clock signal is distributed;

a duty correction circuit that is provided on each of the multiple lanes and corrects a duty ratio of the clock signal;

a clock gating circuit group having a clock gating circuit that is provided on each of the multiple lanes and receives, as input, the clock signal from the duty correction circuit, the clock gating circuit group starting output of the clock signal from each of a plurality of the clock gating circuits in a predetermined period; and a variable delay circuit that is provided in association with each of a plurality of the duty correction circuits and is capable of changing a delay time of a control signal that controls a timing of starting output of the clock signal from the clock gating circuit.

(2)
The circuit system according to (1), in which the variable delay circuit includes
a distributing section that distributes the input control signal, and
a selecting section that selects any one of a plurality of the control signals distributed by the distributing section, the control signals having different delay times.

(3)
The circuit system according to (2), in which the distributing section has a first logic circuit that receives, as input, the control signal distributed by the distributing section.

(4)
The circuit system according to (2) or (3), in which the selecting section has a second logic circuit that receives, as input, the control signal distributed by the distributing section.

(5)
The circuit system according to (2) or (3), in which the selecting section has a multiplexer circuit that receives a plurality of the control signals as input.

(6)
The circuit system according to any one of (2) to (5), further including:
a selection signal generating section that generates a selection signal for selecting any one of a plurality of the control signals, on the basis of at least the clock signal input to the duty correction circuit.

(7)
The circuit system according to (6), in which the selection signal generating section generates the selection signal that differs according to a data rate of the clock signal input to the duty correction circuit.

(8)
The circuit system according to (6), in which the selection signal generating section generates the selection signal on the basis of a delay time at the duty correction circuit or a duty error at the duty correction circuit.

(9)
The circuit system according to (6), in which the selection signal generating section generates the selection signal on the basis of the clock signal output from the clock tree circuit and a predetermined signal input from an external circuit.

(10)
The circuit system according to (1), in which the variable delay circuit has a delay path that is capable of outputting the input control signal at a different delay time.

(11)
The circuit system according to (10), in which the delay path has the same configuration as a part of the duty correction circuit.

(12)
The circuit system according to (10), in which the delay path has a variable capacitance element that is provided between a signal line over which the control signal is transmitted and a reference-potential supplying section.

(13)
The circuit system according to (10), in which the delay path has a capacitor and a variable current source connected to the capacitor.

(14)
The circuit system according to (10), in which the delay path has a third logic circuit that receives the control signal as input.

(15)
The circuit system according to any one of (1) to (14), in which the duty correction circuit has an inverter circuit whose drive capacity is changed on the basis of the duty ratio of the clock signal.

(16)
The circuit system according to any one of (1) to (15), in which the duty correction circuit has a low-pass filter that receives the clock signal as input.

(17)
The circuit system according to any one of (1) to (16), in which
the clock gating circuit includes
a flip-flop circuit that has a clock input terminal electrically connected to an output terminal of the duty correction circuit and an input terminal electrically connected to an output terminal of the variable delay circuit, and
a fourth logic circuit that has a first input terminal electrically connected to the output terminal of the duty correction circuit and a second input terminal electrically connected to an output terminal of the flip-flop circuit.

(18)
The circuit system according to (17), in which the fourth logic circuit includes a clocked inverter or a transfer gate.

(19)
The circuit system according to (17), in which the fourth logic circuit includes an AND gate, an OR gate, an ExOR gate, a NAND gate, a NOR gate, or an ExNOR.

(20)
The circuit system according to any one of (1) to (19), in which the predetermined period is equal to one cycle of the clock signal.

Those skilled in the art will understand that a variety of corrections, combinations, sub-combinations, and modifications can be conceived of according to requirements in terms of designs and other factors, and that they are included in the scope of the attached claims and equivalents of the claims.

REFERENCE SIGNS LIST

1: Circuit system
11: Clock tree circuit
12-1, 12-2, 12-$n$, 12$a$-$n$, 12$b$-$n$: Duty correction circuit
12$a$: Single-differential converting section
12$b$: Duty adjusting section
13, 13-1, 13-2, 13-$n$, 23-1, 23-$n$: Clock gating circuit
14-1, 14-2, 14-$n$, 17-1, 17-$n$, 18-1, 18-$n$, 21-1, 21-$n$, 22-1, 22-$n$: Variable delay circuit
14$a$, 14$b$, 14$g$, 14$i$, 15$g$, 15$i$: Distributing section
14$b$, 14$d$, 14$h$: Selecting section
14$z$: Delay section
15: Clock enabler circuit
16-1, 16$a$-$n$, 16$b$-$n$, 16-$n$: Selection signal generation circuit
18$a$, 21$a$, 22$a$: Delay path
111, 112-1, 112-2, 112-$n$: Buffer
113-1, 113-2, 113-$n$: Lane
120: Single-differential converting section
121$a$N, 121$a$P: Inverting section
121$b$N, 121$b$P, 121$c$N, 121$c$P: Variable current source
121N, 121P, 123N, 134$b$, 141$a$, 141$c$, 142$c$, 142$g$, 122N, 122P, 123N, 123P, 126, 127, 131N, 131P, 133N, 133P, 134$c$, 181, 183, 211, 213, 223: Inverter
142$i$, 143$c$, 143$g$, 143$i$, 144$c$, 144$g$, 144$i$, 145$g$, 145$i$: Inverter circuit 124N, 124P, 163: Low-pass filter
125N, 125P: Amplifier
129a: Time-to-digital conversion circuit (TDC)
129b: Logic circuit
132N, 132P, 141e: Clocked inverter
134a: Flip-flop circuit
141b, 142b, 143b, 144b, 145b, 146b, 147b, 148b, 149b, 212, 214: NAND gate
141d, 142d, 143d, 144d: Transfer gate
141f: Tri-state buffer
141g, 141i, 185: Signal line
141h: Multiplexer circuit
161: Delay time detection circuit
162, 165: Decoder
164: Analog-to-digital converter (ADC)
182, 184: Variable capacitor
221: Current mirror circuit
222, C+, C−: Capacitor
231: Flip-flop circuit
232: AND gate
R+, R−: Resistor

The invention claimed is:

1. A circuit system comprising:
a clock tree circuit that has multiple lanes to which a clock signal is distributed;
a duty correction circuit that is provided on each of the multiple lanes and corrects a duty ratio of the clock signal;
a clock gating circuit group having a clock gating circuit that is provided on each of the multiple lanes and receives, as input, the clock signal from the duty correction circuit, the clock gating circuit group starting output of the clock signal from each of a plurality of the clock gating circuits in a predetermined period; and
a variable delay circuit that is provided in association with each of a plurality of the duty correction circuits and is capable of changing a delay time of a control signal that controls a timing of starting output of the clock signal from the clock gating circuit.

2. The circuit system according to claim 1, wherein the variable delay circuit includes
a distributing section that distributes the input control signal, and
a selecting section that selects any one of a plurality of the control signals distributed by the distributing section, the control signals having different delay times.

3. The circuit system according to claim 2, wherein the distributing section has a first logic circuit that receives, as input, the control signal distributed by the distributing section.

4. The circuit system according to claim 2, wherein the selecting section has a second logic circuit that receives, as input, the control signal distributed by the distributing section.

5. The circuit system according to claim 2, wherein the selecting section has a multiplexer circuit that receives a plurality of the control signals as input.

6. The circuit system according to claim 2, further comprising:
a selection signal generating section that generates a selection signal for selecting any one of a plurality of the control signals, on a basis of at least the clock signal input to the duty correction circuit.

7. The circuit system according to claim 6, wherein the selection signal generating section generates the selection signal that differs according to a data rate of the clock signal input to the duty correction circuit.

8. The circuit system according to claim 6, wherein the selection signal generating section generates the selection signal on a basis of a delay time at the duty correction circuit or a duty error at the duty correction circuit.

9. The circuit system according to claim 6, wherein the selection signal generating section generates the selection signal on a basis of the clock signal output from the clock tree circuit and a predetermined signal input from an external circuit.

10. The circuit system according to claim 1, wherein the variable delay circuit has a delay path that is capable of outputting the input control signal at a different delay time.

11. The circuit system according to claim 10, wherein the delay path has a same configuration as a part of the duty correction circuit.

12. The circuit system according to claim 10, wherein the delay path has a variable capacitance element that is provided between a signal line over which the control signal is transmitted and a reference-potential supplying section.

13. The circuit system according to claim 10, wherein the delay path has a capacitor and a variable current source connected to the capacitor.

14. The circuit system according to claim 10, wherein the delay path has a third logic circuit that receives the control signal as input.

15. The circuit system according to claim 1, wherein the duty correction circuit has an inverter circuit whose drive capacity is changed on a basis of the duty ratio of the clock signal.

16. The circuit system according to claim 1, wherein the duty correction circuit has a low-pass filter that receives the clock signal as input.

17. The circuit system according to claim 1, wherein
the clock gating circuit includes
a flip-flop circuit that has a clock input terminal electrically connected to an output terminal of the duty correction circuit and an input terminal electrically connected to an output terminal of the variable delay circuit, and
a fourth logic circuit that has a first input terminal electrically connected to the output terminal of the duty correction circuit and a second input terminal electrically connected to an output terminal of the flip-flop circuit.

18. The circuit system according to claim 17, wherein the fourth logic circuit includes a clocked inverter or a transfer gate.

19. The circuit system according to claim 17, wherein the fourth logic circuit includes an AND gate, an OR gate, an ExOR gate, a NAND gate, a NOR gate, or an ExNOR.

20. The circuit system according to claim 1, wherein the predetermined period is equal to one cycle of the clock signal.

* * * * *